United States Patent
Ohsawa et al.

(10) Patent No.: US 8,048,610 B2
(45) Date of Patent: Nov. 1, 2011

(54) SULFONIUM SALT-CONTAINING POLYMER, RESIST COMPOSITION, AND PATTERNING PROCESS

(75) Inventors: Youichi Ohsawa, Joetsu (JP); Jun Hatakeyama, Joetsu (JP); Seiichiro Tachibana, Joetsu (JP); Takeshi Kinsho, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 257 days.

(21) Appl. No.: 12/428,933

(22) Filed: Apr. 23, 2009

(65) Prior Publication Data

US 2009/0269696 A1    Oct. 29, 2009

(30) Foreign Application Priority Data

Apr. 24, 2008   (JP) ................................ 2008-114116

(51) Int. Cl.
*G03F 7/039* (2006.01)
*G03F 7/20* (2006.01)
*G03F 7/30* (2006.01)
*G03F 7/38* (2006.01)
*G03F 7/11* (2006.01)

(52) U.S. Cl. ..................... 430/270.1; 430/326; 430/327; 430/311; 430/330; 430/942; 430/966; 526/243; 526/245; 526/287

(58) Field of Classification Search ........................ None
See application file for complete search history.

(56) References Cited

U.S. PATENT DOCUMENTS

| | | | |
|---|---|---|---|
| 5,650,483 A | 7/1997 | Malik et al. | |
| 5,945,250 A | 8/1999 | Aoai et al. | |
| 6,048,672 A | 4/2000 | Cameron et al. | |
| 6,312,867 B1 | 11/2001 | Kinsho et al. | |
| 6,830,866 B2 | 12/2004 | Kobayashi et al. | |
| 6,849,374 B2 | 2/2005 | Cameron et al. | |
| 7,288,359 B2 | 10/2007 | Iwasawa et al. | |
| 2002/0197558 A1 | 12/2002 | Ferreira et al. | |
| 2003/0113659 A1 | 6/2003 | Hatakeyama et al. | |
| 2004/0260031 A1 | 12/2004 | Takeda et al. | |
| 2007/0003871 A1 | 1/2007 | Kodama et al. | |
| 2007/0111140 A1 | 5/2007 | Hatakeyama et al. | |
| 2007/0149702 A1 | 6/2007 | Ando et al. | |
| 2007/0231738 A1 | 10/2007 | Kaneko et al. | |
| 2008/0026331 A1 | 1/2008 | Hasegawa et al. | |
| 2009/0069521 A1 | 3/2009 | Nagai et al. | |
| 2009/0075202 A1 | 3/2009 | Kodama et al. | |
| 2009/0202943 A1 * | 8/2009 | Ohsawa et al. ............ 430/285.1 |

FOREIGN PATENT DOCUMENTS

| | | |
|---|---|---|
| EP | 0 473 547 A1 | 3/1992 |
| EP | 1 897 869 A1 | 3/2008 |
| EP | 2 090 931 A1 | 8/2009 |
| JP | 4-230645 A | 8/1992 |
| JP | 11-282168 A | 10/1999 |
| JP | 2000-122296 A | 4/2000 |

(Continued)

OTHER PUBLICATIONS

European Search Report issued Nov. 19, 2010, in EP 09005649.0.

(Continued)

*Primary Examiner* — Sin J. Lee
(74) *Attorney, Agent, or Firm* — Birch, Stewart, Kolasch & Birch, LLP

(57) ABSTRACT

A polymer comprising recurring units having formulae (1), (2) and (3) is provided as well as a chemically amplified resist composition comprising the same. $R^1$ is H, F, $CH_3$ or $CF_3$, Rf is H, F, $CF_3$ or $C_2F_5$, A is an optionally fluorine or oxygen-substituted divalent organic group, $R^2$, $R^3$ and $R^4$ are alkyl, alkenyl, oxoalkyl, aryl, aralkyl or aryloxoalkyl, or may form a ring with the sulfur atom, N=0-2, $R^8$ is H or alkyl, B is a single bond or optionally oxygen-substituted divalent organic group, a=0-3, b=1-3, and X is an acid labile group. The polymer generates a strong sulfonic acid which provides for effective cleavage of acid labile groups in a chemically amplified resist composition.

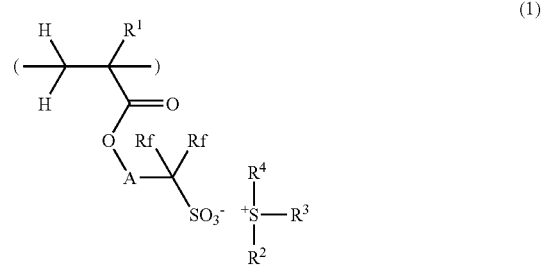

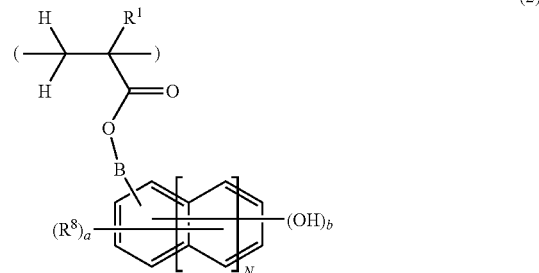

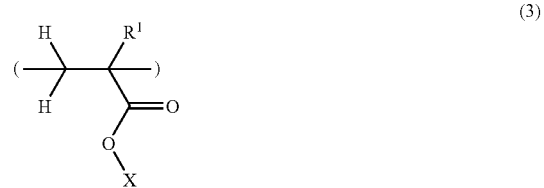

11 Claims, 2 Drawing Sheets

FOREIGN PATENT DOCUMENTS

| | | |
|---|---|---|
| JP | 2000-336121 A | 12/2000 |
| JP | 2002-214774 A | 7/2002 |
| JP | 2003-66612 A | 3/2003 |
| JP | 2003-140332 A | 5/2003 |
| JP | 2004-2252 A | 1/2004 |
| JP | 2004-115630 A | 4/2004 |
| JP | 2004-531749 A | 10/2004 |
| JP | 2005-8766 A | 1/2005 |
| JP | 3613491 B2 | 1/2005 |
| JP | 2005-84365 A | 3/2005 |
| JP | 2005-266766 A | 9/2005 |
| JP | 2006-178317 A | 7/2006 |
| JP | 2007-197718 A | 8/2007 |
| JP | 2007-297590 A | 11/2007 |
| JP | 2007-328060 A | 12/2007 |
| JP | 2008-31298 A | 2/2008 |
| WO | WO-2006/121096 A1 | 11/2006 |

OTHER PUBLICATIONS

Dammel et al., "193 mm Immersion Lithography-taking the Plunge", Journal of Photopolymer Science and Technology, vol. 17, No. 4, (2004), pp. 586-601.

Hutchinson, "The Shot Noise impact on Resist Roughness in EUV Lithography", Emergining Lithographic Technologies II, SPIE, vol. 3331, Feb. 23-25, 1998, pp. 531-536.

Brainard et al., "Shot Noise, LER and Quantum Efficiency of EUV Photoresists", SPIE, vol. 5374, (2004), pp. 74-85.

Kozawa et al., "Basic aspects of acid generation processes in chemically amplified resists for electron beam lithography", SPIE, vol. 5753, (2005), pp. 361-367.

Nakano et al., "Deprotonation mechanism of poly(4-hydroxystyrene) and its derivative", SPIE, vol. 5753, (2005), pp. 1034-1039.

Wang et al., "Novel Anionic Photoacid Generator (PAGs) and Photoresist for sub-50 nm Patterning by EUVL and EBL", SPIE, vol. 6519, (2007), pp. 65191F-1-65191F-6.

Kudo et al., "Enhancement of the Senesitivity of Chemical-Amplification-Type Photoimaging Materials BY β-Tosykoxyketone Acetals", Journal of Photopolymer Science and Technology, vol. 8, No. 1, (1995), pp. 45-46.

Arimitsu et al., "Effect of Phenolic Hydroxyl Residues on the Improvement of Acid-Proliferation-Type Photoimaging Materials", Journal of Photopolymer Science and Technology, vol. 9, No. 1, (1996), pp. 29-30.

Arimitsu et al., "Sensitivity Enhancement of Chemical-Amplification-Type Photoimaging Materials by Acetoacetic Acid Derivatives", vol. 8, No. 1, (1995), pp. 43-44.

* cited by examiner

SULFONIUM SALT-CONTAINING POLYMER, RESIST COMPOSITION, AND PATTERNING PROCESS

CROSS-REFERENCE TO RELATED APPLICATION

This non-provisional application claims priority under 35 U.S.C. §119(a) on Patent Application No. 2008-114116 filed in Japan on Apr. 24, 2008, the entire contents of which are hereby incorporated by reference.

TECHNICAL FIELD

This invention relates to (1) a sulfonium salt-containing polymer, (2) a resist composition comprising the polymer, and (3) a patterning process using the resist composition.

BACKGROUND ART

While a number of recent efforts are being made to achieve a finer pattern rule in the drive for higher integration and operating speeds in LSI devices, DUV and VUV lithography is thought to hold particular promise as the next generation in microfabrication technology. In particular, photolithography using an ArF excimer laser as the light source is thought requisite to the micropatterning technique capable of achieving a feature size of 0.13 µm or less.

The ArF lithography started partial use from the fabrication of 130-nm node devices and became the main lithography since 90-nm node devices. Although lithography using $F_2$ laser (157 nm) was initially thought promising as the next lithography for 45-nm node devices, its development was retarded by several problems. A highlight was suddenly placed on the ArF immersion lithography that introduces a liquid having a higher refractive index than air (e.g., water, ethylene glycol, glycerol) between the projection lens and the wafer, allowing the projection lens to be designed to a numerical aperture (NA) of 1.0 or higher and achieving a higher resolution. See Journal of Photopolymer Science and Technology, Vol. 17, No. 4, p 587 (2004).

In the photolithography using an ArF excimer laser (wavelength 193 nm) as the light source, a high sensitivity resist material capable of achieving a high resolution at a small dose of exposure is needed to prevent the degradation of precise and expensive optical system materials. Among several measures for providing high sensitivity resist material, the most common is to select each component which is highly transparent at the wavelength of 193 nm. For example, polymers of acrylic acid and derivatives thereof, norbornene-maleic anhydride alternating copolymers, polynorbornene, ring-opening metathesis polymerization (ROMP) polymers, and hydrogenated ROMP polymers have been proposed as the base resin. This choice is effective to some extent in that the transparency of a resin alone is increased.

Studies have also been made on photoacid generators. In prior art chemically amplified resist compositions for lithography using KrF excimer laser, photoacid generators capable of generating alkane- or arene-sulfonic acids are used. However, the use of these photoacid generators in chemically amplified resist compositions for ArF lithography results in an insufficient acid strength to scissor acid labile groups on the resin, a failure of resolution, or a low sensitivity. Thus these photoacid generators are not suited for the fabrication of microelectronic devices.

For the above reason, photoacid generators capable of generating perfluoroalkanesulfonic acids having a high acid strength are generally used in ArF chemically amplified resist compositions. These photoacid generators capable of generating perfluoroalkanesulfonic acids have already been developed for use in the KrF resist compositions. For instance, JP-A 2000-122296 and U.S. Pat. No. 6,048,672 (or JP-A 11-282168) describe photoacid generators capable of generating perfluorohexanesulfonic acid, perfluorooctanesulfonic acid, perfluoro-4-ethylcyclohexanesulfonic acid, and perfluorobutanesulfonic acid. JP-A 2002-214774, US Patent Application Publication 2003-0113659 A1 (JP-A 2003-140332), and US Patent Application Publication 2002-0197558 A1 describe novel acid generators capable of generating perfluoroalkyl ether sulfonic acids.

Among these, perfluorooctanesulfonic acid and homologues thereof (collectively referred to as PFOS) are considered problematic with respect to their non-degradability and biological concentration in the environment. Manufacturers made efforts to develop partially fluorinated alkane sulfonic acids having a reduced degree of fluorine substitution as the replacement to PFOS. For instance, JP-A 2004-531749 describes the synthesis of α,α-difluoroalkanesulfonic acid salts from α,α-difluoroalkene and a sulfur compound and discloses a resist composition comprising a photoacid generator which generates such sulfonic acid upon exposure, specifically di(4-tert-butylphenyl)iodonium 1,1-difluoro-2-(1-naphthyl)-ethanesulfonate. JP-A 2004-2252 describes the development of α,α,β,β-tetrafluoroalkanesulfonic acid salts from α,α,β,β-tetrafluoro-α-iodoalkane and sulfur compound and discloses a photoacid generator capable of generating such a sulfonic acid and a resist composition comprising the same. JP-A 2002-214774 discloses such photoacid generators as difluorosulfoacetic acid alkyl esters and difluorosulfoacetic acid amides although their synthesis method is lacking. Furthermore, JP-A 2005-266766 discloses a photosensitive composition comprising a compound capable of generating a partially fluorinated alkane sulfonic acid having a sulfonylamide structure derived from perfluoroalkylene disulfonyl difluoride.

In an attempt to form a fine feature size pattern with a pitch of less than 200 nm, the problem of pattern density dependency (or optical proximity effect), that is, the size difference between isolated and grouped patterns having different optical contrast becomes significant. Using a photoacid generator capable of generating an acid with low diffusion, the problem of pattern density dependency can be overcome to some extent, but not to a satisfactory extent. While the resist composition is required to achieve a further reduction of the pattern rule as well as a good balance of sensitivity, substrate adhesion, and etching resistance, it is also required to ameliorate the pattern density dependency fundamentally without a loss of resolution.

Under the circumstances, it was proposed to form a polymer from an acryloyloxyphenyldiphenylsulfonium salt as a monomer for enhancing sensitivity (as described in JP-A 4-230645) and to incorporate the monomer into a polyhydroxystyrene resin for improving the line edge roughness of this base resin (as described in JP-A 2005-84365). However, since the sulfonium salt is bonded at its cation side to the polymer, the sulfonic acid generated therefrom upon exposure to high-energy radiation is equivalent to the sulfonic acids generated by conventional photoacid generators, which is unsatisfactory to overcome the outstanding problem. Also, sulfonium salts having an anion side incorporated into the polymer backbone such as polystyrenesulfonic acid are disclosed as effective in enhancing sensitivity or improving resist pattern profile (Japanese Patent No. 3613491). The acids generated therefrom are arenesulfonic and alkylsulfonic acid derivatives which have too low an acid strength to sever acid labile groups, especially acid labile groups in ArF chemically amplified resist compositions. JP-A 2006-178317 discloses a polymer having a plurality of partially fluorinated sulfonic acid anions as polymerizable units, and a resist material comprising the polymer. WO 2006-121096 discloses a polymer having three partially fluorinated sulfonic acid anions in combination with a specific lactone compound. JP-A 2007-197718 discloses three anions.

With respect to the immersion lithography, some problems arise from minute water droplets which are left on the resist and wafer after the immersion exposure. They can often cause damages and defects to the resist pattern profile. The resist pattern after development can collapse or deform into a T-top profile. There exists a need for a patterning process which can form a satisfactory resist pattern after development according to the immersion lithography.

The lithography techniques which are considered promising next to the ArF lithography include electron beam (EB) lithography, $F_2$ lithography, extreme ultraviolet (EUV) lithography, and x-ray lithography. In these techniques, exposure must be done in vacuum or reduced pressure, which allows the sulfonic acid generated during exposure to volatilize, failing to form a satisfactory pattern profile. The sulfonic acid volatilized is damaging to the exposure system. In the EB and EUV lithography, it is desired to provide the resist material with a higher sensitivity, especially for the purpose of reducing the load to the system.

A tradeoff between sensitivity and roughness is pointed out. For example, SPIE Vol. 3331 p 531 (1998) describes that sensitivity is in inverse proportion to roughness. It is expected that the roughness of a resist material is reduced by increasing an exposure dose to reduce shot noise. SPIE Vol. 5374 p 74 (2004) describes a tradeoff between sensitivity and roughness in the EUV lithography in that a resist material containing a more amount of quencher is effective in reducing roughness, but suffers from a decline of sensitivity at the same time. There is a need to enhance the quantum efficiency of acid generation in order to overcome the problem.

With respect to the acid generating mechanism triggered by electron beam exposure, SPIE Vol. 5753 p 361 (2005) reports that PAG releases acid through the mechanism that a polymer is excited by exposure so that electrons migrate to the PAG. It is presumed that the base polymer is readily ionized since either of EB and EUV provides an ionization potential energy higher than the threshold of 10 eV. It is reported in SPIE Vol. 5753 p 1034 (2005) that poly-4-hydroxystyrene has a higher acid generation efficiency in EB exposure than poly-4-methoxystyrene, indicating that poly-4-hydroxystyrene provides for efficient migration of electrons to PAG upon EB exposure.

Reported in SPIE Vol. 6519 p 6519 F1-1 (2007) is a material obtained through copolymerization of hydroxystyrene for increasing the acid generation efficiency by electron migration, a methacrylate of PAG having sulfonic acid directly bonded to a polymer backbone for suppressing acid diffusion low, and a methacrylate having an acid labile group.

Citation List
Patent Document 1: JP-A 2000-122296
Patent Document 2: U.S. Pat. No. 6,048,672 (or JP-A 11-282168)
Patent Document 3: JP-A 2002-214774
Patent Document 4: US 2003-0113659 A1 (JP-A 2003-140332)
Patent Document 5: US 2002-0197558 A1
Patent Document 6: JP-A 2004-531749
Patent Document 7: JP-A 2004-2252
Patent Document 8: JP-A 2005-266766
Patent Document 9: JP-A 4-230645
Patent Document 10: JP-A 2005-84365
Patent Document 11: JP 3613491
Patent Document 12: JP-A 2006-178317
Patent Document 13: WO 2006-121096
Patent Document 14: JP-A 2007-197718
Non-Patent Document 1: Journal of Photopolymer Science and Technology, Vol. 17, No. 4, p 587 (2004)
Non-Patent Document 2: SPIE Vol. 3331 p 531 (1998)
Non-Patent Document 3: SPIE Vol. 5374 p 74 (2004)
Non-Patent Document 4: SPIE Vol. 5753 p 361 (2005)
Non-Patent Document 5: SPIE Vol. 5753 p 1034 (2005)
Non-Patent Document 6: SPIE Vol. 6519 p 6519 F1-1 (2007)

SUMMARY OF INVENTION

An object of the present invention is to provide (1) a polymer obtained from a useful monomer in the form of a sulfonium salt having a polymerizable anion, (2) a resist composition comprising the polymer, which composition exhibits a high sensitivity, high resolution and mask fidelity when processed by the photolithography using high-energy radiation, typically ArF excimer laser radiation as the light source, and (3) a patterning process using the resist composition.

The inventors have found that a polymer obtained by introducing recurring units of a sulfonium salt having the general formula (1) into a polymer comprising recurring units of hydroxyphenyl(meth)acrylate having the general formula (2) and recurring units of acid labile group-containing (meth) acrylate having the general formula (3) is useful as a base resin, and that a resist composition comprising the polymer is improved in such properties as exposure dose dependency, pattern density dependency, and mask fidelity, and best suited for precise micropatterning.

Thus the invention provides a polymer derived from a monomer in the form of a sulfonium salt, a resist composition, and a patterning process, as defined below.

In a first aspect, the invention provides a polymer comprising recurring units having the general formulae (1), (2) and (3).

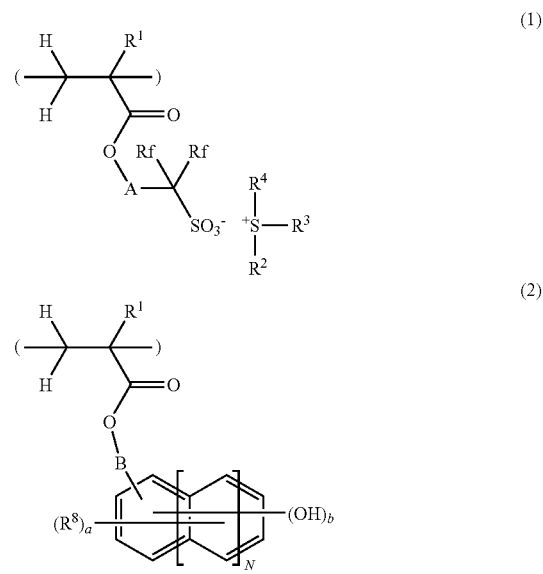

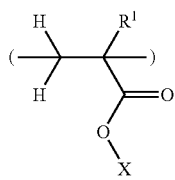
(3)

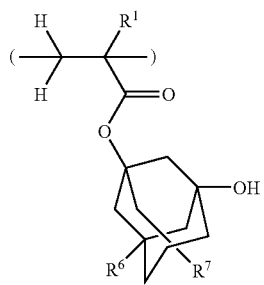
(4)

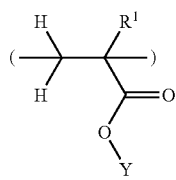
(5)

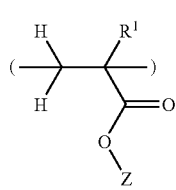
(6)

Herein $R^1$ is hydrogen, fluorine, methyl or trifluoromethyl, Rf is each independently hydrogen, fluorine, trifluoromethyl or pentafluoroethyl, both Rf's are not hydrogen, A is a divalent $C_1$-$C_{10}$ organic group (excluding methylene) which may have fluorine or oxygen substituted thereon, $R^2$, $R^3$ and $R^4$ are each independently a substituted or unsubstituted, straight or branched $C_1$-$C_{10}$ alkyl, alkenyl or oxoalkyl group or a substituted or unsubstituted $C_6$-$C_{18}$ aryl, aralkyl or aryloxoalkyl group, or at least two of $R^2$, $R^3$ and $R^4$ may bond together to form a ring with the sulfur atom to which they are attached, N is an integer of 0 to 2, $R^8$ is hydrogen or $C_1$-$C_{10}$ alkyl, B is a single bond or a divalent $C_1$-$C_{10}$ organic group which may have oxygen substituted thereon, a is an integer of 0 to 3, b is an integer of 1 to 3, and X is an acid labile group.

In a second aspect, the invention provides a polymer comprising recurring units having the general formulae (1a), (2) and (3).

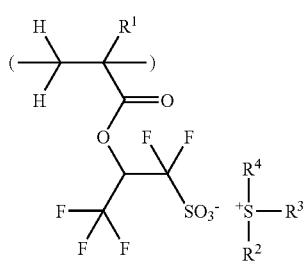
(1a)

wherein $R^1$ is as defined above, $R^6$ and $R^7$ are each independently hydrogen or hydroxyl, Y is a substituent group of lactone structure, and Z is hydrogen, $C_1$-$C_{15}$ fluoroalkyl or $C_1$-$C_{15}$ fluoroalcohol-containing substituent group.

In a preferred embodiment, the polymer may further comprise recurring units of at least one type selected from the general formulae (7) to (10):

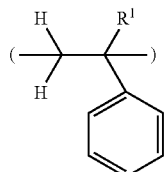
(7)

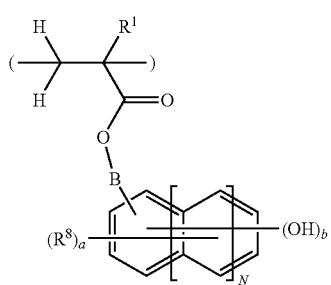
(2)

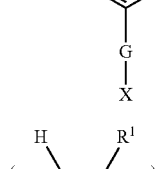
(8)

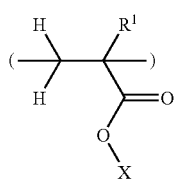
(3)

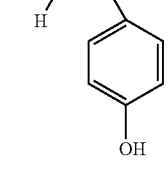

Herein $R^1$, Rf, $R^2$, $R^3$, $R^4$, N, $R^8$, B, a, b, and X are as defined above.

In a preferred embodiment, the polymer may further comprise recurring units of at least one type selected from the general formulae (4) to (6):

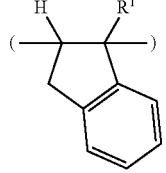
(9)

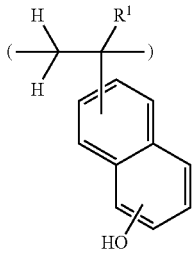
(10)

wherein R¹ is as defined above, X is an acid labile group, and G is an oxygen atom or carbonyloxy group (—C(=O)O—).

In a third aspect, the invention provides a positive resist composition comprising the polymer defined above as a base resin, and preferably a positive resist composition comprising the polymer defined above and a polymer which does not contain the recurring units of formula (1) as a base resin.

In a preferred embodiment, the positive resist composition may further comprise a surfactant which is insoluble in water and soluble in an alkaline developer.

In a fourth aspect, the invention provides a pattern forming process comprising the steps of applying the positive resist composition defined above onto a substrate to form a coating, heat treating the coating and exposing it to high-energy radiation through a photomask, optionally heat treating the exposed coating and developing it with a developer;

a pattern forming process comprising the steps of applying the positive resist composition defined above onto a substrate to form a resist coating, heat treating the resist coating, applying onto the resist coating a protective coating which is insoluble in water and soluble in an alkaline developer, exposing the coated substrate to high-energy radiation from a projection lens through a photomask while holding water between the substrate and the projection lens, optionally heat treating the exposed coating and developing it with a developer; or a pattern forming process comprising the steps of applying the positive resist composition defined above onto a substrate to form a coating, heat treating the coating, imagewise writing with an electron beam, optionally heat treating the coating, and developing it with a developer.

In a fifth aspect, the invention provides a pattern forming process comprising the steps of applying a positive resist composition onto a substrate to form a coating, exposing the coating to soft x-ray having a wavelength of 3 to 15 nm, optionally heat treating the exposed coating and developing it with a developer, the resist composition comprising a polymer comprising recurring units having the general formulae (1'), (2) and (3):

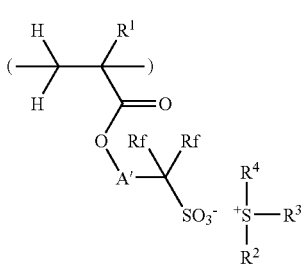
(1')

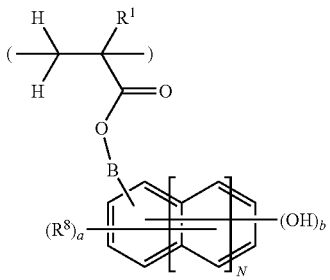
(2)

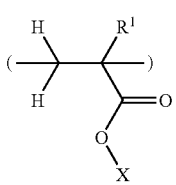
(3)

wherein A' is a divalent $C_1$-$C_{10}$ organic group which may have fluorine or oxygen substituted thereon, $R^1$, $R^2$, $R^3$, $R^4$, N, $R^8$, B, a, b, and X are as defined above.

It is noted that the resist composition of the invention can be applied to the immersion lithography. The immersion lithography involves prebaking a resist film and exposing the resist film to light through a projection lens with a liquid medium interposed between the resist film and the projection lens. The ArF immersion lithography generally uses deionized water as the immersion medium. This technology, combined with a projection lens having a NA of at least 1.0, is important for the ArF lithography to survive to the 65 nm node and forth, with a further development thereof being accelerated.

The resist composition of the invention allows the feature size of the pattern after development to be reduced by various shrinkage techniques. For example, the hole size can be shrunk by such known techniques as thermal flow, RELACS, SAFIRE, and WASOOM. More effective shrinkage of hole size by thermal flow is possible particularly when the inventive polymer is blended with a hydrogenated cycloolefin ring-opening metathesis polymerization (ROMP) polymer having a low Tg.

ADVANTAGEOUS EFFECTS OF INVENTION

The recurring units of sulfonium salt generate a sulfonic acid upon exposure to high-energy radiation. Since the sulfonic acid generated contains fluorine atoms at α- and γ-positions, it has a very high acidity enough to facilitate efficient scission of acid labile groups in chemically amplified resist compositions. Then, a radiation-sensitive resist composition comprising the polymer as a base resin exhibits a high sensitivity and resolution and is improved in pattern density dependency and exposure margin. The polymer is advantageously used as a resist material in precise micropatterning.

In the ArF immersion lithography, the leach-out of sulfonic acid in water is minimized, and the influence of water left on the wafer is minimized to restrain defect formation. In the disposal of resist-containing waste liquid after the device fabrication, (meth)acrylate moieties are hydrolyzable under basic conditions so that the polymer may be transformed into less accumulative compounds of lower molecular weight. In the disposal by combustion, the polymer is more combustible because of a low degree of fluorine substitution.

DESCRIPTION OF EMBODIMENTS

Figure 1:
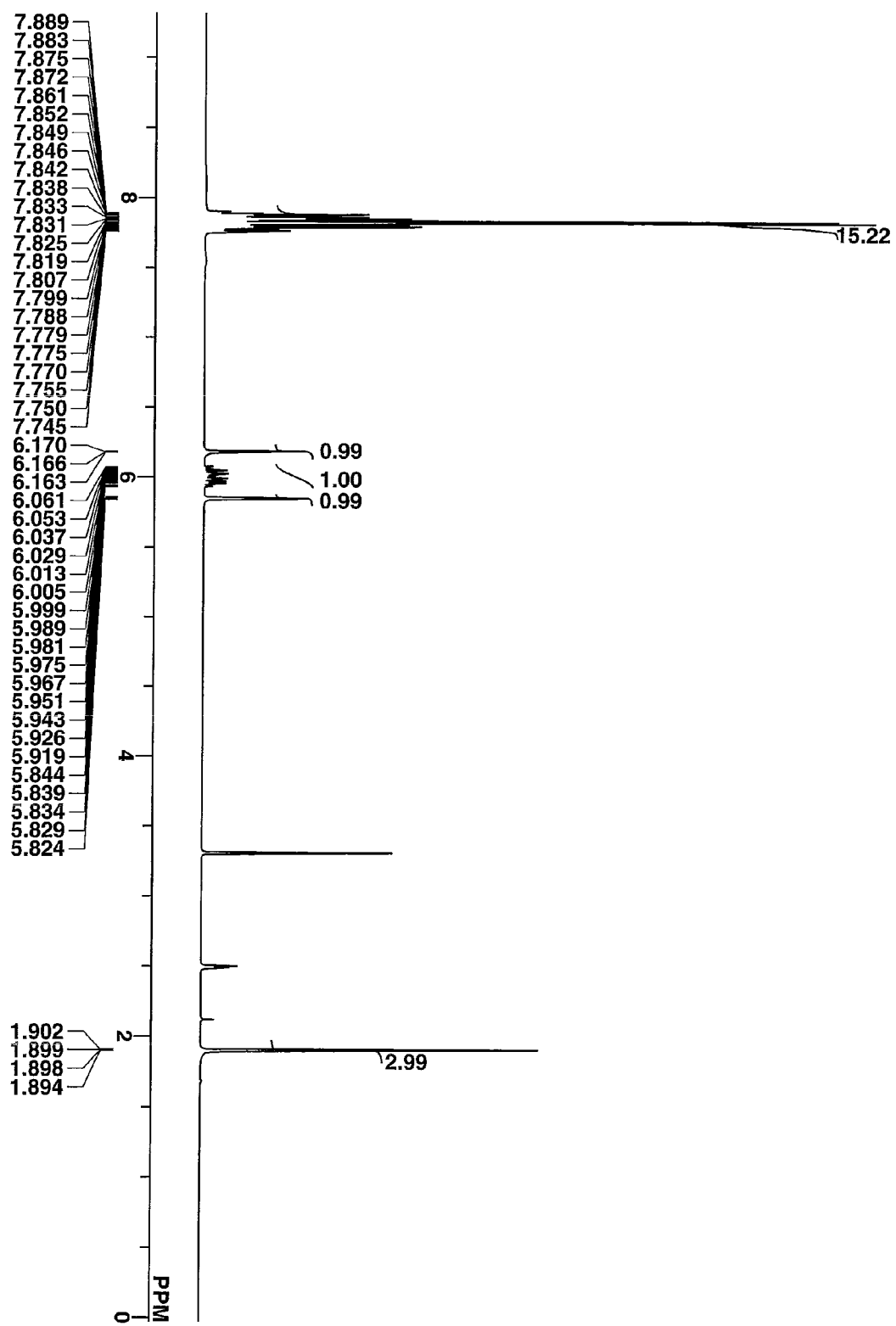
FIG. 1 is a diagram showing the $^1$H-NMR spectrum of Monomer 1 in Synthesis Example 19.

As used herein, the singular forms "a," "an" and "the" include plural referents unless the context clearly dictates otherwise. The notation (Cn-Cm) means a group containing from n to m carbon atoms per group. The term "high-energy radiation" is intended to encompass UV, deep UV, electron beam, EUV, x-ray, excimer laser, γ-ray and synchrotron radiation.

Polymer

The polymer or high molecular weight compound of the invention comprises recurring units having the general formulae (1), (2) and (3).

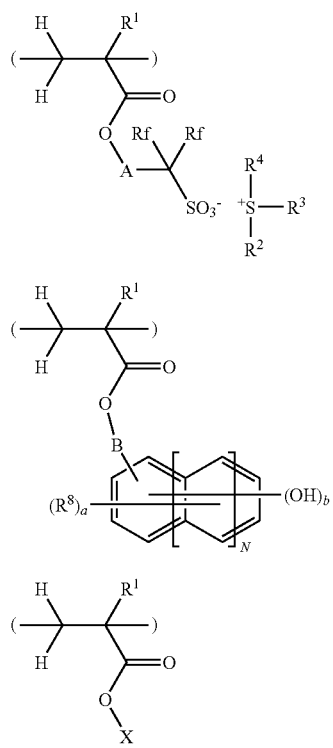

Herein $R^1$ is hydrogen, fluorine, methyl or trifluoromethyl. Rf is each independently hydrogen, fluorine, trifluoromethyl or pentafluoroethyl, both Rf's are not hydrogen at the same time. A is a divalent $C_1$-$C_{10}$ organic group (excluding methylene) which may have fluorine or oxygen substituted thereon. $R^2$, $R^3$ and $R^4$ are each independently a substituted or unsubstituted, straight or branched $C_1$-$C_{10}$ alkyl, alkenyl or oxoalkyl group or a substituted or unsubstituted $C_6$-$C_{18}$ aryl, aralkyl or aryloxoalkyl group, or any two or more of $R^2$, $R^3$ and $R^4$ may bond together to form a ring with the sulfur atom to which they are attached. The subscript N is an integer of 0 to 2. $R^8$ is hydrogen or $C_1$-$C_{10}$ alkyl group. B is a single bond or a divalent $C_1$-$C_{10}$ organic group which may have an oxygen atom substituted thereon, a is an integer of 0 to 3, and b is an integer of 1 to 3. X is an acid labile group.

These recurring units are described in detail.

In formula (1), $R^1$ is a hydrogen atom, fluorine atom, methyl group or trifluoromethyl group, with hydrogen and methyl being preferred. Rf may be the same or different and denotes a hydrogen atom, fluorine atom, trifluoromethyl group or pentafluoroethyl group. Both Rf's are not hydrogen at the same time. Preferably both Rf's are fluorine. A is a divalent $C_1$-$C_{10}$ organic group (excluding methylene) which may have fluorine or oxygen substituted thereon. Exemplary divalent $C_1$-$C_{10}$ organic groups which may have fluorine or oxygen substituted thereon include those of the following structural formulae (illustrated in the form of formula (1) with the sulfonium cation omitted).

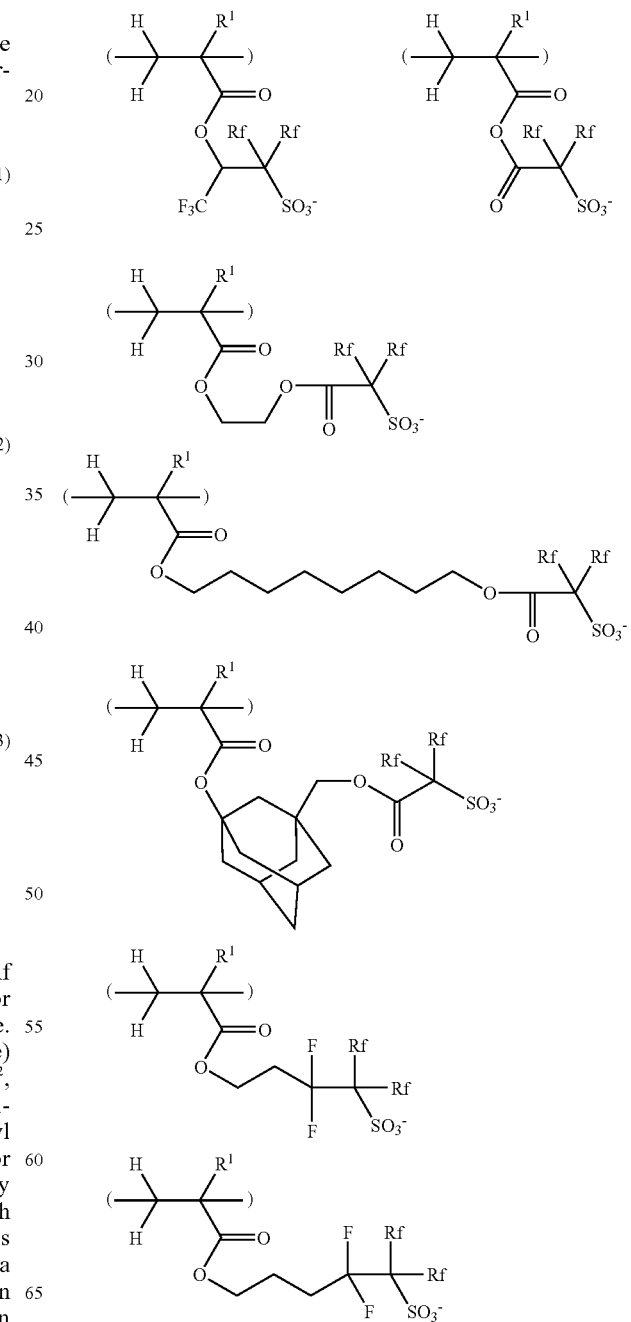

-continued

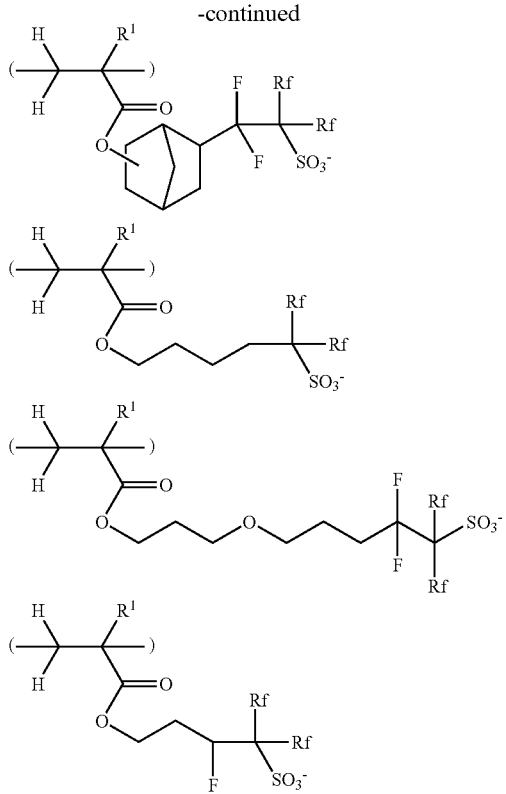

Reference may also be made to JP-A 2007-197718, JP-A 2007-328060, and WO 2006-121096 A1.

In formula (1), $R^2$, $R^3$ and $R^4$ are each independently a substituted or unsubstituted, straight or branched $C_1$-$C_{10}$ alkyl, alkenyl or oxoalkyl group or a substituted or unsubstituted $C_6$-$C_{18}$ aryl, aralkyl or aryloxoalkyl group, or any two or more of $R^2$, $R^3$ and $R^4$ may bond together to form a ring with the sulfur atom to which they are attached.

Specifically, suitable alkyl groups include, but are not limited to, methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, and adamantyl. Suitable alkenyl groups include, but are not limited to, vinyl, allyl, propenyl, butenyl, hexenyl, and cyclohexenyl. Suitable oxoalkyl groups include, but are not limited to, 2-oxocyclopentyl, 2-oxocyclohexyl, 2-oxopropyl, 2-oxoethyl, 2-cyclopentyl-2-oxoethyl, 2-cyclohexyl-2-oxoethyl, and 2-(4-methylcyclohexyl)-2-oxoethyl. Suitable aryl groups include, but are not limited to, phenyl, naphthyl, thienyl, alkoxyphenyl groups such as 4-hydroxyphenyl, 4-methoxyphenyl, 3-methoxyphenyl, 2-methoxyphenyl, 4-ethoxyphenyl, 4-tert-butoxyphenyl, and 3-tert-butoxyphenyl, alkylphenyl groups such as 2-methylphenyl, 3-methylphenyl, 4-methylphenyl, 4-ethylphenyl, 4-tert-butylphenyl, 4-n-butylphenyl, and 2,4-dimethylphenyl, alkylnaphthyl groups such as methylnaphthyl and ethylnaphthyl, alkoxynaphthyl groups such as methoxynaphthyl and ethoxynaphthyl, dialkylnaphthyl groups such as dimethylnaphthyl and diethylnaphthyl, and dialkoxynaphthyl groups such as dimethoxynaphthyl and diethoxynaphthyl. Suitable aralkyl groups include, but are not limited to, benzyl, 1-phenylethyl, and 2-phenylethyl. Suitable aryloxoalkyl groups are 2-aryl-2-oxoethyl groups such as 2-phenyl-2-oxoethyl, 2-(1-naphthyl)-2-oxoethyl, and 2-(2-naphthyl)-2-oxoethyl. When any two or more of $R^2$, $R^3$ and $R^4$ bond together to form a ring with the sulfur atom, exemplary cyclic structures are shown below.

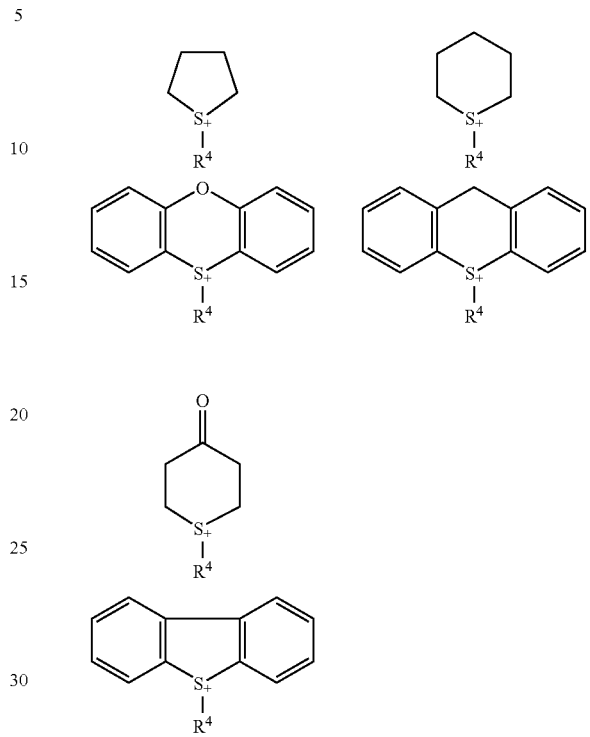

In the formulae, $R^4$ is as defined above.

Illustrative non-limiting examples of the sulfonium cation include triphenylsulfonium, 4-hydroxyphenyldiphenylsulfonium, bis(4-hydroxyphenyl)phenylsulfonium, tris(4-hydroxyphenyl)sulfonium, 4-tert-butoxyphenyldiphenylsulfonium, bis(4-tert-butoxyphenyl)phenylsulfonium, tris(4-tert-butoxyphenyl)sulfonium, 3-tert-butoxyphenyldiphenylsulfonium, bis(3-tert-butoxyphenyl)phenylsulfonium, tris(3-tert-butoxyphenyl)sulfonium, 3,4-di-tert-butoxyphenyldiphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, 4-tert-butoxycarbonylmethyloxyphenyldiphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, (4-hydroxy-3,5-dimethylphenyl)diphenylsulfonium, (4-n-hexyloxy-3,5-dimethylphenyl)diphenylsulfonium, dimethyl(2-naphthyl)sulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, tribenzylsulfonium, diphenylmethylsulfonium, dimethylphenylsulfonium, 2-oxo-2-phenylethylthiacyclopentanium, diphenyl-2-thienylsulfonium, 4-n-butoxynaphthyl-1-thiacyclopentanium, 2-n-butoxynaphthyl-1-thiacyclopentanium, 4-methoxynaphthyl-1-thiacyclopentanium, and 2-methoxynaphthyl-1-thiacyclopentanium. Inter alia, triphenylsulfonium, 4-tert-butylphenyldiphenylsulfonium, 4-tert-butoxyphenyldiphenylsulfonium, tris(4-tert-butylphenyl)sulfonium, tris(4-tert-butoxyphenyl)sulfonium, and dimethylphenylsulfonium are preferred.

Of the recurring units of formula (1), those of the following formula (1a) are preferred.
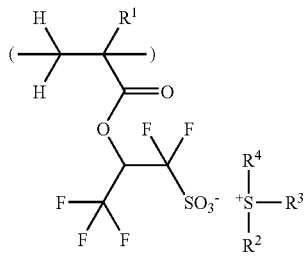
$R^1$ to $R^4$ are as defined above.
Illustrative non-limiting examples of the recurring units of formula (1) are given below.
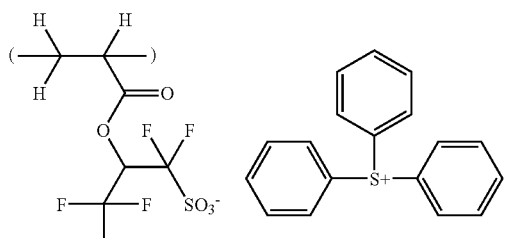 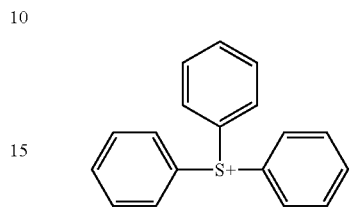
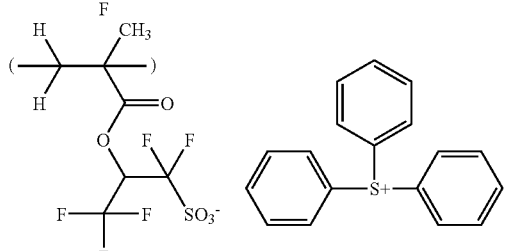 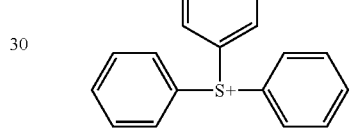
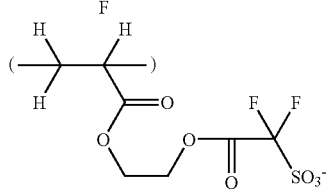
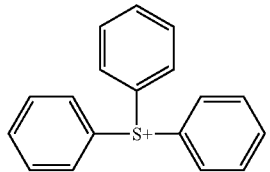
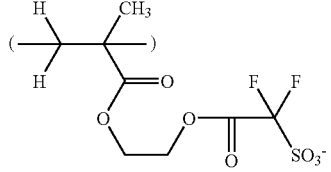
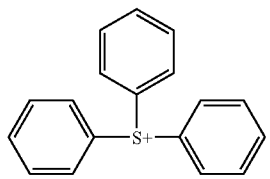
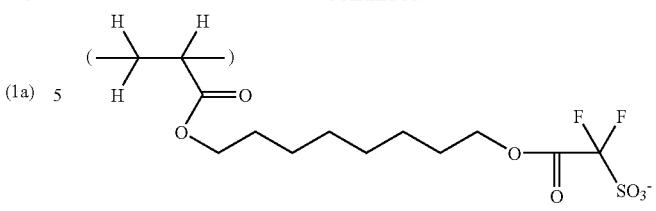
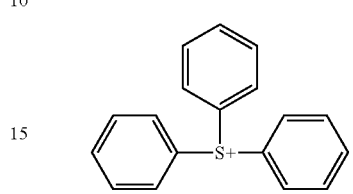
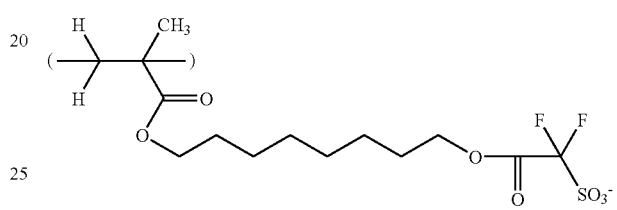
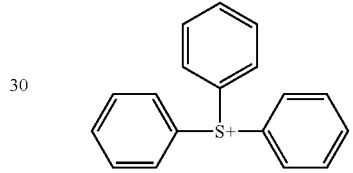
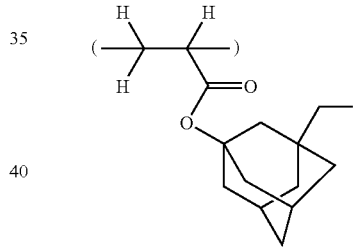
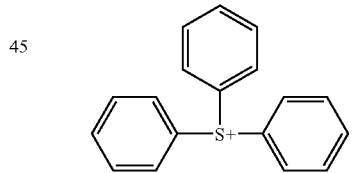
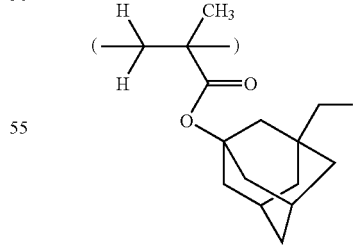
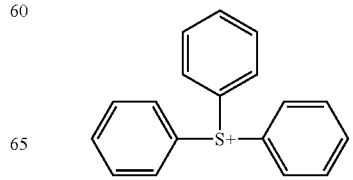

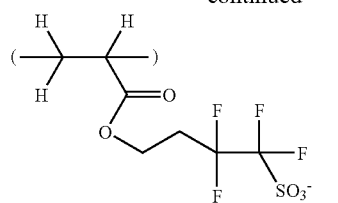
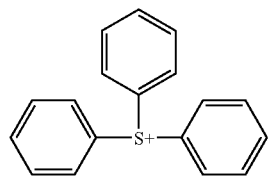
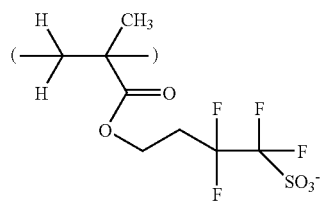
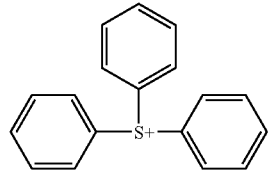
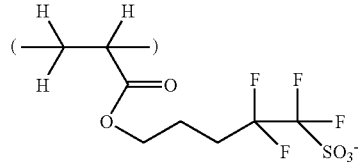
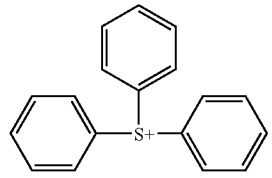
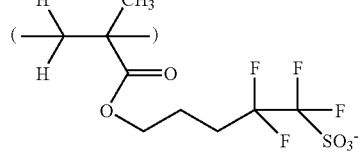
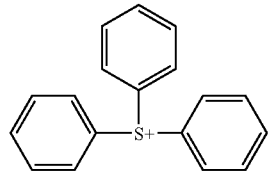
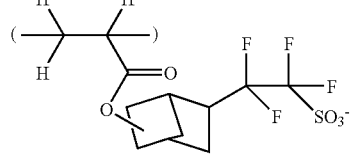
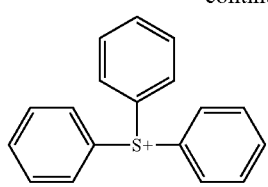
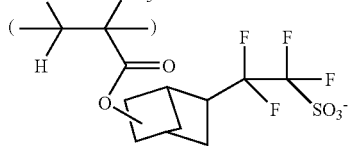
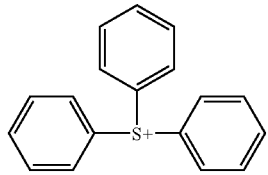
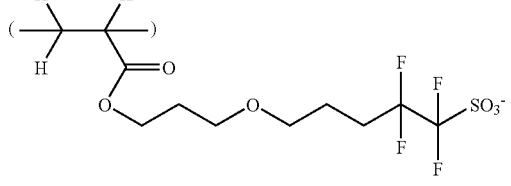
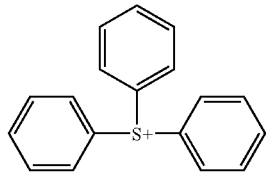
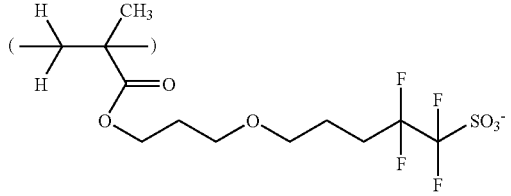
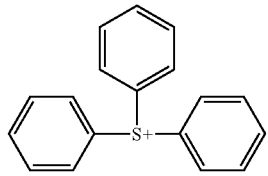
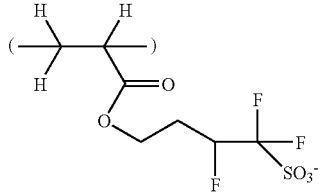
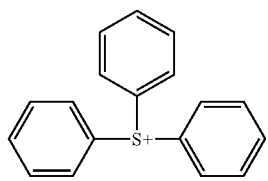

-continued
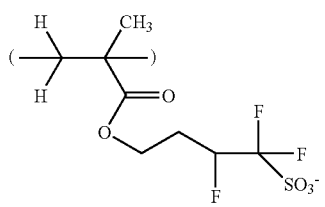
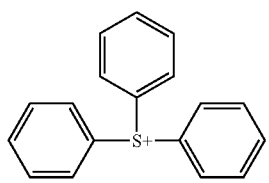
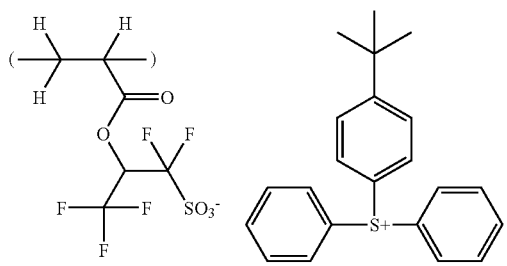
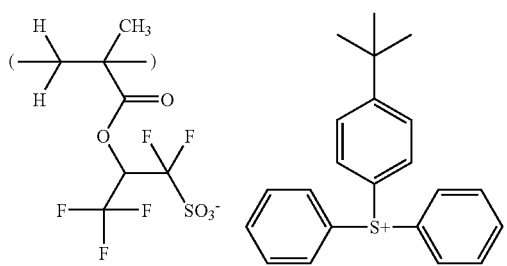
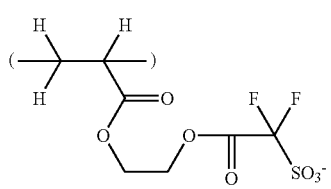
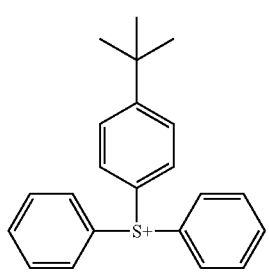
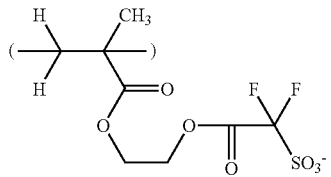
-continued
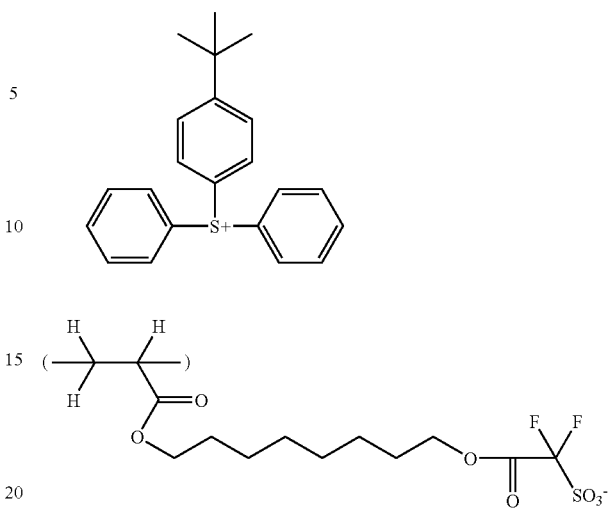
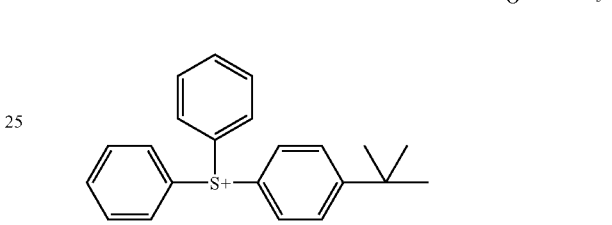
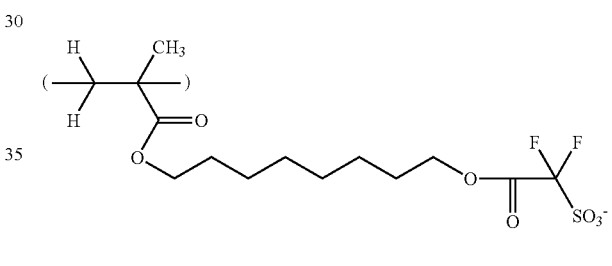
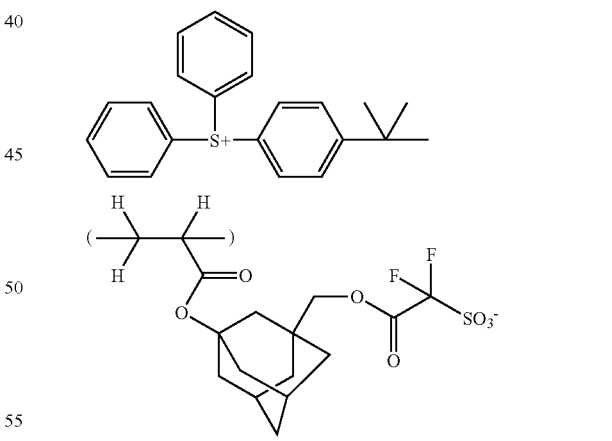
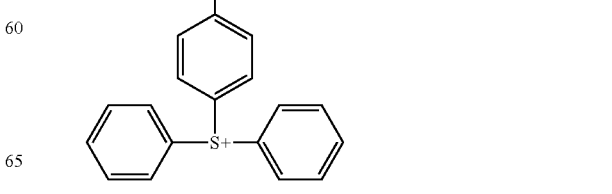

-continued
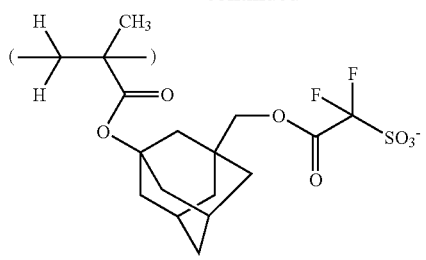
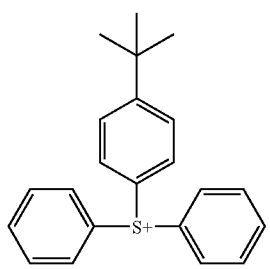
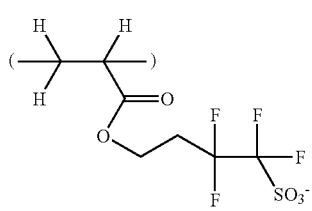
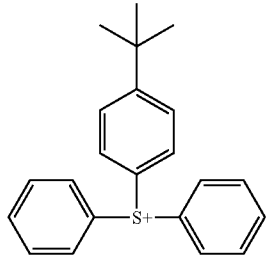
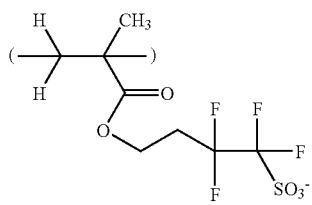
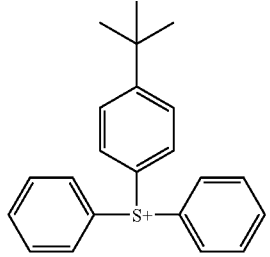
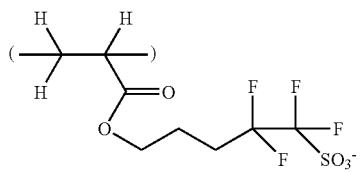
-continued
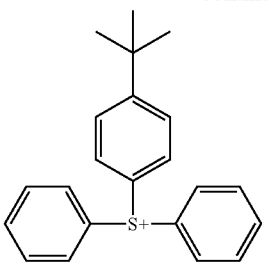

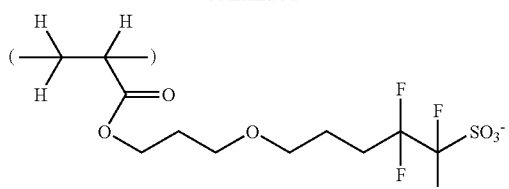
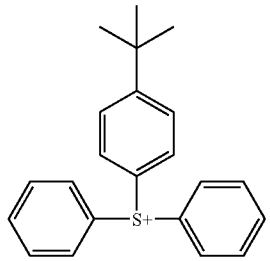
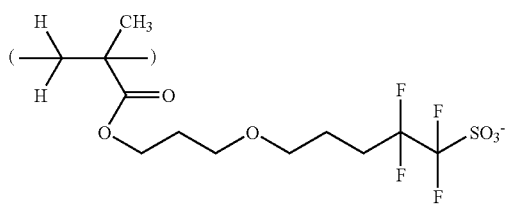
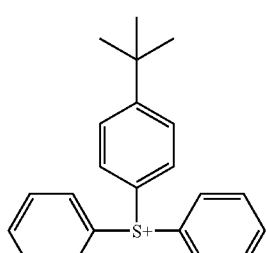
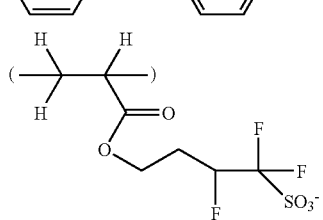
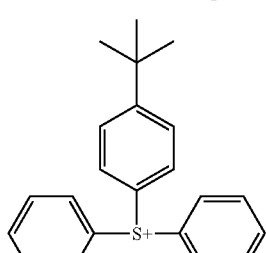
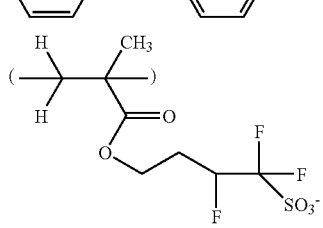

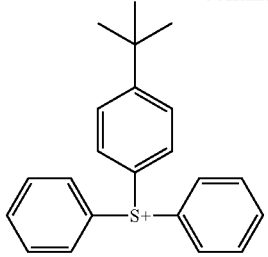

It is appreciated that the recurring units of formula (1) are merely illustrative, and recurring units having a iodonium salt or recurring units having an ammonium salt are also contemplated herein where the sulfonium cation is replaced by a iodonium or ammonium cation.

Illustrative non-limiting examples of the iodonium cation include diphenyliodonium, bis(4-methylphenyl)iodonium, bis(4-(1,1-dimethylethyl)phenyl)iodonium, bis(4-(1,1-dimethylpropyl)phenyl)iodonium, and (4-(1,1-dimethylethoxy)phenyl)phenyliodonium. Illustrative non-limiting examples of the ammonium salt include tertiary ammonium salts such as trimethylammonium, triethylammonium, tributylammonium and N,N-dimethylanilinium, and quaternary ammonium salts such as tetramethylammonium, tetraethylammonium, and tetrabutylammonium. Polymers having the iodonium salt in recurring units may be used as a polymer having a photoacid generating ability or thermal acid generating ability. Polymers having the ammonium salt in recurring units may be used as a polymer having a thermal acid generating ability.

For the synthesis of a sulfonium salt having a polymerizable anion as depicted by formula (1), reference may be made to JP-A 2007-197718, JP-A 2007-328060, and WO 2006-121096 A1. Notably, the synthesis of a sulfonium salt having a polymerizable anion as depicted by formula (1a) will be described later.

Referring to formula (2), $R^1$ is hydrogen, fluorine, methyl or trifluoromethyl, and preferably hydrogen or methyl. The subscript N is an integer of 0 to 2, and preferably 1 or 2. $R^8$ is hydrogen or $C_1$-$C_{10}$ alkyl, and preferably hydrogen or methyl. B is a single bond or a divalent $C_1$-$C_{10}$ organic group which may have oxygen substituted thereon. Typical of the divalent $C_1$-$C_{10}$ organic group which may have oxygen substituted thereon is methylene. Preferably B is a single bond or methylene. The subscript "a" is an integer of 0 to 3, preferably 0, and b is an integer of 1 to 3, preferably 1.

Illustrative non-limiting examples of the recurring units of formula (2) are given below.

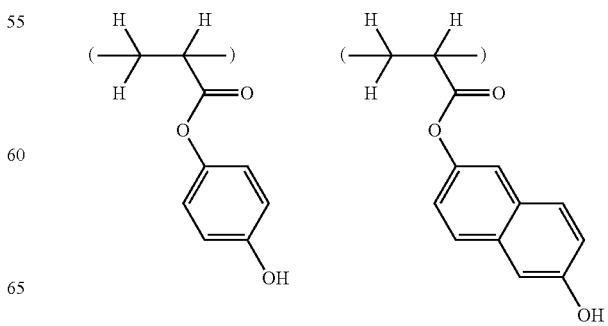

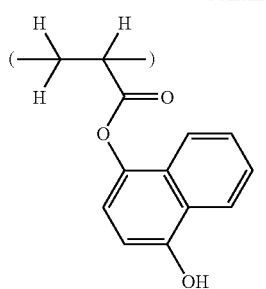
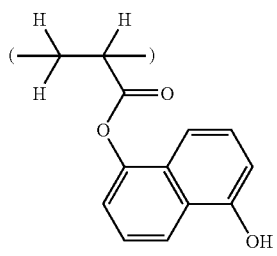
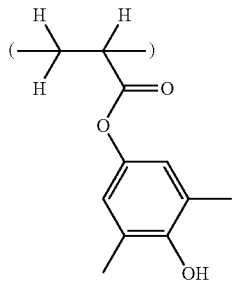
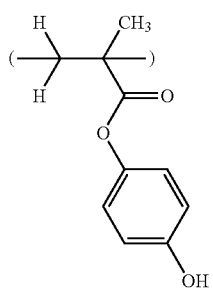
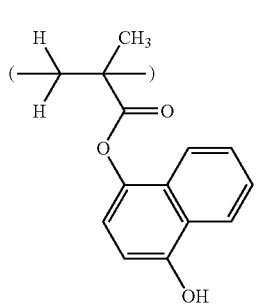
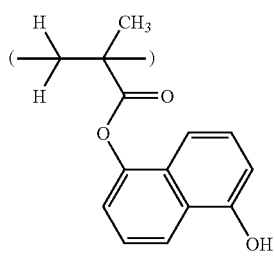
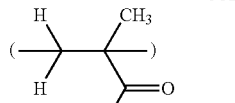
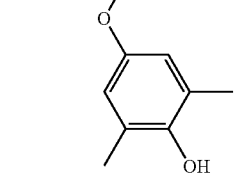
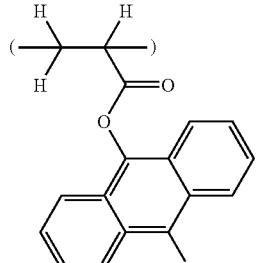
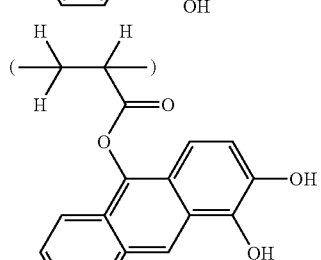
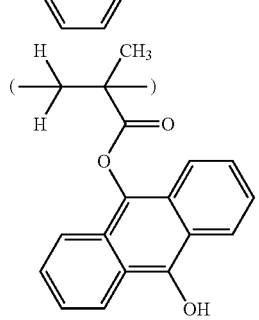
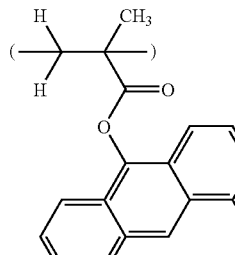
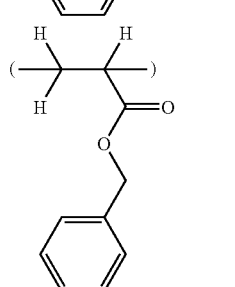

-continued

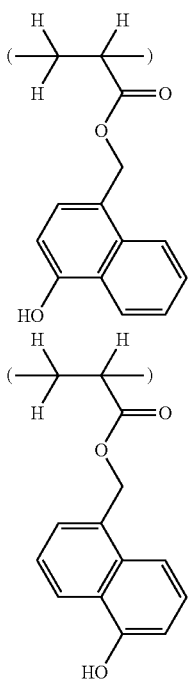
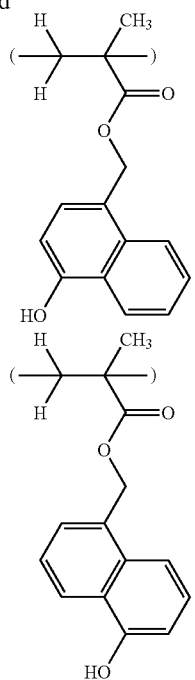

Under the action of an acid, a polymer comprising recurring units of formula (3) is decomposed to generate a carboxylic acid whereby it becomes alkali soluble. X denotes an acid labile group. The acid labile group X may be selected from a variety of such groups, for example, groups of the following general formulae (L1) to (L4) and (L2-2), tertiary alkyl groups of 4 to 20 carbon atoms, preferably 4 to 15 carbon atoms, trialkylsilyl groups in which each alkyl moiety has 1 to 6 carbon atoms, and oxoalkyl groups of 4 to 20 carbon atoms.

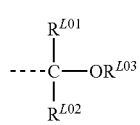   (L1)

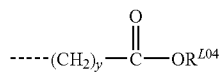   (L2)

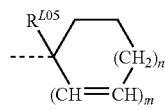   (L3)

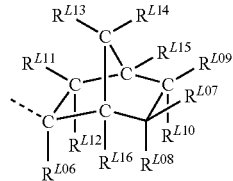   (L4)

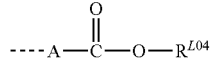   (L2-2)

Herein and throughout the specification, the broken line denotes a valence bond.

In formula (L1), $R^{L01}$ and $R^{L02}$ are hydrogen or straight, branched or cyclic alkyl groups of 1 to 18 carbon atoms, preferably 1 to 10 carbon atoms, examples of which include methyl, ethyl, propyl, isopropyl, n-butyl, sec-butyl, tert-butyl, cyclopentyl, cyclohexyl, 2-ethylhexyl, n-octyl, norbornyl, tricyclodecanyl, tetracyclododecanyl and adamantyl. $R^{L03}$ is a monovalent hydrocarbon group of 1 to 18 carbon atoms, preferably 1 to 10 carbon atoms, which may contain a heteroatom such as oxygen, examples of which include straight, branched or cyclic alkyl groups and substituted forms of these groups in which some hydrogen atoms are replaced by hydroxyl, alkoxy, oxo, amino, alkylamino or the like. Exemplary substituted alkyl groups are illustrated below.

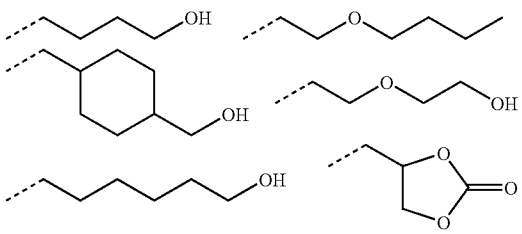

A pair of $R^{L01}$ and $R^{L02}$, $R^{L01}$ and $R^{L03}$, or $R^{L02}$ and $R^{L03}$ may bond together to form a ring with the carbon and oxygen atoms to which they are attached. Each participant of $R^{L01}$, $R^{L02}$ and $R^{L03}$ is a straight or branched alkylene group of 1 to 18 carbon atoms, preferably 1 to 10 carbon atoms when they form a ring.

In formula (L2), $R^{L04}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (L1). Exemplary tertiary alkyl groups are tert-butyl, tert-amyl, 1,1-diethylpropyl, 2-cyclopentylpropan-2-yl, 2-cyclohexylpropan-2-yl, 2-(bicyclo[2.2.1]heptan-2-yl)propan-2-yl, 2-(adamantan-1-yl)propan-2-yl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl, and 2-ethyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl. In formula (L2), y is an integer of 0 to 6.

In formula (L2-2), $R^{L04}$ is as defined above, and A is selected from groups of the following formulae.

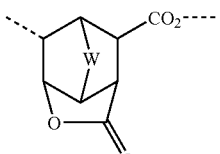

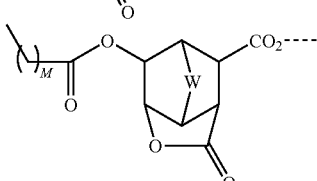

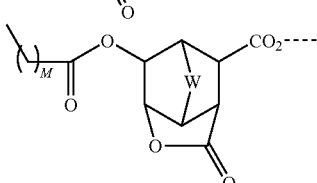

Herein, the broken line denotes a valence bond, W is oxygen or $CH_2$, and M is an integer of 1 to 3.

In formula (L3), $R^{L05}$ is a substituted or unsubstituted, straight, branched or cyclic $C_1$-$C_{10}$ alkyl group or a substituted or unsubstituted $C_6$-$C_{20}$ aryl group. Examples of the optionally substituted alkyl groups include straight, branched or cyclic ones such as methyl, ethyl, propyl, isopropyl, n-butyl, sec-butyl, tert-butyl, tert-amyl, n-pentyl, n-hexyl, cyclopentyl, and cyclohexyl; and substituted forms of the foregoing in which some hydrogen atoms are replaced by hydroxyl, alkoxy, carboxy, alkoxycarbonyl, oxo, amino, alkylamino, cyano, mercapto, alkylthio, sulfo or other groups. Exemplary optionally substituted aryl groups are phenyl, methylphenyl, naphthyl, anthryl, phenanthryl, and pyrenyl. In formula (L3), m is 0 or 1, n is 0, 1, 2 or 3, and 2 m+n is equal to 2 or 3.

In formula (L4), $R^{L06}$ is a substituted or unsubstituted, straight, branched or cyclic $C_1$-$C_8$ alkyl group or a substituted or unsubstituted $C_6$-$C_{20}$ aryl group. Examples of these groups are the same as exemplified for $R^{L05}$. $R^{L07}$ to $R^{L16}$ each independently denote hydrogen or monovalent $C_1$-$C_{15}$ hydrocarbon groups. Exemplary hydrocarbon groups are straight, branched or cyclic alkyl groups such as methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl and cyclohexylbutyl, and substituted forms of the foregoing in which some hydrogen atoms are replaced by hydroxyl, alkoxy, carboxy, alkoxycarbonyl, oxo, amino, alkylamino, cyano, mercapto, alkylthio, sulfo or other groups. Alternatively, two of $R^{L07}$ to $R^{L16}$ may bond together to form a ring with the carbon atom to which they are attached (for example, a pair of $R^{L07}$ and $R^{L08}$, $R^{L07}$ and $R^{L09}$, $R^{L08}$ and $R^{L10}$, $R^{L09}$ and $R^{L10}$, $R^{L11}$ and $R^{L12}$, $R^{L13}$ and $R^{L14}$, or a similar pair). Each participant of $R^{L07}$ to $R^{L16}$ represents a divalent $C_1$-$C_{15}$ hydrocarbon group when they form a ring, examples of which are the ones exemplified above for the monovalent hydrocarbon groups, with one hydrogen atom being eliminated. Two of $R^{L07}$ to $R^{L16}$ which are attached to vicinal carbon atoms may bond together directly to form a double bond (for example, a pair of $R^{L07}$ and $R^{L09}$, $R^{L09}$ and $R^{L15}$, $R^{L13}$ and $R^{L15}$, or a similar pair).

Of the acid labile groups of formula (L1), the straight and branched ones are exemplified by the following groups.

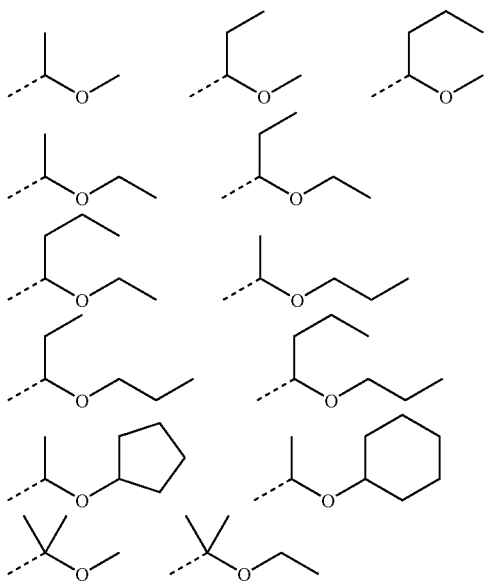

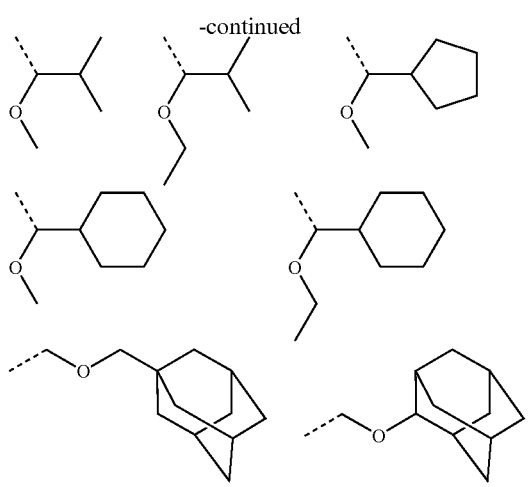

Of the acid labile groups of formula (L1), the cyclic ones are, for example, tetrahydrofuran-2-yl, 2-methyltetrahydrofuran-2-yl, tetrahydropyran-2-yl, and 2-methyltetrahydropyran-2-yl.

Examples of the acid labile groups of formula (L2) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl.

Examples of the acid labile groups of formula (L2-2) include
9-(tert-butyloxycarbonyl)-5-oxo-4-oxatricyclo[4.2.1.0$^{3,7}$]-nonan-2-yl,
9-(tert-amyloxycarbonyl)-5-oxo-4-oxatricyclo[4.2.1.0$^{3,7}$]nonan-2-yl,
9-(2-(adamantan-1-yl)propan-2-yloxycarbonyl)-5-oxo-4-oxa-tricyclo[4.2.1.0$^{3,7}$]nonan-2-yl,
9-(1-ethylcyclopentyloxycarbonyl)-5-oxo-4-oxatricyclo-[4.2.1.0$^{3,7}$]nonan-2-yl,
9-(1-butylcyclopentyloxycarbonyl)-5-oxo-4-oxatricyclo-[4.2.1.0$^{3,7}$]nonan-2-yl,
9-(1-ethylcyclohexyloxycarbonyl)-5-oxo-4-oxatricyclo-[4.2.1.0$^{3,7}$]nonan-2-yl,
9-(1-butylcyclohexyloxycarbonyl)-5-oxo-4-oxatricyclo-[4.2.1.0$^{3,7}$]nonan-2-yl,
9-(2-methyl-2-adamantyloxycarbonyl)-5-oxo-4-oxatricy-clo-[4.2.1.0$^{3,7}$]nonan-2-yl,
9-(2-ethyl-2-adamantyloxycarbonyl)-5-oxo-4-oxatricyclo-[4.2.1.0$^{3,7}$]nonan-2-yl,
9-(4-ethyltetracyclo[6.2.1.1$^{3,6}$.0$^{2,7}$]dodecan-4-yloxycarbonyl)-5-oxo-4-oxatricyclo[4.2.1.0$^{3,7}$]nonan-2-yl,
2-(9-(tert-butyloxycarbonyl)-5-oxo-4-oxatricyclo[4.2.1.0$^{3,7}$]-nonan-2-yloxy)-2-oxoethyl,
2-(9-(tert-amyloxycarbonyl)-5-oxo-4-oxatricyclo[4.2.1.0$^{3,7}$]-nonan-2-yloxy)-2-oxoethyl,
2-(9-(2-(adamantan-1-yl)propan-2-yloxycarbonyl)-5-oxo-4-oxatricyclo[4.2.1.0$^{3,7}$]nonan-2-yloxy)-2-oxoethyl,
2-(9-(1-ethylcyclopentyloxycarbonyl)-5-oxo-4-oxatricyclo-[4.2.1.0$^{3,7}$]nonan-2-yloxy)-2-oxoethyl,
2-(9-(1-butylcyclopentyloxycarbonyl)-5-oxo-4-oxatricyclo-[4.2.1.0$^{3,7}$]nonan-2-yloxy)-2-oxoethyl,
2-(9-(1-ethylcyclohexyloxycarbonyl)-5-oxo-4-oxatricyclo-[4.2.1.0$^{3,7}$]nonan-2-yloxy)-2-oxoethyl, 2-(9-(1-butylcyclohexyloxycarbonyl)-5-oxo-4-oxatricyclo-[4.2.1.0$^{3,7}$]nonan-2-yloxy)-2-oxoethyl, 2-(9-(2-methyl-2-adamantyloxycarbonyl)-5-oxo-4-oxatricyclo-[4.2.1.0$^{3,7}$]nonan-2-yloxy)-2-oxoethyl, 2-(9-(2-ethyl-2-adamantyloxycarbonyl)-5-oxo-4-oxatricyclo-[4.2.1.0$^{3,7}$]nonan-2-yloxy)-2-oxoethyl, 2-(9-(4-ethyltetracyclo[6.2.1.1$^{3,6}$.0$^{2,7}$]dodecan-4-yloxy-carbonyl)-5-oxo-4-oxatricyclo[4.2.1.0$^{3,7}$]nonan-2-yloxy)-2-oxoethyl, 4-(9-(tert-butyloxycarbonyl)-5-oxo-4-oxatricyclo[4.2.1.0$^{3,7}$]-nonan-2-yloxy)-4-oxobutyl, 4-(9-(tert-amyloxycarbonyl)-5-oxo-4-oxatricyclo[4.2.1.0$^{3,7}$]-nonan-2-yloxy)-4-oxobutyl, 4-(9-(2-(adamantan-1-yl)propan-2-yloxycarbonyl)-5-oxo-4-oxatricyclo[4.2.1.0$^{3,7}$]nonan-2-yloxy)-4-oxobutyl, 4-(9-(1-ethylcyclopentyloxycarbonyl)-5-oxo-4-oxatricyclo-[4.2.1.0$^{3,7}$]nonan-2-yloxy)-4-oxobutyl, 4-(9-(1-butylcyclopentyloxycarbonyl)-5-oxo-4-oxatricyclo-[4.2.1.0$^{3,7}$]nonan-2-yloxy)-4-oxobutyl, 4-(9-(1-ethylcyclohexyloxycarbonyl)-5-oxo-4-oxatricyclo-[4.2.1.0$^{3,7}$]nonan-2-yloxy)-4-oxobutyl, 4-(9-(1-butylcyclohexyloxycarbonyl)-5-oxo-4-oxatricyclo-[4.2.1.0$^{3,7}$]nonan-2-yloxy)-4-oxobutyl, 4-(9-(2-methyl-2-adamantyloxycarbonyl)-5-oxo-4-oxatricyclo-[4.2.1.0$^{3,7}$]nonan-2-yloxy)-4-oxobutyl, 4-(9-(2-ethyl-2-adamantyloxycarbonyl)-5-oxo-4-oxatricyclo-[4.2.1.0$^{3,7}$]nonan-2-yloxy)-4-oxobutyl, 4-(9-(4-ethyltetracyclo[6.2.1.1$^{3,6}$.0$^{2,7}$]dodecan-4-yloxy-carbonyl)-5-oxo-4-oxatricyclo[4.2.1.0$^{3,7}$]nonan-2-yloxy)-4-oxobutyl, etc.

Examples of the acid labile groups of formula (L3) include 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-cyclohexylcyclopentyl, 1-(4-methoxy-n-butyl)cyclopentyl, 1-methylcyclohexyl, 1-ethylcyclohexyl, 3-methyl-1-cyclopenten-3-yl, 3-ethyl-1-cyclopenten-3-yl, 3-methyl-1-cyclohexen-3-yl, and 3-ethyl-1-cyclohexen-3-yl.

Of the acid labile groups of formula (L4), those groups of the following formulae (L4-1) to (L4-4) are more preferred.

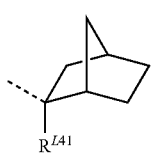
(L4-1)

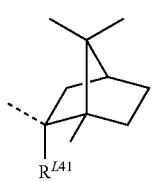
(L4-2)

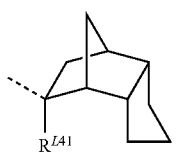
(L4-3)

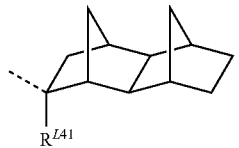
(L4-4)

In formulae (L4-1) to (L4-4), the broken line denotes a bonding site and direction. R$^{L41}$ is each independently selected from monovalent hydrocarbon groups, typically straight, branched or cyclic C$_1$-C$_{10}$ alkyl groups, for example, methyl, ethyl, propyl, isopropyl, n-butyl, sec-butyl, tert-butyl, tert-amyl, n-pentyl, n-hexyl, cyclopentyl, and cyclohexyl.

For formulas (L4-1) to (L4-4), there can exist enantiomers and diastereomers. Each of formulae (L4-1) to (L4-4) collectively represents all such stereoisomers. Such stereoisomers may be used alone or in admixture.

For example, the general formula (L4-3) represents one or a mixture of two selected from groups having the following general formulas (L4-3-1) and (L4-3-2).

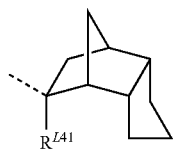
(L4-3-1)

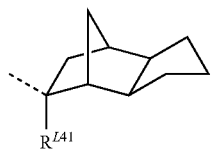
(L4-3-2)

Similarly, the general formula (L4-4) represents one or a mixture of two or more selected from groups having the following general formulas (L4-4-1) to (L4-4-4).

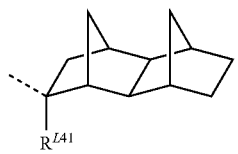
(L4-4-1)

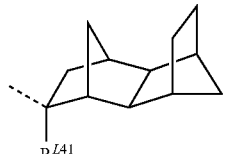
(L4-4-2)

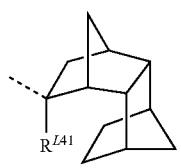
(L4-4-3)

(L4-4-4)

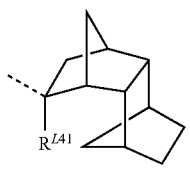

Each of formulas (L4-1) to (L4-4), (L4-3-1) and (L4-3-2), and (L4-4-1) to (L4-4-4) collectively represents an enantiomer thereof and a mixture of enantiomers.

It is noted that in the above formulas (L4-1) to (L4-4), (L4-3-1) and (L4-3-2), and (L4-4-1) to (L4-4-4), the bond direction is on the exo side relative to the bicyclo[2.2.1]heptane ring, which ensures high reactivity for acid catalyzed elimination reaction (see JP-A 2000-336121). In preparing these monomers having a tertiary exo-alkyl group of bicyclo[2.2.1]heptane skeleton as a substituent group, there may be contained monomers substituted with an endo-alkyl group as represented by the following formulas (L4-1-endo) to (L4-4-endo). For good reactivity, an exo proportion of at least 50 mol % is preferred, with an exo proportion of at least 80 mol % being more preferred.

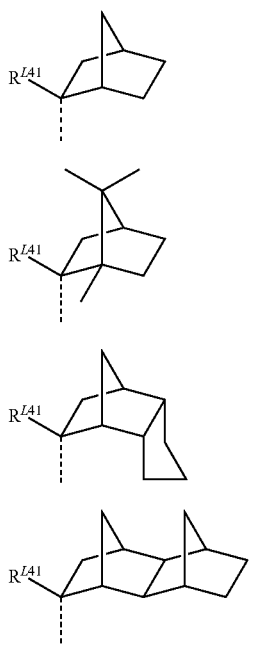

(L4-1-endo)

(L4-2-endo)

(L4-3-endo)

(L4-4-endo)

(See JP-A 2000-336121)

Illustrative examples of the acid labile group of formula (L4) are given below, but not limited thereto.

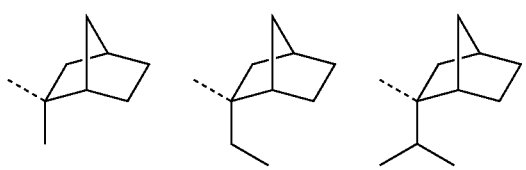

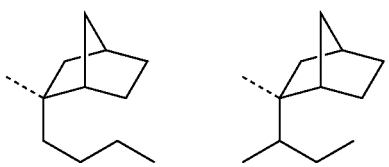

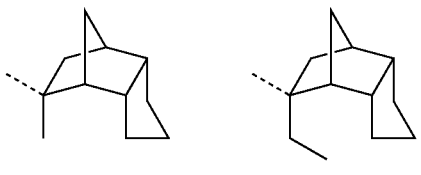

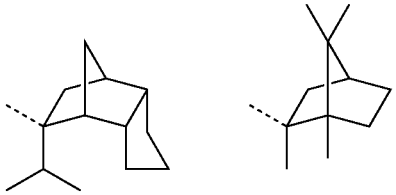

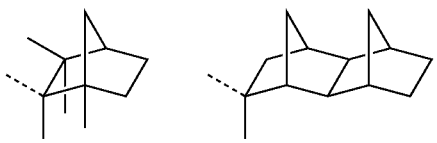

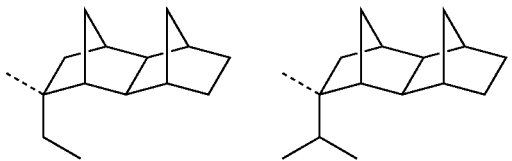

Examples of the tertiary $C_4$-$C_{20}$ alkyl, tri($C_1$-$C_6$-alkyl)silyl and $C_4$-$C_{20}$ oxoalkyl groups are as exemplified above for $R^{L04}$.

Illustrative, non-limiting examples of the recurring units of formula (3) are given below. Although only (meth)acrylates are illustrated, those which are separated by a divalent linking group of formula (L2) or (L2-2) (i.e., —$(CH_2)_y$COO— or -A-COO—) are also useful.

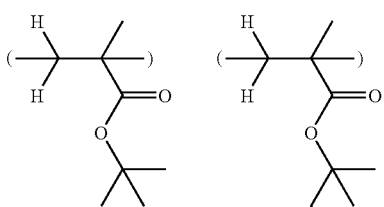

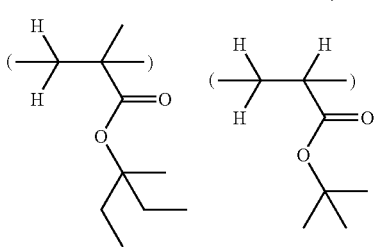

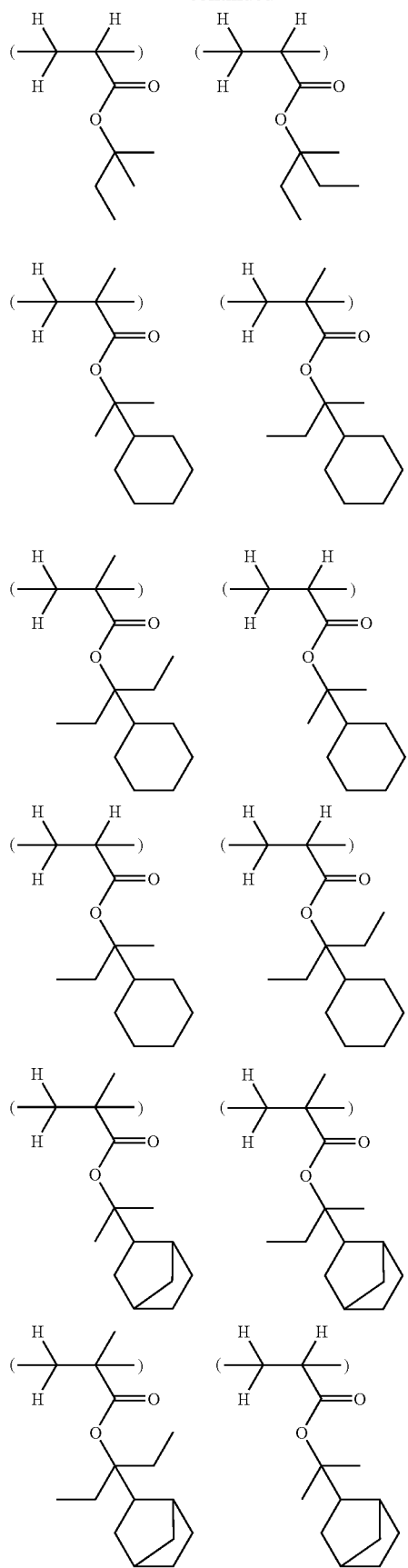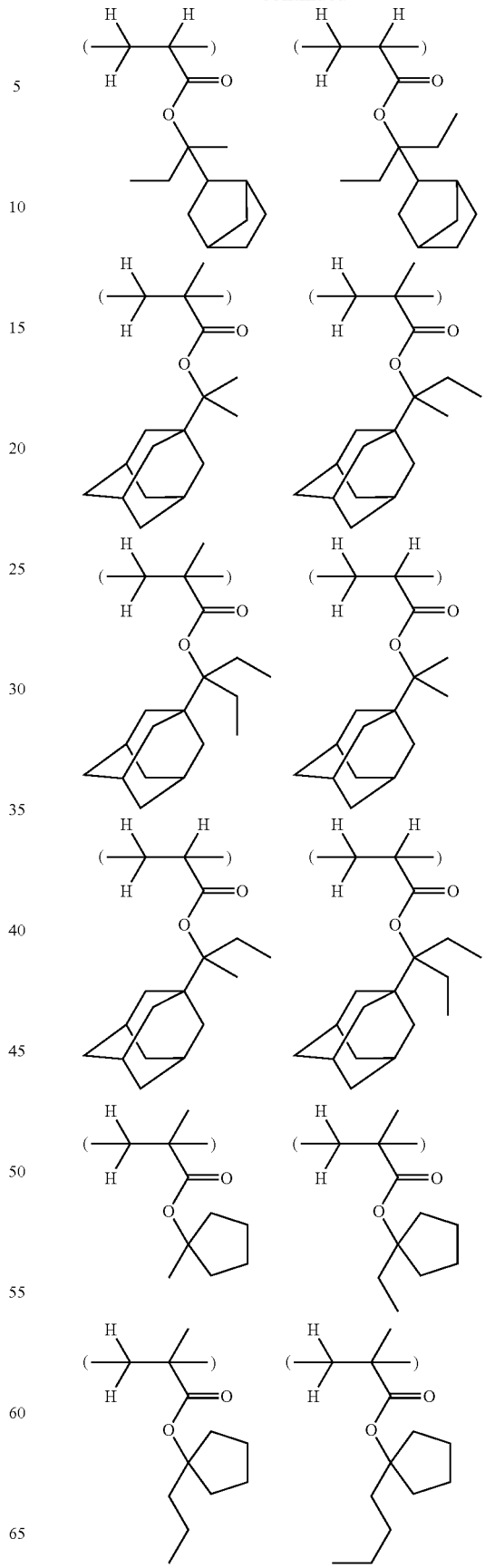

-continued
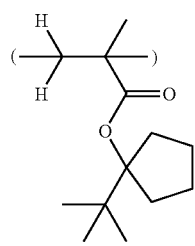 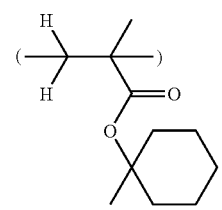
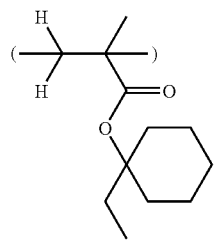 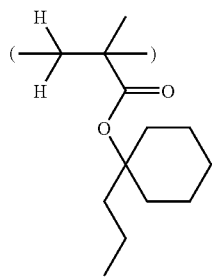
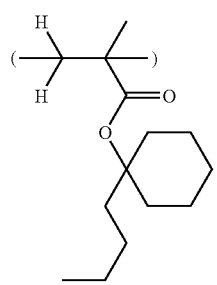 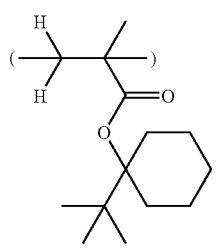
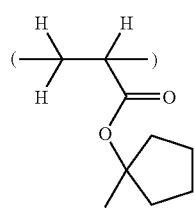 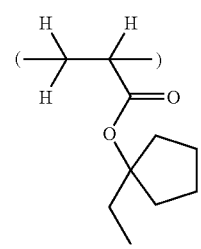
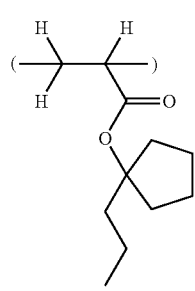 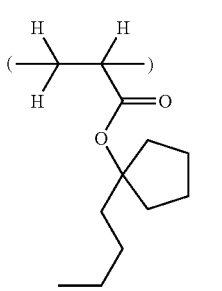
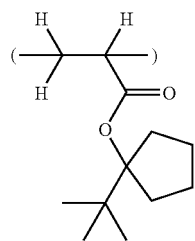 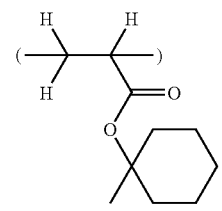
-continued
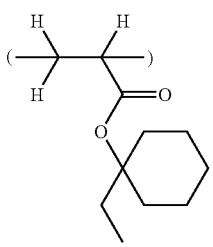 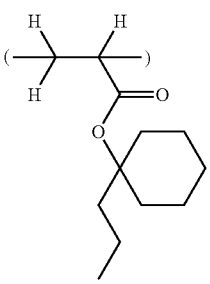
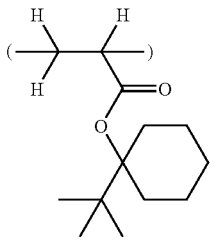 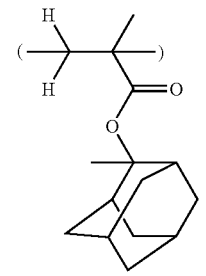
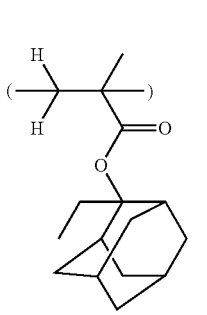 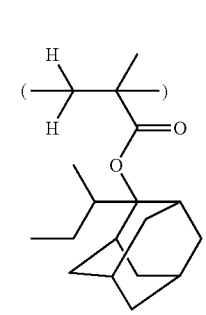
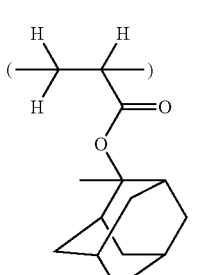 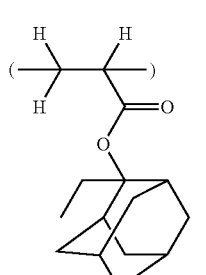
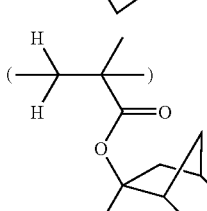 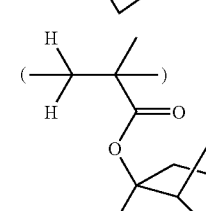
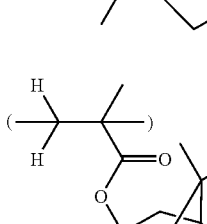 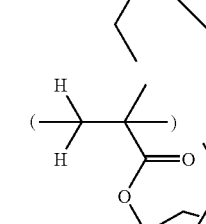

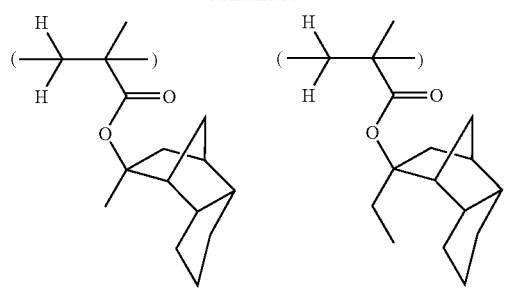
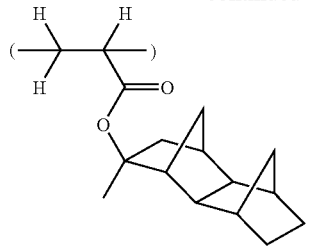
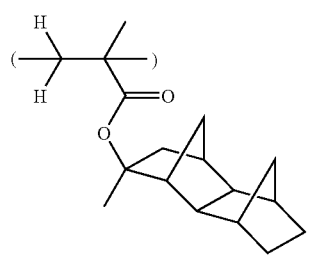
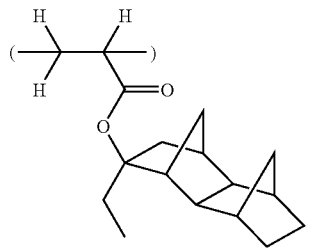
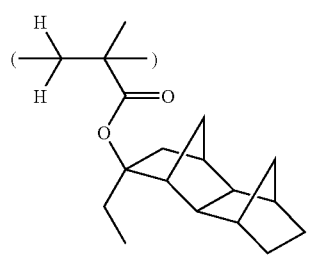
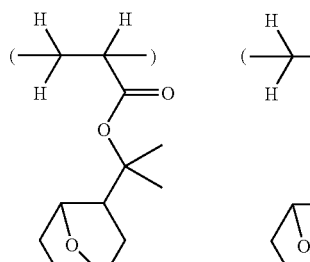
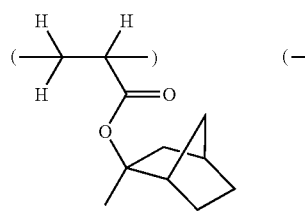
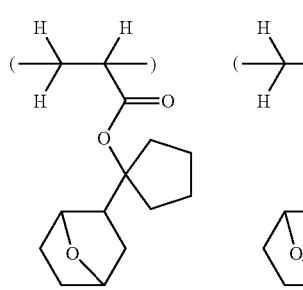
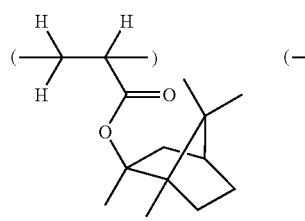
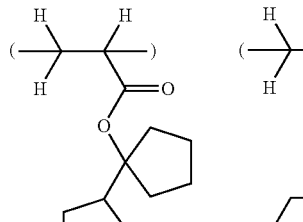
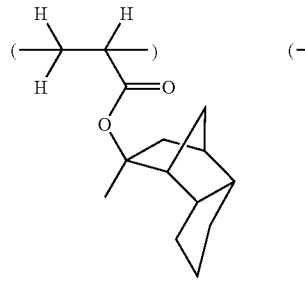
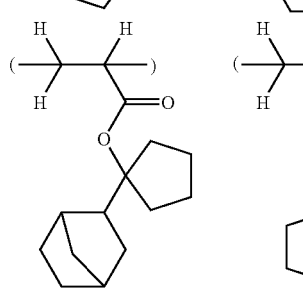

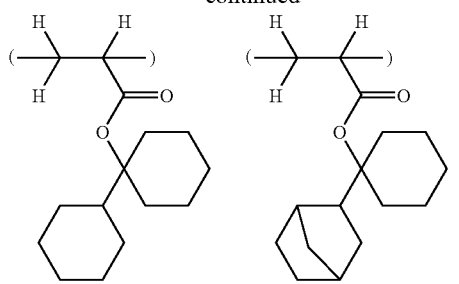
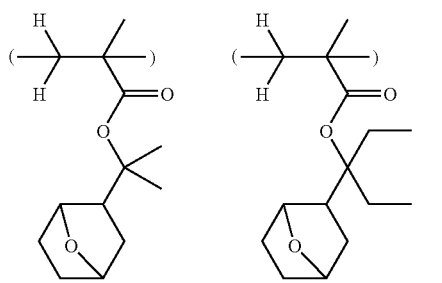
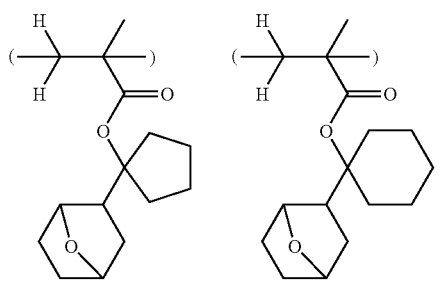
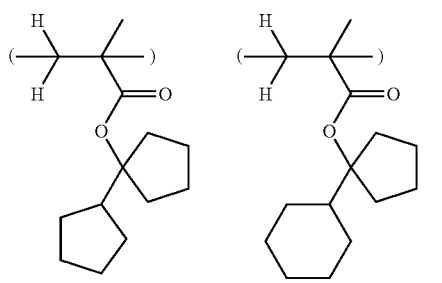
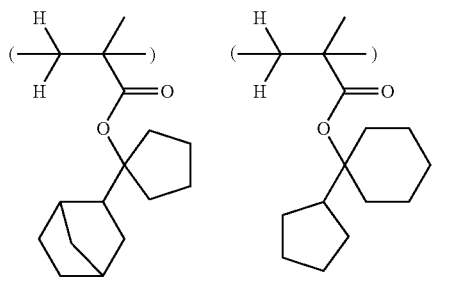
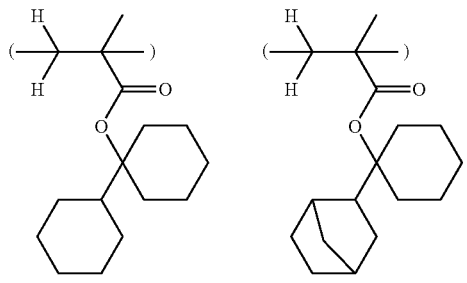
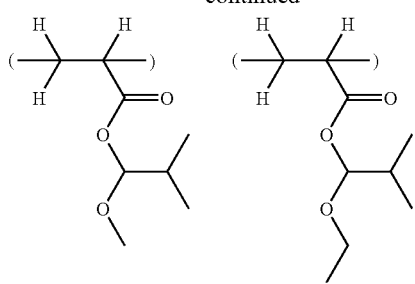
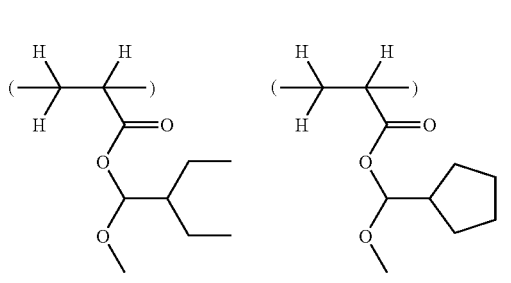
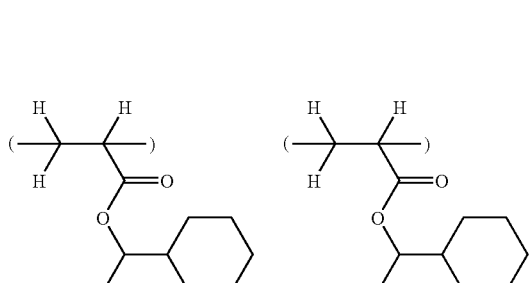
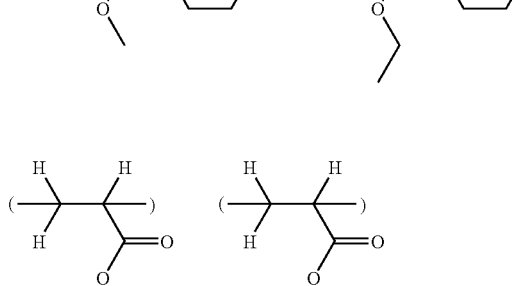
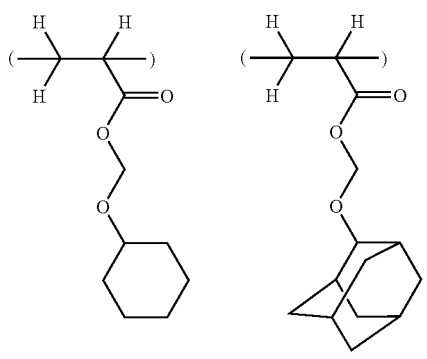

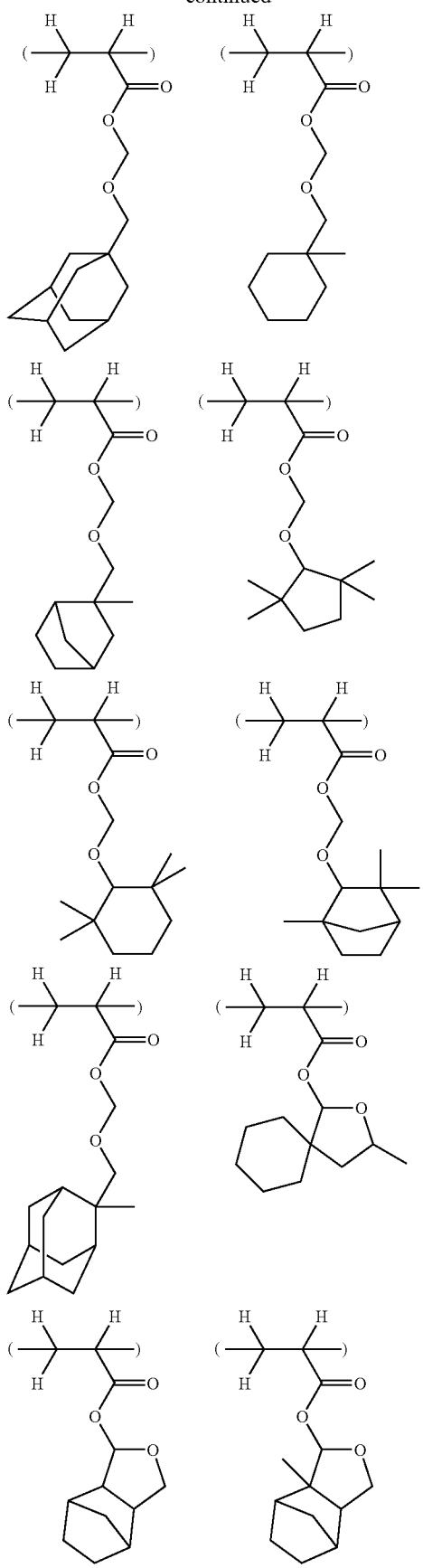
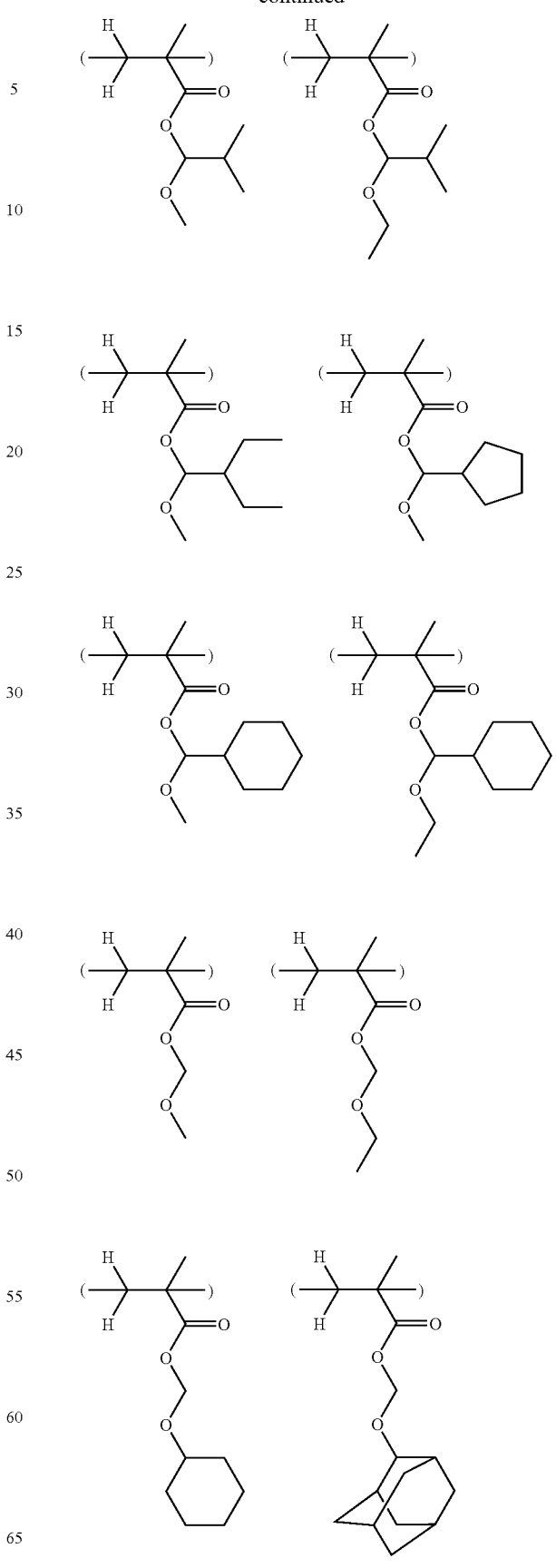

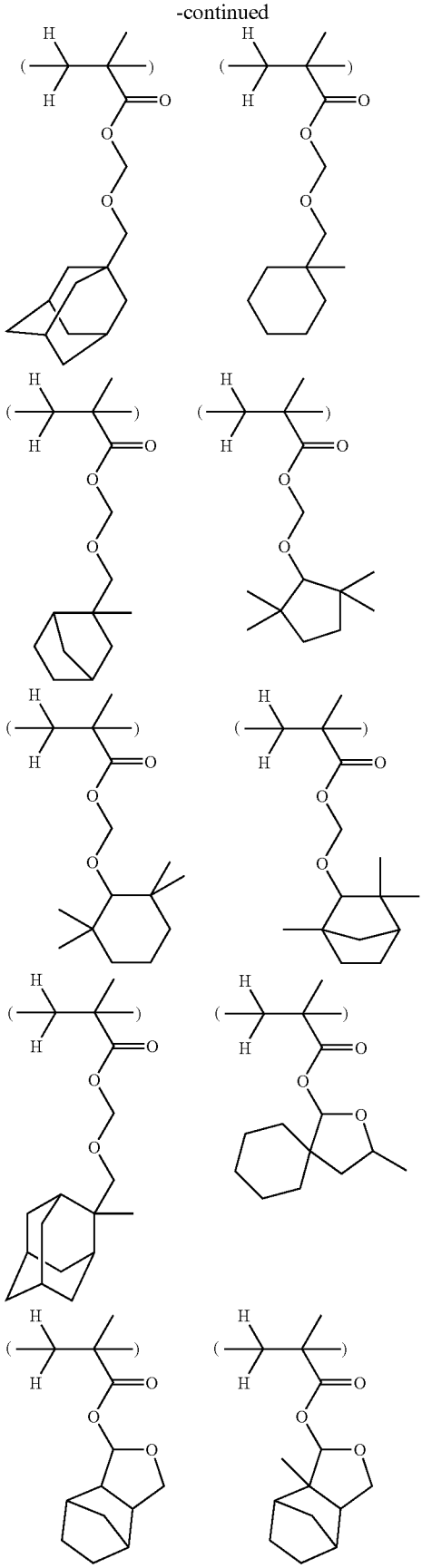
A second embodiment provides a polymer comprising recurring units having the general formulae (1a), (2) and (3).
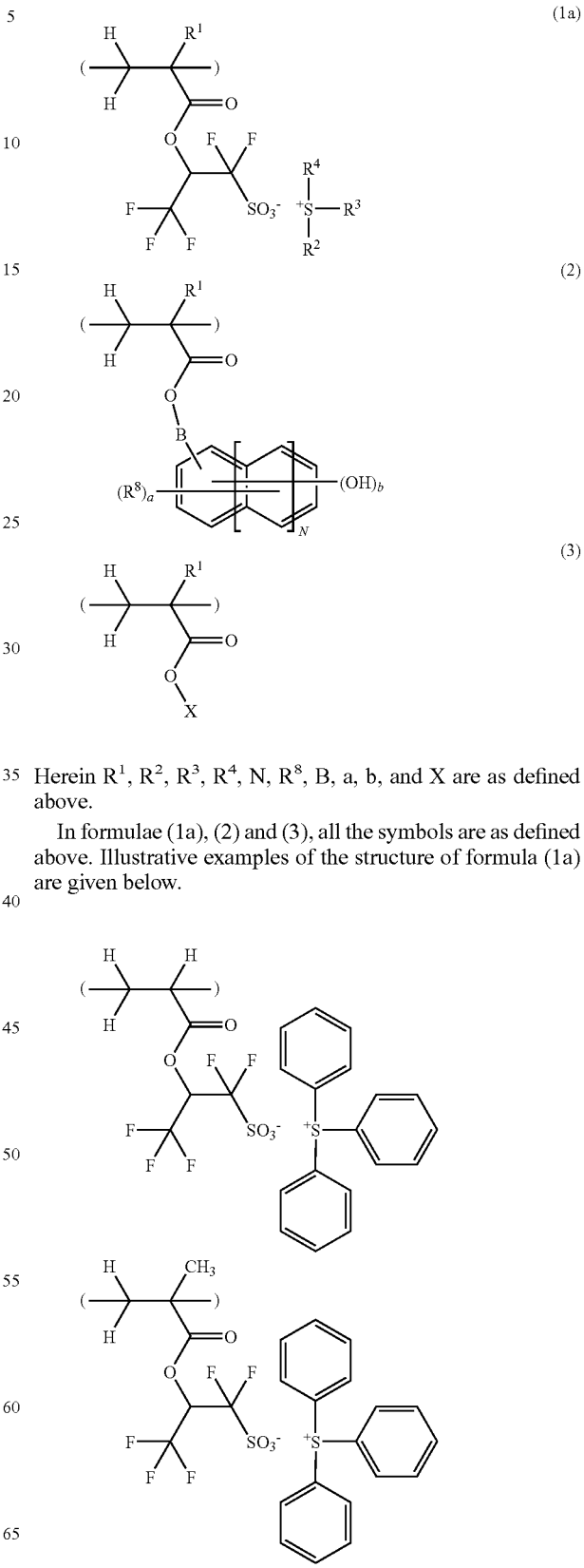
Herein $R^1$, $R^2$, $R^3$, $R^4$, N, $R^8$, B, a, b, and X are as defined above.
In formulae (1a), (2) and (3), all the symbols are as defined above. Illustrative examples of the structure of formula (1a) are given below.

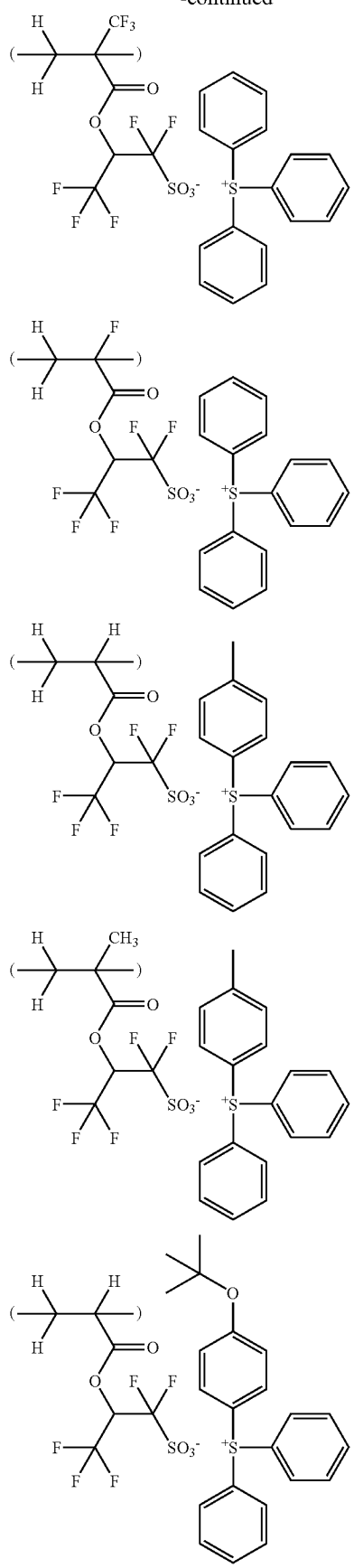
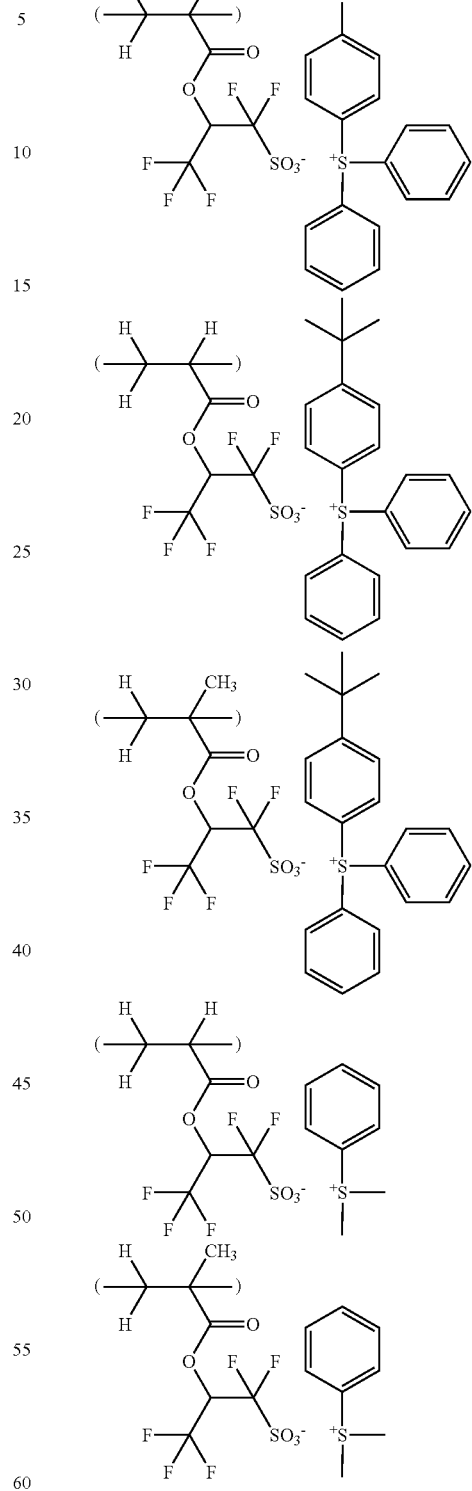
While the recurring units of formula (1a) are derived from a sulfonium salt having a polymerizable anion, synthesis of the sulfonium salt is described below. The sulfonium salt having a polymerizable anion may be synthesized by starting with triphenylsulfonium 1,1,3,3,3-pentafluoro-2-hydroxy-propanesulfonate, synthesized by the inventors as described below, and reacting it with (meth)acryloyl chloride or (meth)acrylic anhydride under basic conditions.

Briefly noted herein is the synthesis of triphenylsulfonium 1,1,3,3,3-pentafluoro-2-hydroxypropane-sulfonate. First, an aliphatic or aromatic carboxylic acid ester of 1,1,3,3,3-pentafluoropropen-2-yl, typically 1,1,3,3,3-pentafluoropropen-2-yl benzoate, which was developed by Nakai et al. using 1,1,1,3,3,3-hexafluoro-2-propanol as the starting reactant, is reacted with sodium hydrogen sulfite or sodium sulfite in a solvent such as water or alcohol or a mixture thereof in the presence of a radical initiator such as azobisisobutyronitrile or benzoyl peroxide, forming a corresponding 1,1,3,3,3-pentafluoro-2-acyloxy-propanesulfonic acid salt or 1,1,3,3,3-pentafluoro-2-arene-carbonyloxypropanesulfonic acid salt. This salt is ion-exchanged with a suitable sulfonium salt, forming triphenylsulfonium 1,1,3,3,3-pentafluoro-2-acyloxypropane-sulfonate or triphenylsulfonium 1,1,3,3,3-pentafluoro-2-arenecarbonyloxypropanesulfonate. The carboxylate moiety of the sulfonate is then subjected to hydrolysis with the aid of an alkali such as sodium hydroxide or potassium hydroxide, or solvolysis with the aid of an alcohol and base, yielding the target compound, triphenylsulfonium 1,1,3,3,3-pentafluoro-2-hydroxypropanesulfonate. Salts of sulfonium other than triphenylsulfonium may be similarly synthesized.

The reaction to synthesize the polymerizable anion may be readily performed in accordance with the well-known method. In a recommended procedure, the sulfonium salt such as triphenylsulfonium 1,1,3,3,3-pentafluoro-2-hydroxypropane-sulfonate is dissolved in a solvent such as methylene chloride, tetrahydrofuran or acetonitrile. To the solution, a base (e.g., triethylamine, pyridine or 4-dimethylaminopyridine) and an acid chloride or acid anhydride (e.g., acryloyl chloride, acrylic anhydride, methacryloyl chloride, methacrylic anhydride, 2-fluoromethacryloyl chloride, 2-fluoroacrylic anhydride, α,α,α-trifluoromethacryloyl chloride or α,α,α-trifluoromethacrylic anhydride) are added in sequence or at the same time while cooling or heating as desired.

In addition to the recurring units of formulae (1), (2) and (3) or the recurring units of formulae (1a), (2) and (3), the polymer may further comprise recurring units of at least one type selected from the following general formulae (4) to (6).

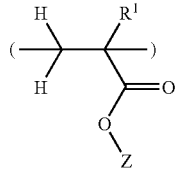
(4)

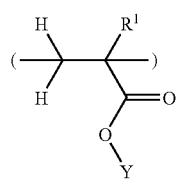
(5)

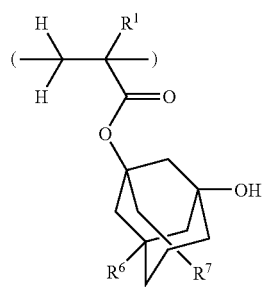
(6)

Herein $R^1$ is as defined above, $R^6$ and $R^7$ are each independently hydrogen or hydroxyl, Y is a substituent group of lactone structure, and Z is hydrogen, a $C_1$-$C_{15}$ fluoroalkyl or $C_1$-$C_{15}$ fluoroalcohol-containing substituent group.

Illustrative examples of the recurring units of formula (4) are given below.

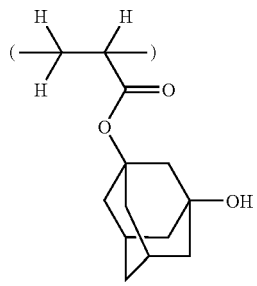 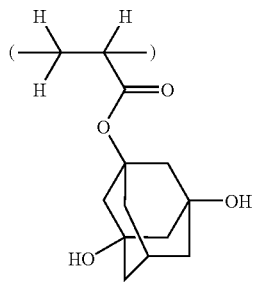

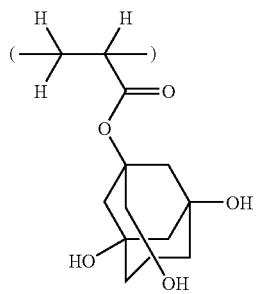 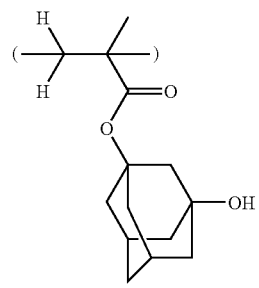

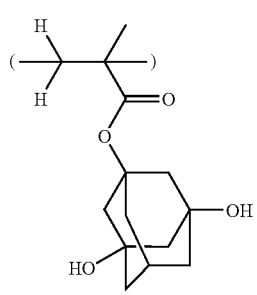 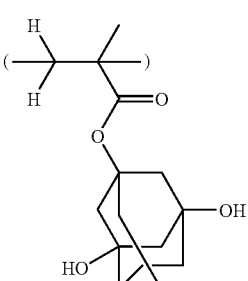

Illustrative examples of the recurring units of formula (5) are given below. Notably, recurring units having an acid labile group are also encompassed. Examples of such units overlap the examples of formula (L2-2) illustrated above as the acid labile group, and they may be used either as the lactone unit or as the acid labile group-containing unit.

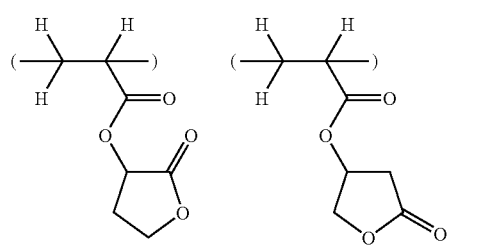
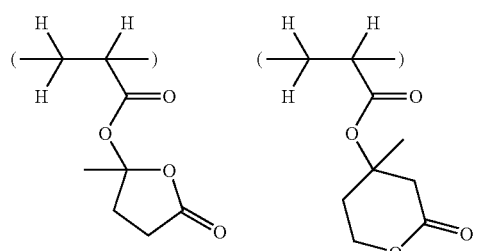
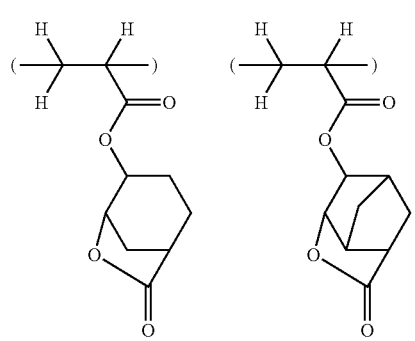
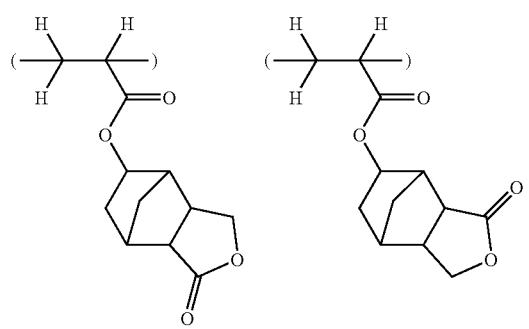
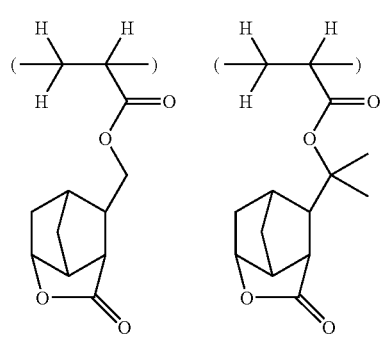
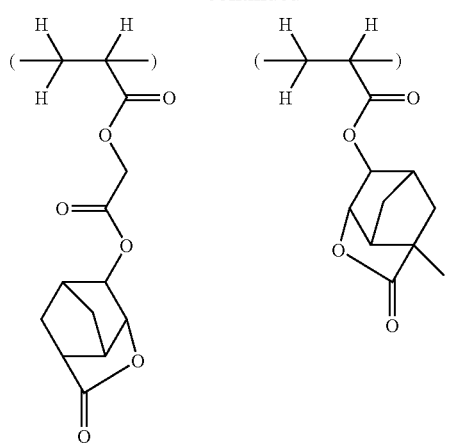
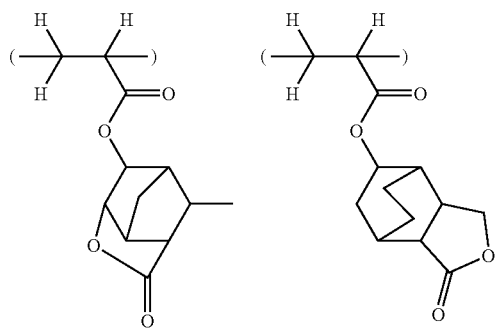
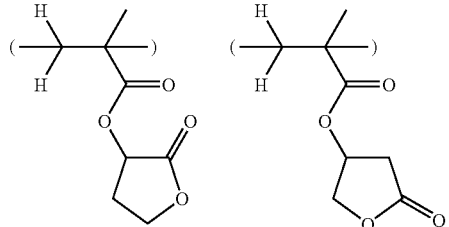
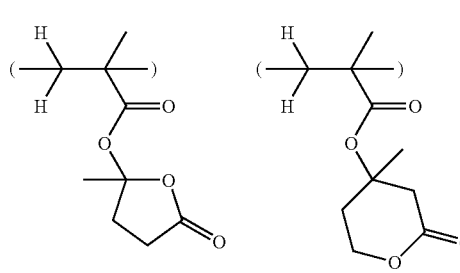
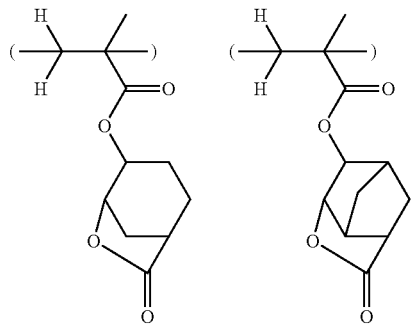

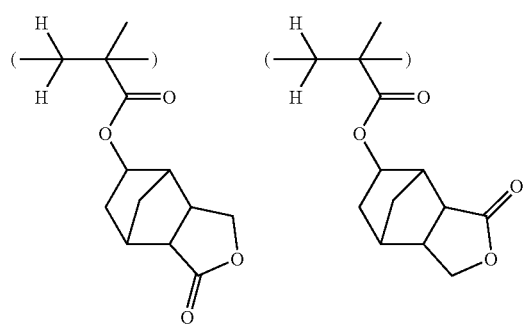
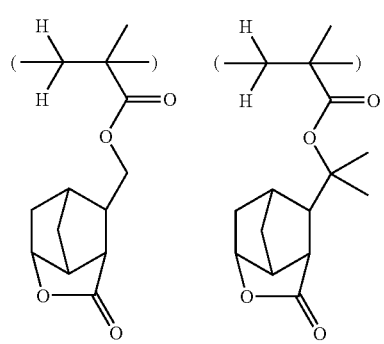
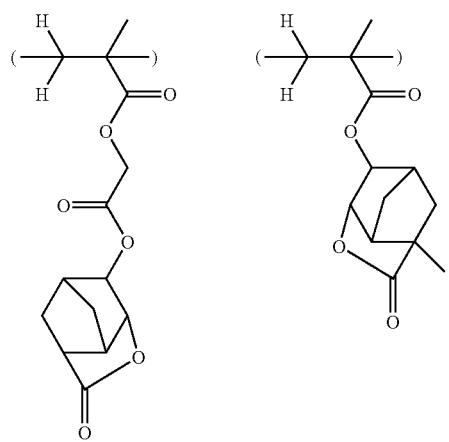
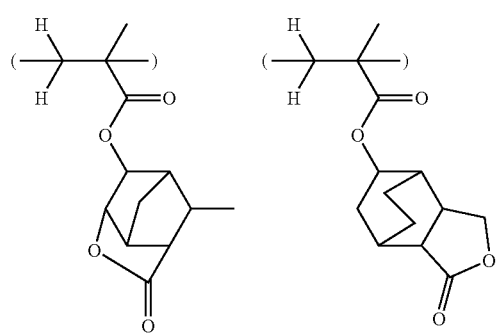
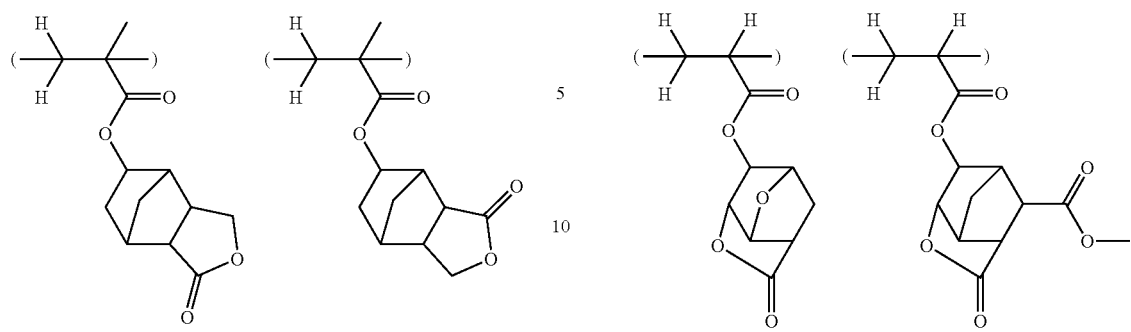
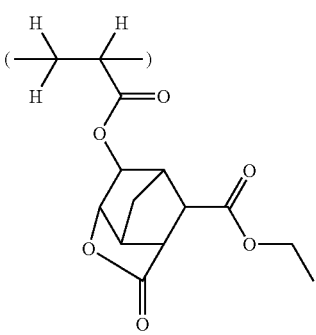
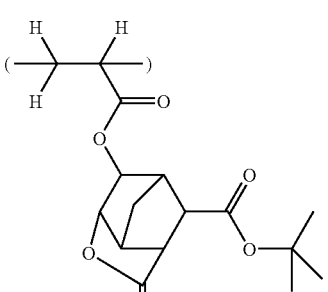
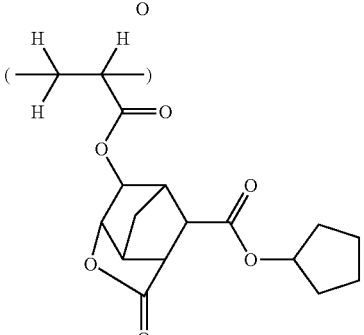
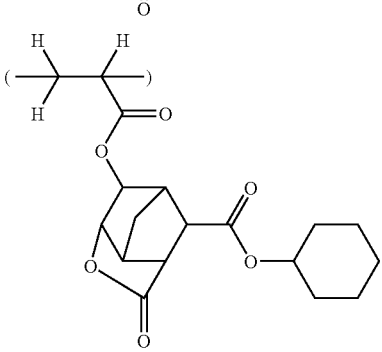

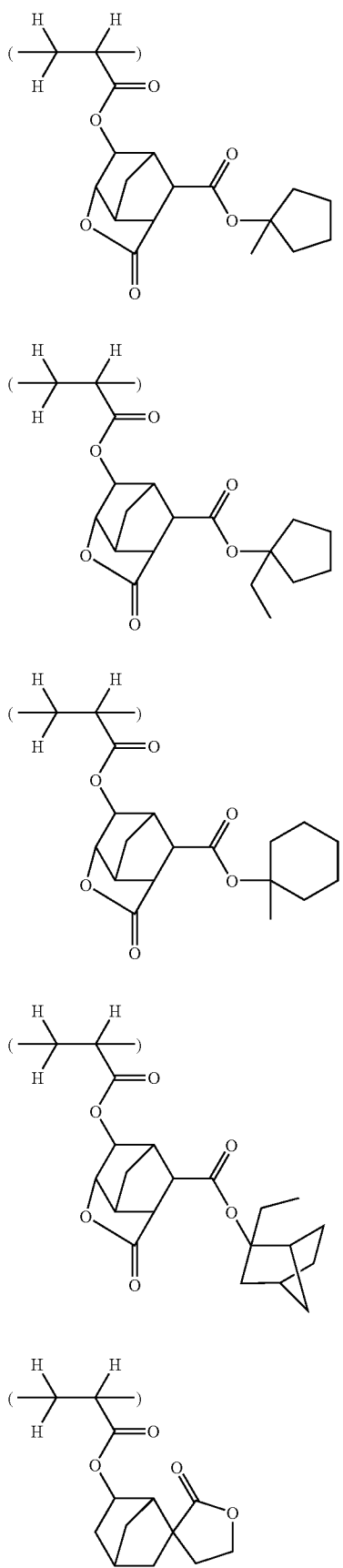
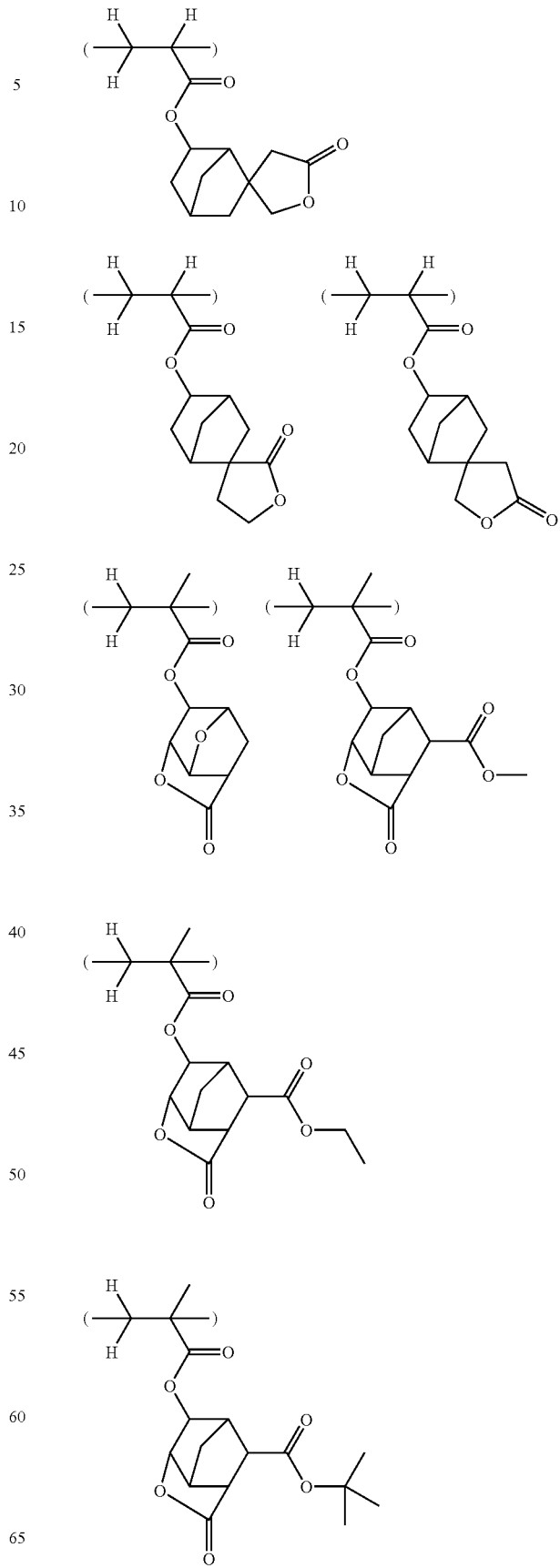

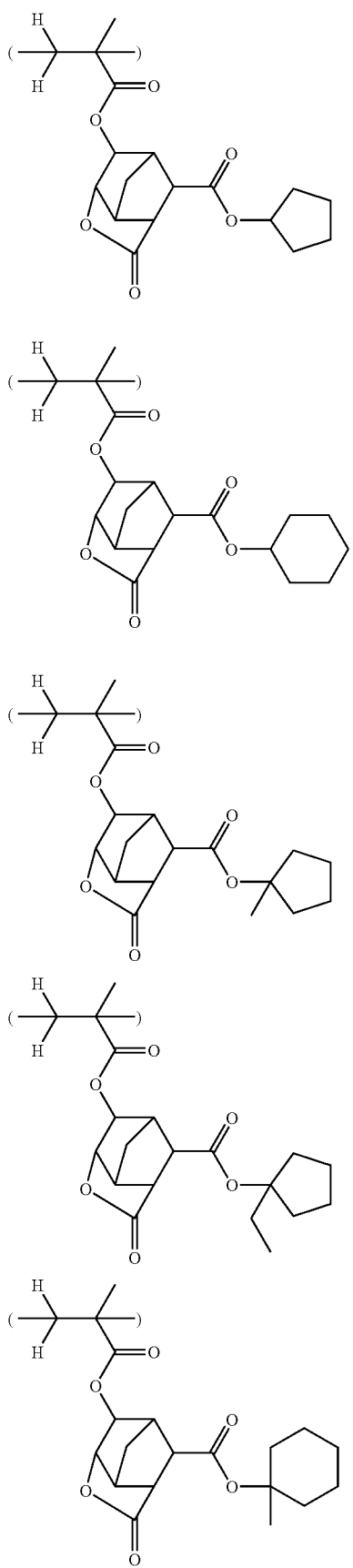
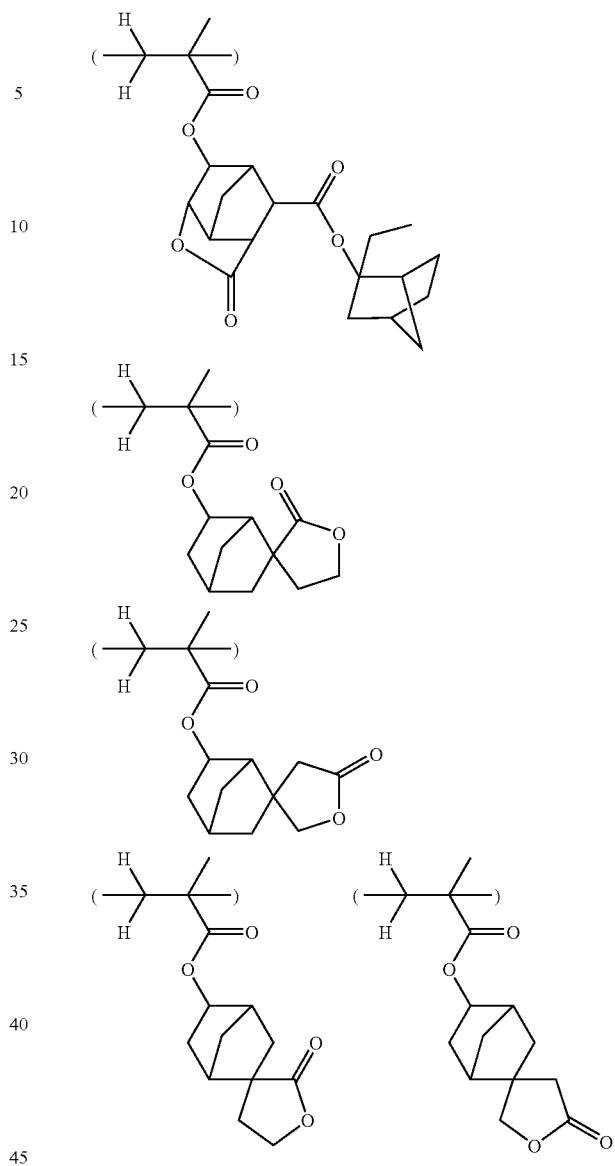
Also, units of the general formula (5L-1) may be advantageously used.
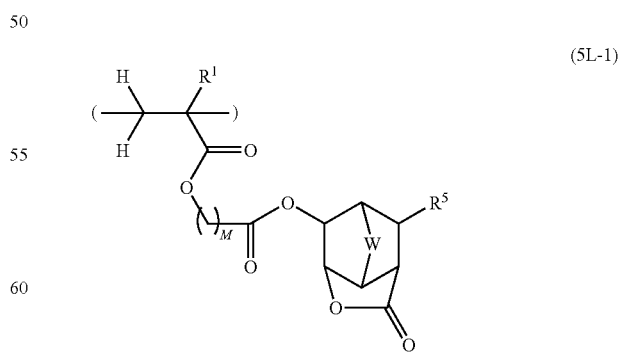
In formula (5L-1), $R^1$ is hydrogen, fluorine, methyl or trifluoromethyl, and preferably methyl. $R^5$ is hydrogen or $CO_2R^{5'}$ wherein $R^{5'}$ is hydrogen or a straight, branched or cyclic $C_1$-$C_{15}$ monovalent hydrocarbon group which may have halogen or oxygen. W is $CH_2$, O or S. M is an integer of 1 to 3.

Examples of $R^{5'}$ include hydrogen, methyl, ethyl, n-propyl, isopropyl, n-butyl, sec-butyl, isobutyl, tert-butyl, cyclopentyl, cyclohexyl, 1-methylcyclopentyl, 1-ethylcyclopentyl, 1-methylcyclohexyl, 1-ethylcyclohexyl, 2-ethylhexyl, n-octyl, 2-methylbicyclo[2.2.1]heptan-2-yl, 2-ethylbicyclo[2.2.1]heptan-2-yl, 2-methyladamantan-2-yl, 2-ethyladamantan-2-yl, 8-methyltricyclo[5.2.1.0$^{2,6}$]decan-8-yl, 8-ethyltricyclo[5.2.1.0$^{2,6}$]decan-8-yl, 4-methyltetracyclo[6.2.1.1$^{3,6}$.0$^{2,7}$]dodecan-4-yl, 4-ethyltetracyclo[6.2.1.1$^{3,6}$.0$^{2,7}$]dodecan-4-yl, methoxymethyl, ethoxymethyl, methoxyethyl, ethoxyethyl, and methoxyethoxyethyl, as well as the groups shown below.

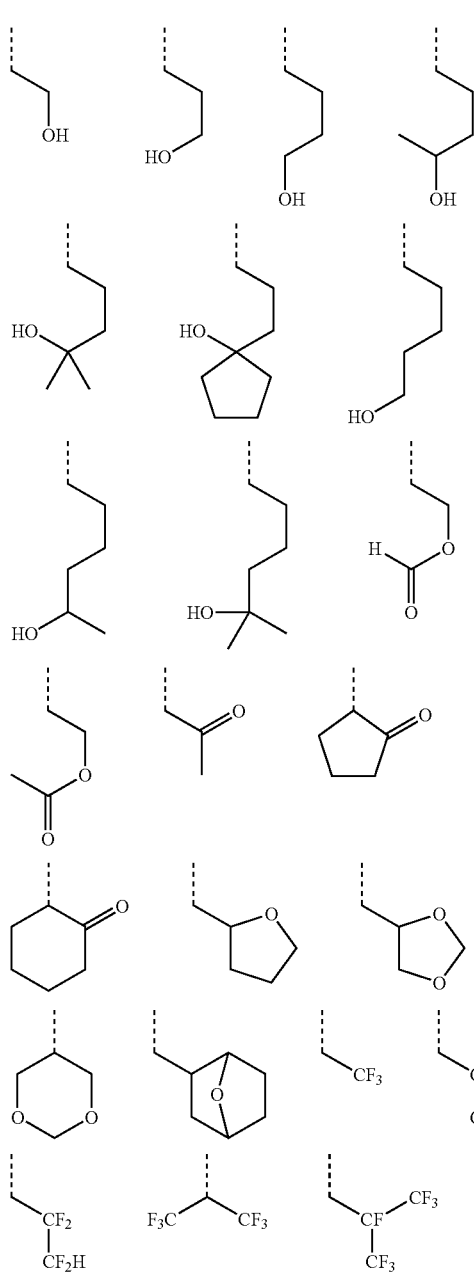
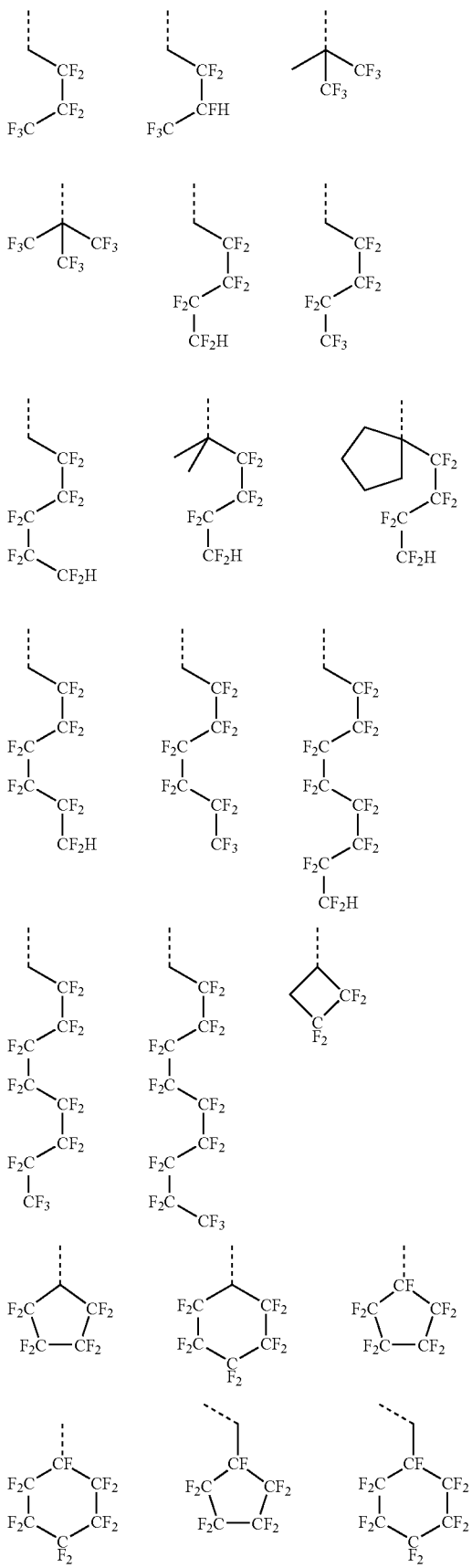

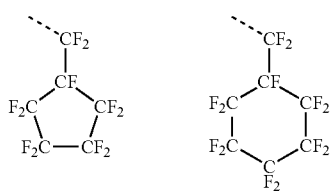

(The Broken Line Denotes a Valence Bond.)

Preferred examples of $R^{5'}$ include methyl, 1-methylcyclopentyl, 1-ethylcyclopentyl, 1-methylcyclohexyl, 1-ethylcyclohexyl, 2-methyladamantan-2-yl, 2-ethyladamantan-2-yl, 8-methyltricyclo[5.2.1.0$^{2,6}$]decan-8-yl, 8-ethyltricyclo[5.2.1.0$^{2,6}$]decan-8-yl, 4-ethyltetracyclo[6.2.1.1$^{3,6}$.0$^{2,7}$]dodecan-4-yl. Preferably W is $CH_2$.

Examples of suitable monomers from which recurring units of formula (5L-1) are derived are given below.

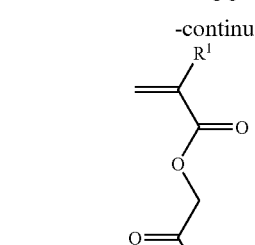

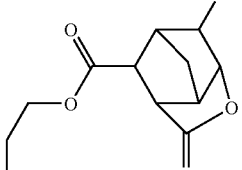

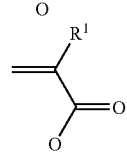

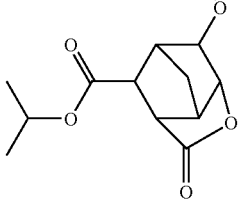

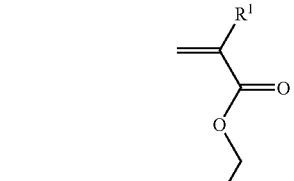

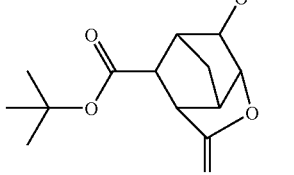

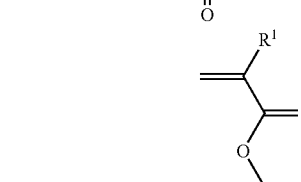

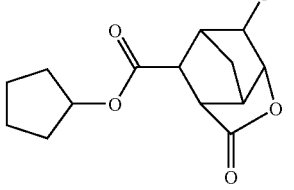

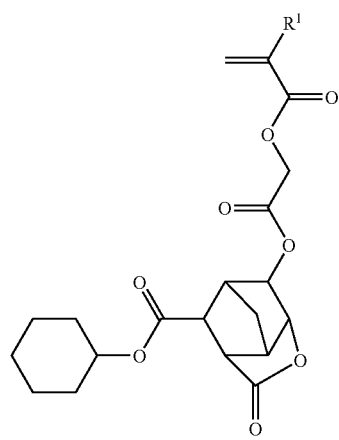
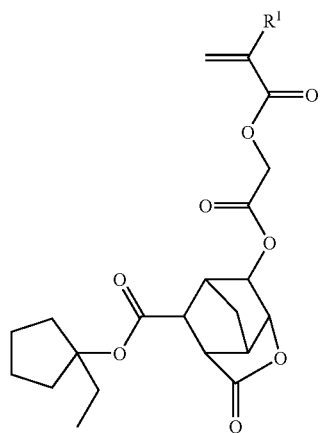
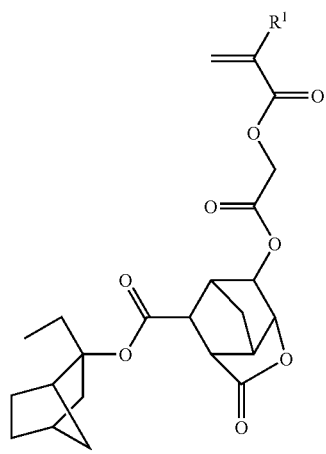
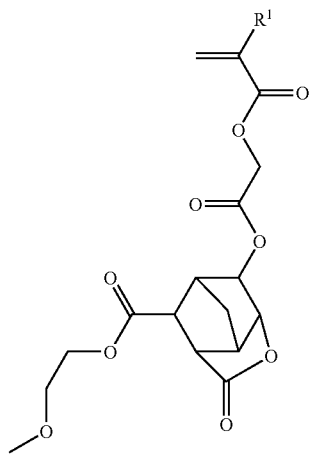
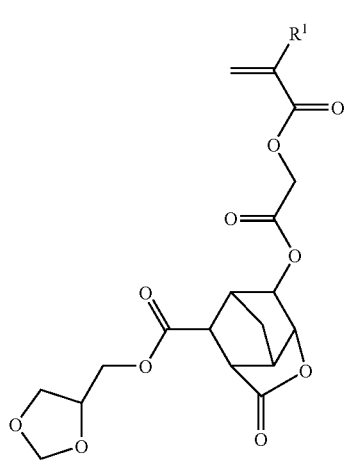
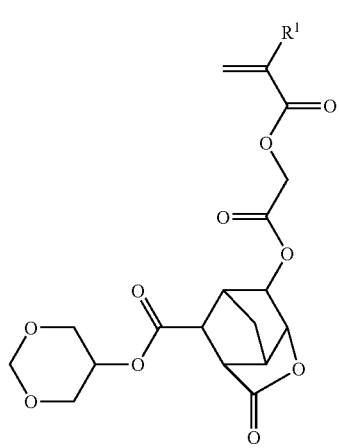

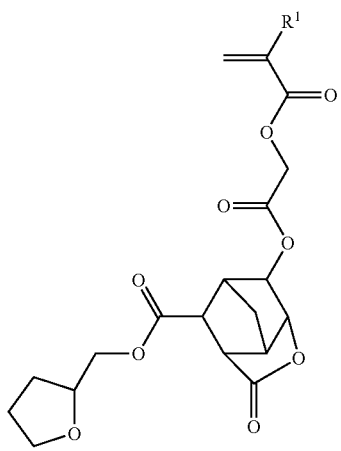
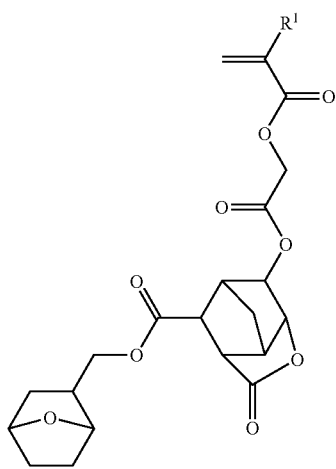
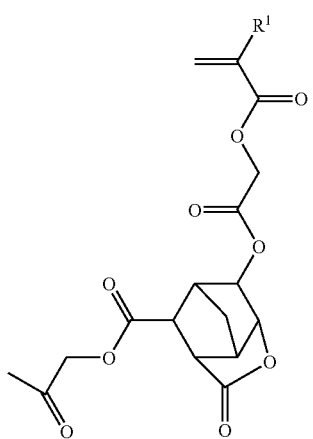
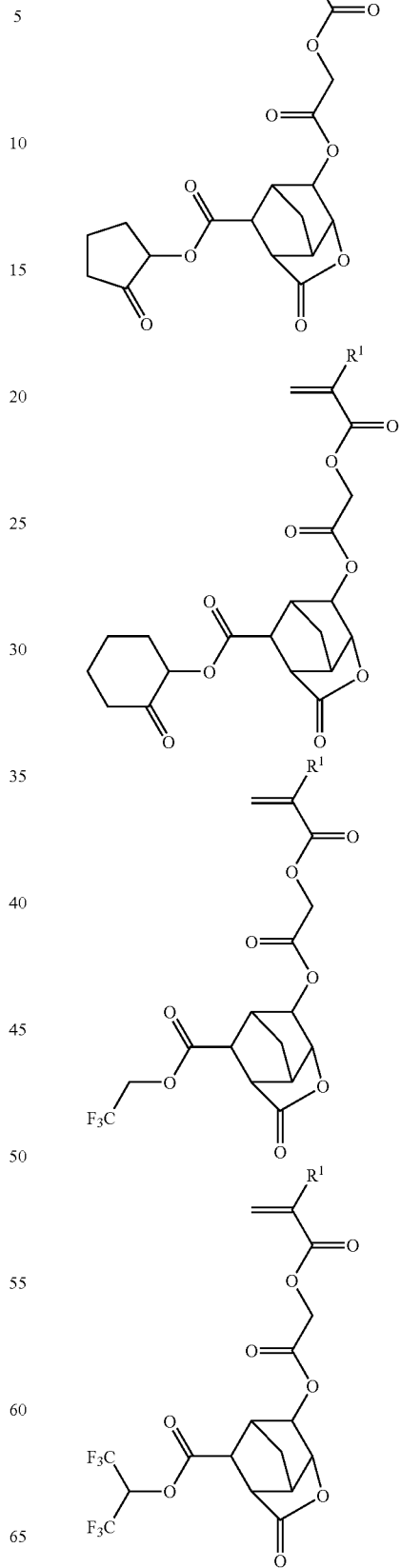

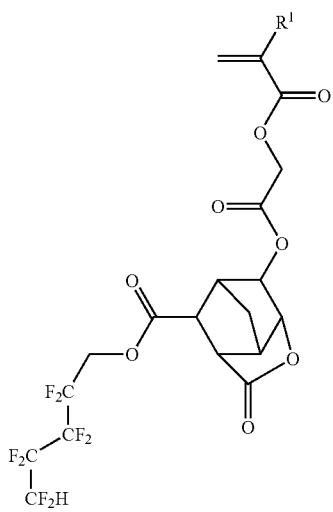
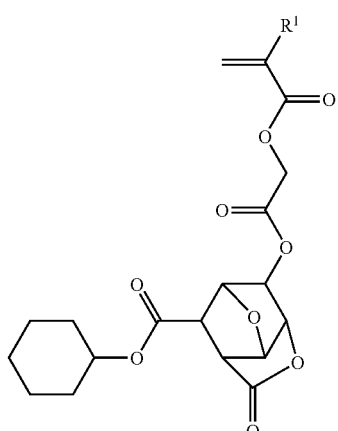
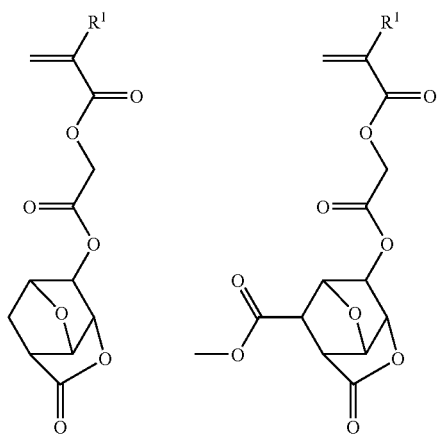
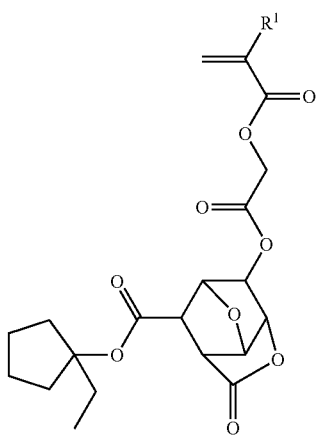
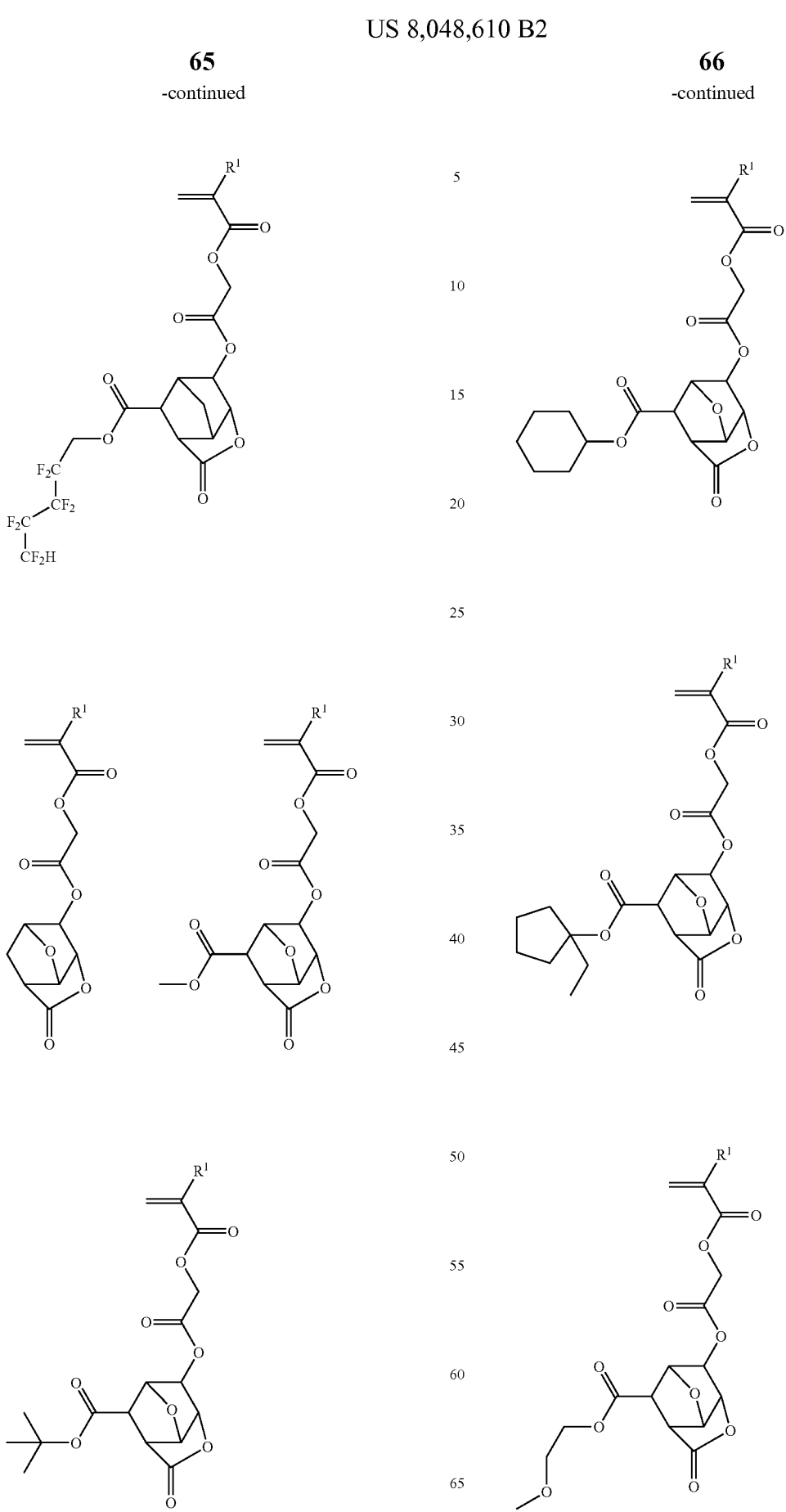
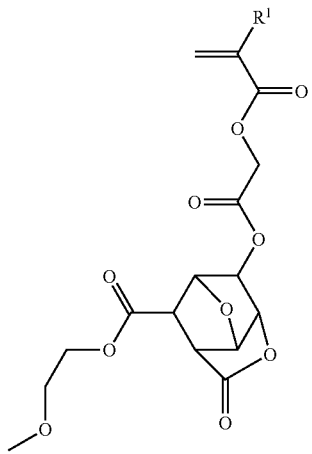

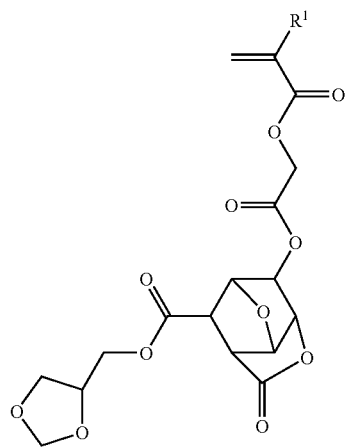
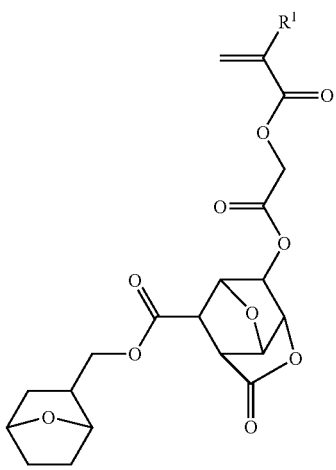
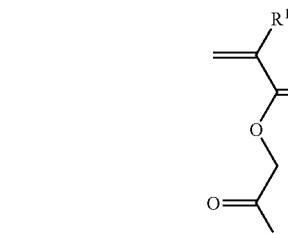

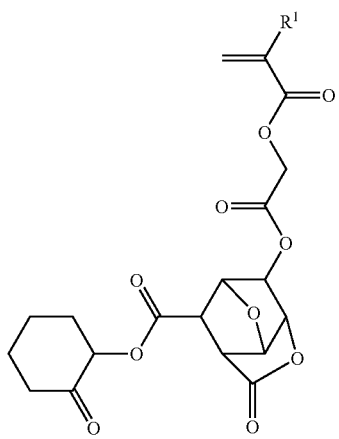

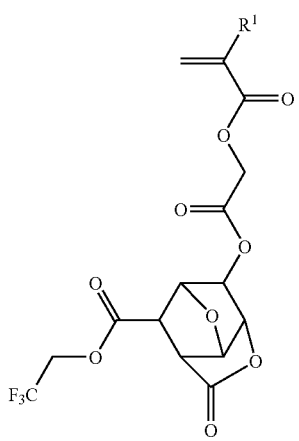

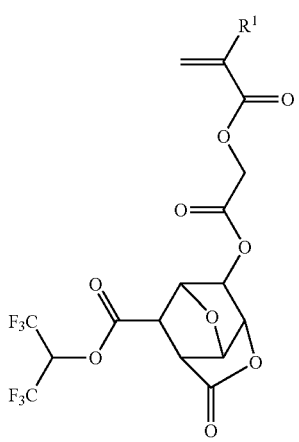

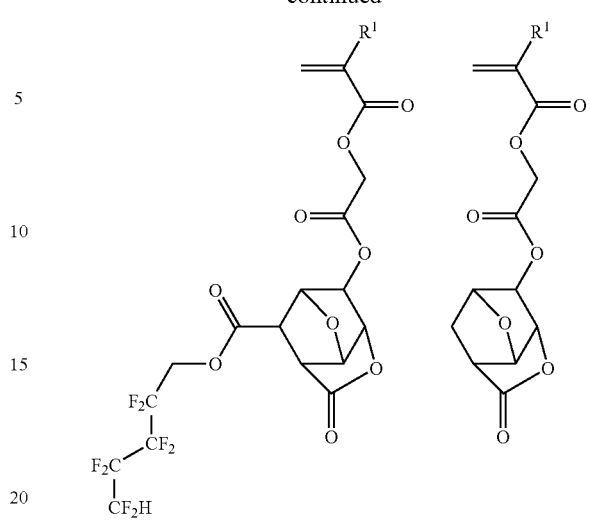

Herein R¹ is as defined above.

Of the monomers from which recurring units of formula (5L-1) are derived, those monomers wherein M=1 are described in JP-A 2008-031298. Those monomers wherein M=3 may be similarly synthesized aside from using chlorobutyric chloride instead of chloroacetyl chloride used as the reactant in the synthesis of the compounds wherein M=1.

Illustrative examples of the recurring units of formula (6) are given below.

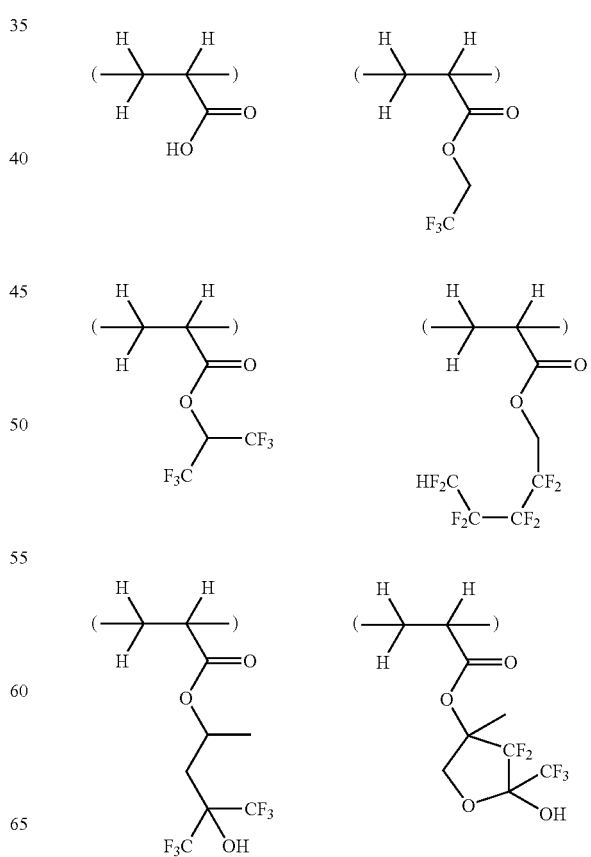

71
-continued
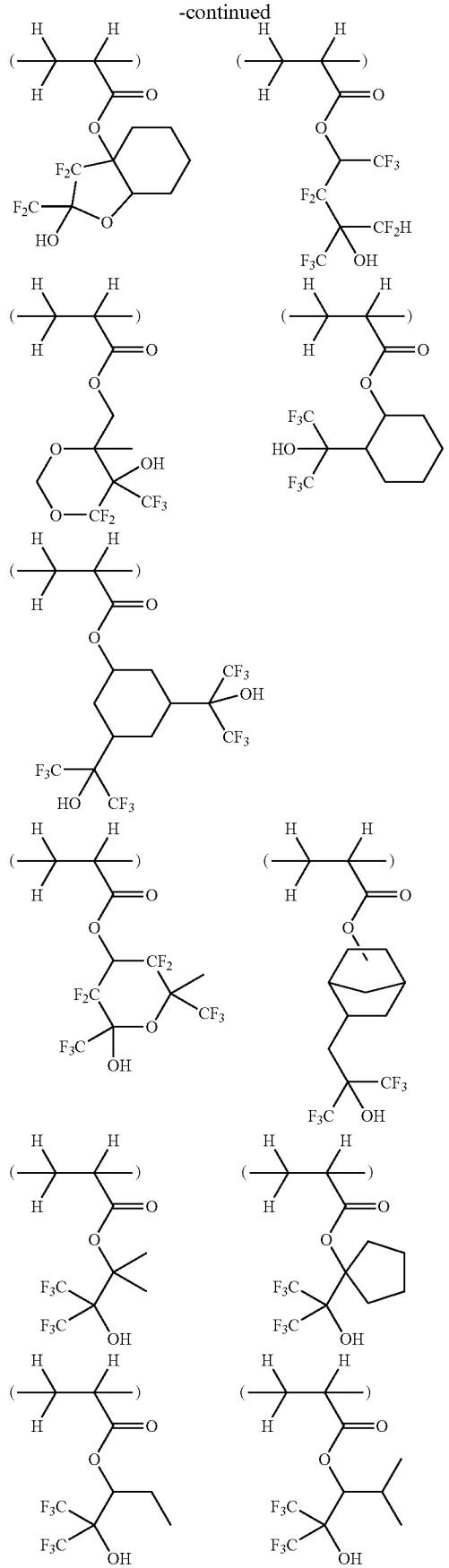
72
-continued
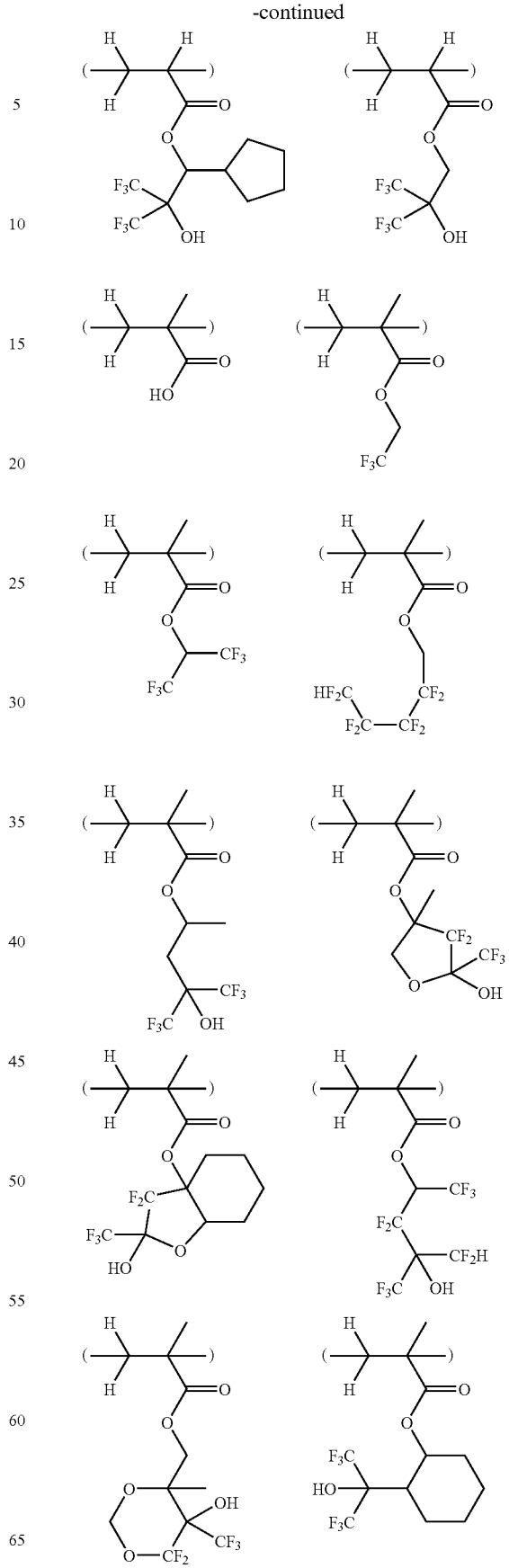

-continued

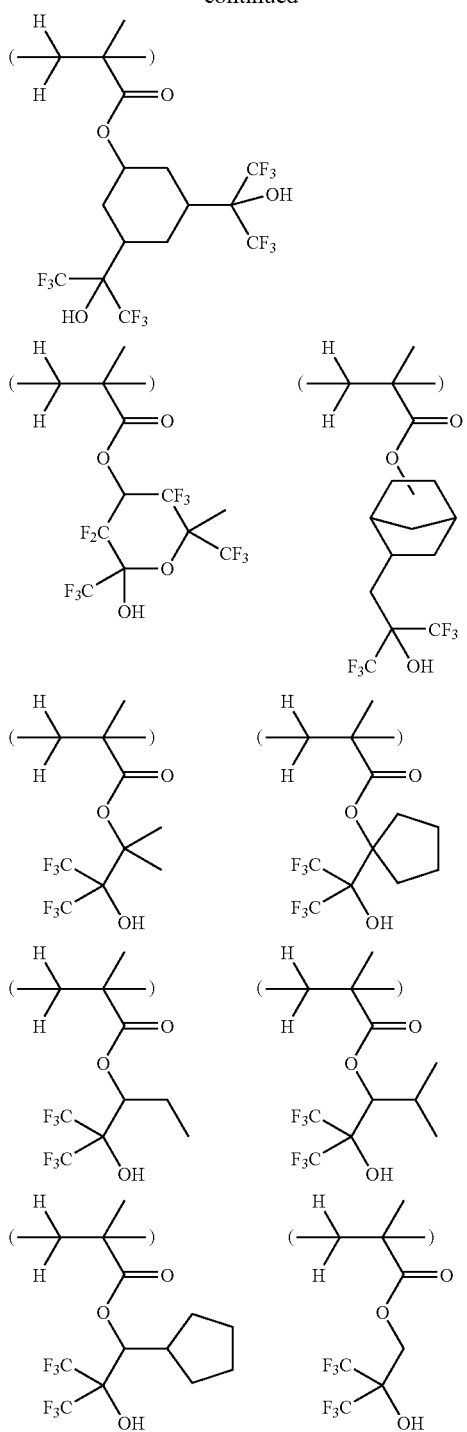

The polymer of the invention may further comprise recurring units derived from another monomer having a carbon-to-carbon double bond other than the foregoing. Examples of the additional monomer include substituted acrylates such as methyl methacrylate, methyl crotonate, dimethyl maleate, and dimethyl itaconate, unsaturated carboxylic acids such as maleic acid, fumaric acid and itaconic acid, cyclic olefins such as norbornene, norbornene derivatives, and tetracyclo [6.2.1.1$^{3,6}$.0$^{2,7}$]dodecene derivatives, unsaturated acid anhydrides such as itaconic anhydride, and other monomers.

The polymers of the invention are applicable not only to the ArF photolithography, but also to another lithography such as KrF, EB or EUV lithography.

In a still further embodiment, the polymer may further comprise recurring units of at least one type selected from the general formulae (7) to (10) and optionally, recurring units of at least one type selected from the general formulae (4) to (6).

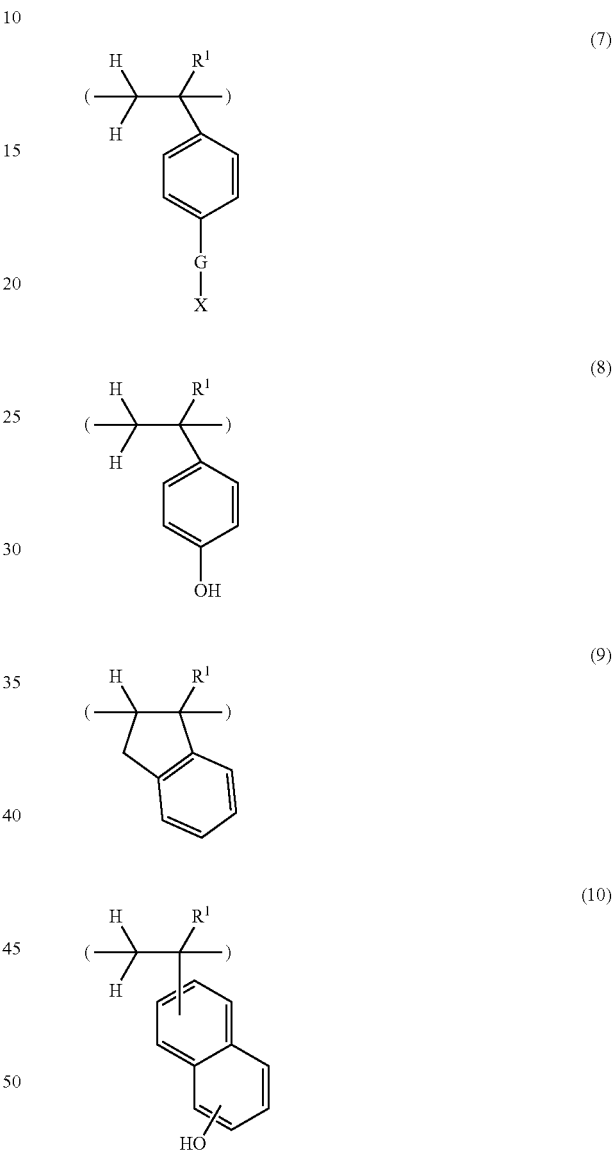

Herein $R^1$ and X are as defined above, and G is an oxygen atom or carbonyloxy group (—C(=O)O—).

Under the action of an acid, a polymer comprising recurring units of formula (7) is decomposed to generate a phenolic hydroxyl group and/or carboxylic acid whereby it becomes alkali soluble. The acid labile group X may be selected from a variety of such groups, for example, groups of formulae (L1) to (L4) and (L2-2), tertiary alkyl groups of to 20 carbon atoms, preferably 4 to 15 carbon atoms, trialkylsilyl groups in which each alkyl moiety has 1 to 6 carbon atoms, and oxoalkyl groups of 4 to 20 carbon atoms, as illustrated previously.

Illustrative non-limiting examples of the recurring units of formula (7) are given below.

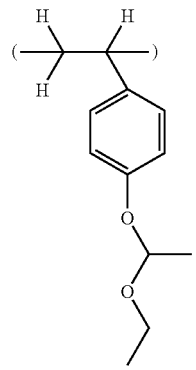
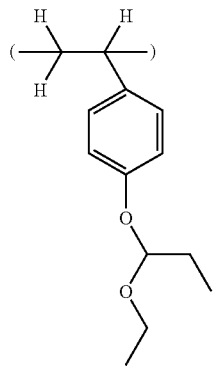
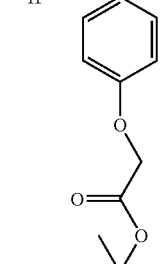
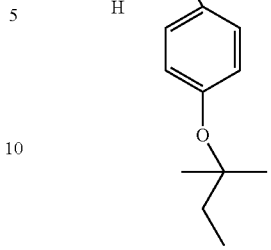

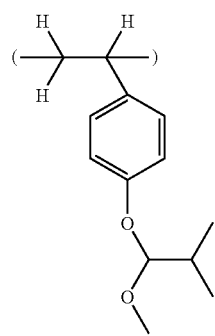
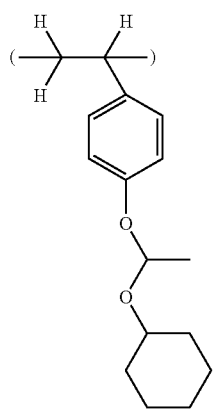
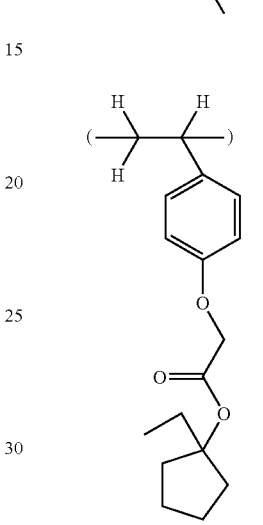

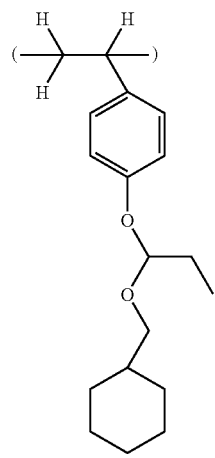
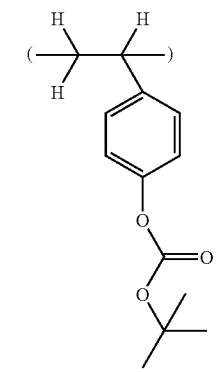
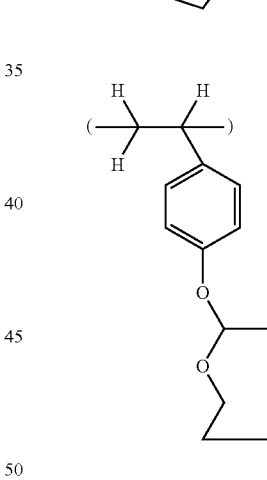

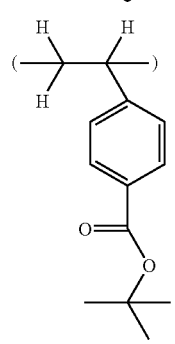
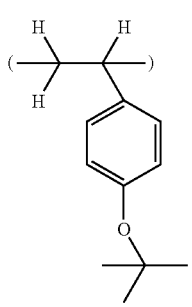

While hydroxyvinylnaphthalene of formula (10) may be substituted at arbitrary positions, typical substituted ones include 6-hydroxy-2-vinylnaphthalene and 4-hydroxy-1-vinylnaphthalene, with 6-hydroxy-2-vinylnaphthalene being preferred.

More preferred are those polymers comprising recurring units of any one type selected from formulae (7) to (10) and recurring units of formula (4) selected from among the recurring units of formulae (4) to (6).

The polymer of the invention comprising recurring units having a sulfonium salt with a polymerizable anion and recurring units of any one or more type selected from formulae (7) to (10) may further comprise recurring units derived from another monomer having a carbon-to-carbon double bond other than the foregoing. Examples of the additional monomer include substituted acrylates such as methyl methacrylate, methyl crotonate, dimethyl maleate, and dimethyl itaconate, unsaturated carboxylic acids such as maleic acid, fumaric acid and itaconic acid, cyclic olefins such as norbornene, norbornene derivatives, tetracyclo[$6.2.1.1^{3,6}.0^{2,7}$] dodecene derivatives, and norbornadiens, unsaturated acid anhydrides such as itaconic anhydride, styrene, acenaphthylene, vinylnaphthalene, and other monomers.

The polymers have a weight average molecular weight (Mw) of 1,000 to 500,000, and preferably 3,000 to 100,000. Outside the range, a polymer may suffer an extreme drop of etching resistance or a reduced resolution due to a failure to provide a difference in dissolution rate before and after exposure. The measurement of molecular weight may be performed by gel permeation chromatography (GPC) versus polystyrene standards or a light scattering method.

In the inventive polymer, the preferred proportion of respective recurring units derived from discrete monomers may fall, for example, in the range (mol %) shown below, but is not limited thereto. The polymer may consist essentially of:

(I) from more than 0 mol % to 50 mol %, preferably 1 to 30 mol %, and more preferably 5 to 20 mol % of constituent units of one or more type having formula (1);

(II) from more than 0 mol % to 80 mol %, preferably 10 to 50 mol %, and more preferably 20 to 40 mol % of constituent units of one or more type having formula (2);

(III) from more than 0 mol % to 80 mol %, preferably 10 to 50 mol %, and more preferably 20 to 40 mol % of constituent units of one or more type having formula (3); and optionally (IV) from 0 mol % to 80 mol %, preferably 0 to 70 mol %, and more preferably 0 to 50 mol % of constituent units of one or more type having formulae (4) to (6) and/or formulae (7) to (10) (if incorporated, more than 0 mol %, and preferably at least 1 mol %); and optionally, (V) from 0 mol % to 50 mol %, preferably 0 to 40 mol %, and more preferably 0 to 30 mol % of constituent units of one or more type derived from the additional monomer(s).

The polymer may be prepared through copolymerization reaction using the compound from which recurring units of formula (1) are derived as a first monomer and one or more compounds having a polymerizable double bond as second and subsequent monomers. Various modes of copolymerization reaction may be used for the preparation of the inventive polymer. The preferred modes are radical polymerization, anionic polymerization and coordination polymerization.

For radical polymerization, preferred reaction conditions include (a) a solvent selected from hydrocarbon solvents such as benzene, ether solvents such as tetrahydrofuran, alcohol solvents such as ethanol, and ketones such as methyl isobutyl ketone; (b) a polymerization initiator selected from azo compounds such as 2,2'-azobisisobutyronitrile and peroxides such as benzoyl peroxide and lauroyl peroxide; (c) a reaction temperature in the range of about 0° C. to about 100° C.; and (d) a reaction time in the range of about 0.5 to about 48 hours. Reaction parameters outside these ranges need not be excluded.

For anionic polymerization, preferred reaction conditions include (a) a solvent selected from among hydrocarbons such as benzene, ethers such as tetrahydrofuran, and liquid ammonia, (b) a polymerization initiator selected from metals such as sodium and potassium, alkyl metals such as n-butyllithium and sec-butyllithium, ketyl, and Grignard reagents, (c) a temperature of about −78° C. to about 0° C., (d) a time of about 0.5 to about 48 hours, and (e) a stopper selected from among proton-donative compounds such as methanol, halides such as methyl iodide, and electrophilic compounds. Reaction conditions outside the described range may be employed if desired.

For coordination polymerization, preferred reaction conditions include (a) a solvent selected from among hydrocarbons such as n-heptane and toluene, (b) a catalyst selected from Ziegler-Natta catalysts comprising a transition metal (e.g., titanium) and alkylaluminum, Phillips catalysts of metal oxides having chromium or nickel compounds carried thereon, and olefin-metathesis mixed catalysts as typified by tungsten and rhenium mixed catalysts, (c) a temperature of about 0° C. to about 100° C., and (d) a time of about 0.5 hour to about 48 hours. Reaction conditions outside the described range may be employed if desired.

Once a polymer is prepared by any of the above-described procedures, it may be modified by deprotecting some or all acid labile groups and then introducing different acid labile groups so that acid labile groups different from the acid labile groups initially introduced during polymerization are introduced into the polymer. For example, once a polymer is formed through radical polymerization of 4-ethoxyethoxystyrene and a sulfonium salt with a polymerizable anion as represented by formula (1), the polymer may be modified by eliminating ethoxyethoxy groups from the polymer using acetic acid, pyridinium tosylate or the like, and reacting with di-tert-butyl dicarbonate, tert-butyl chloroacetate, vinyl ether or the like. Then acid labile groups different from the acid labile groups (ethoxyethoxy) initially introduced during polymerization are introduced into the polymer.

Resist Composition

The polymer of the invention is advantageously used as a base resin in a resist composition, and specifically a chemically amplified positive resist composition. Thus a third embodiment of the invention is a positive resist composition comprising the polymer. The positive resist composition preferably comprises:

(A) a base resin comprising the inventive polymer,
(C) an organic solvent, and optionally,
(B) an acid generator,
(D) a quencher, and
(E) a surfactant.

For the positive resist composition, the base resin as component (A) may comprise another resin having a dissolution rate in an alkaline developer that increases under the action of an acid, if desired, as well as the inventive polymer. Exemplary other resins include, but are not limited to, (i) poly(meth)acrylic acid derivatives, (ii) norbornene derivative/maleic anhydride copolymers, (iii) hydrogenated products of ring-opening metathesis polymerization (ROMP) polymers, (iv) vinyl ether/maleic anhydride/(meth)acrylic acid derivative copolymers, and (v) polyhydroxystyrene derivatives.

Of these, the poly(meth)acrylic acid derivatives (i) are polymers comprising units of formulae (4) to (6) and other units in combination. The polyhydroxystyrene derivatives (v) include polymers comprising units of formulae (7) to (10) in combination and polymers comprising units of formulae (4) to (10) in combination. In these polymers, a proportion of those units having an acid labile group, for example, monomeric units of one or more types selected from among formulae (4) and/or (7) and a combination thereof is from more than 0 mole % to 80 mole %, preferably 1 to 50 mole %, and more preferably 10 to 40 mole %.

The hydrogenated ROMP polymers (iii) are synthesized by the method illustrated in Examples of JP-A 2003-66612. Illustrative examples of such hydrogenated polymers include those polymers having the recurring units shown below, but are not limited thereto.

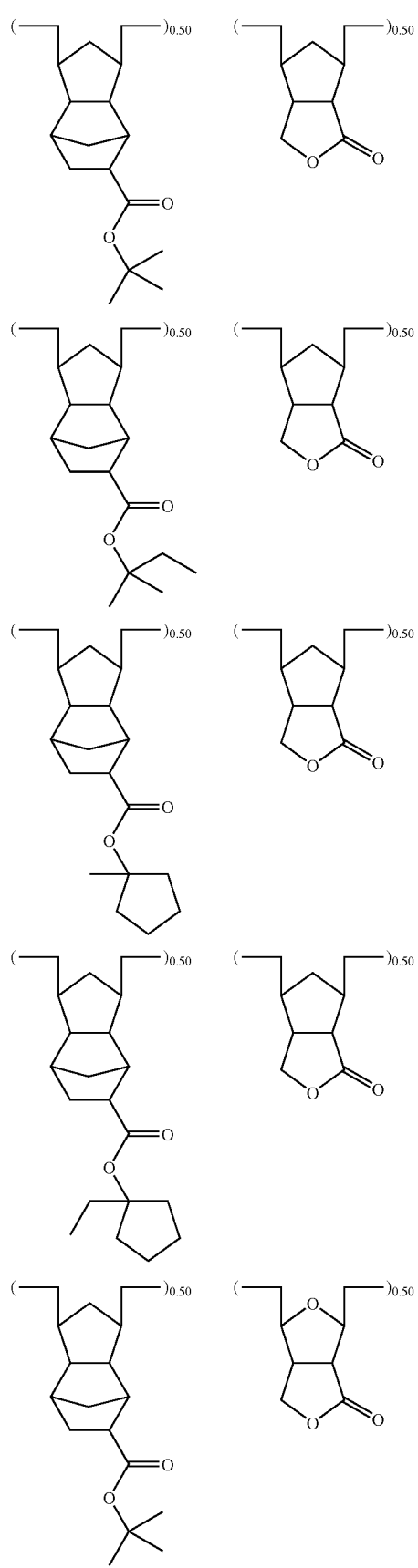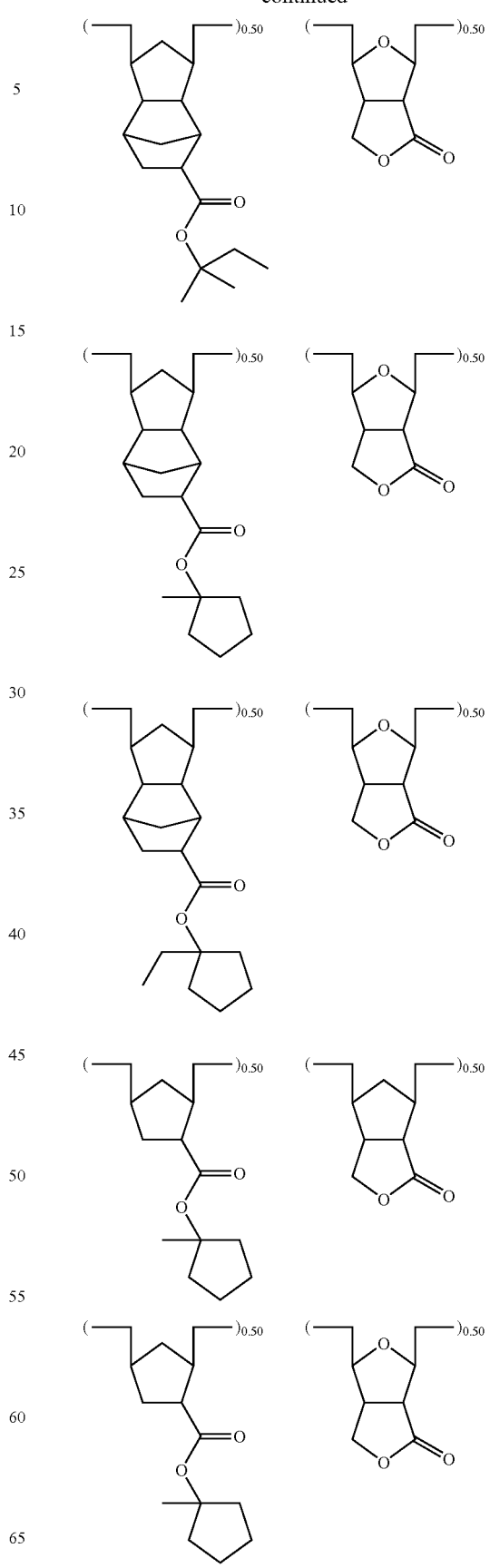

81
-continued
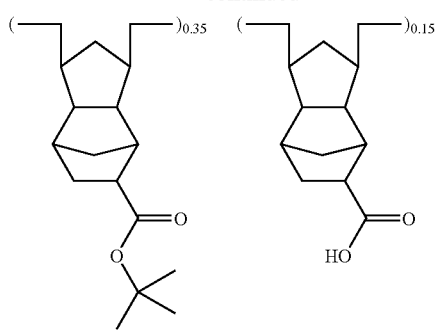
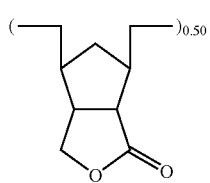
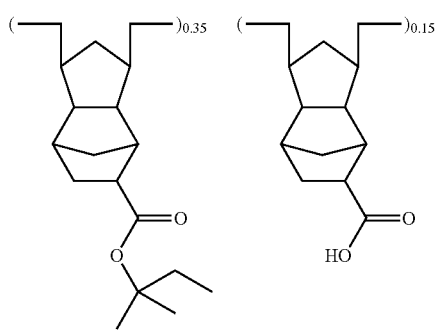
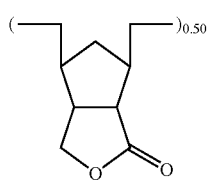
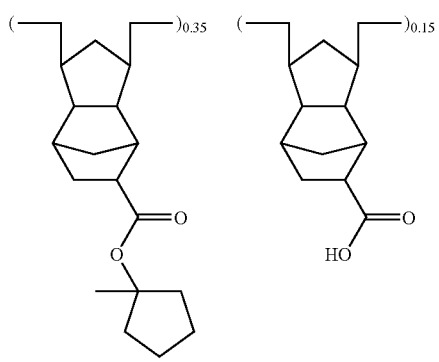
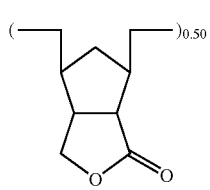
82
-continued
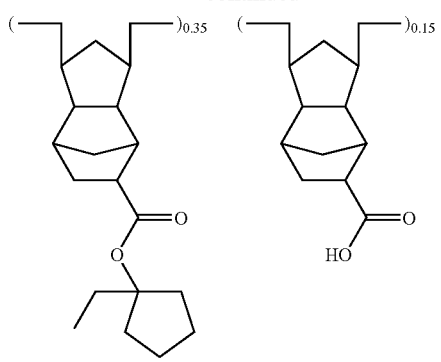
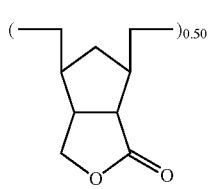
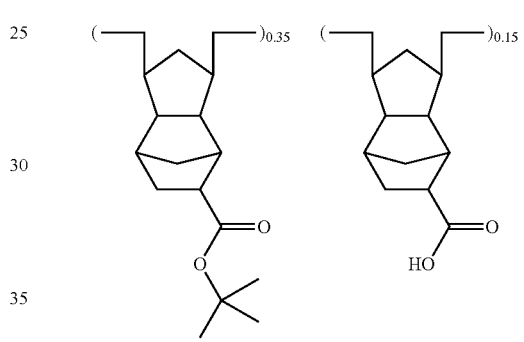
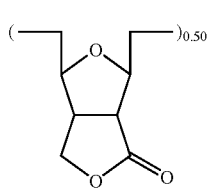
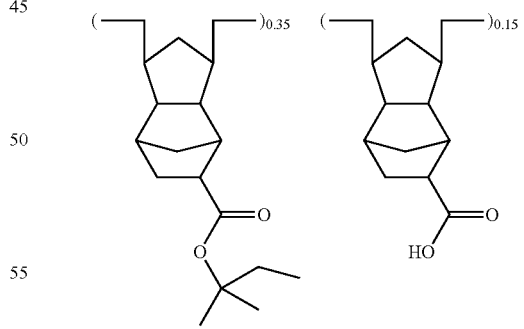
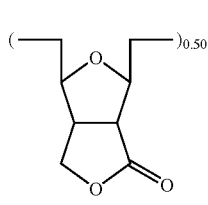

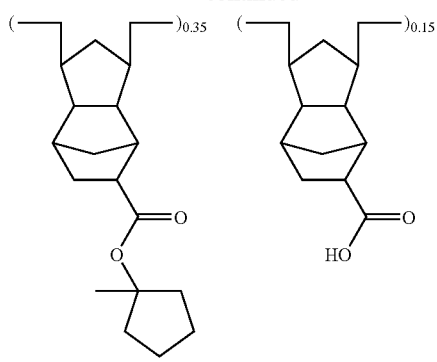
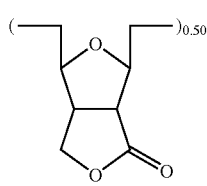
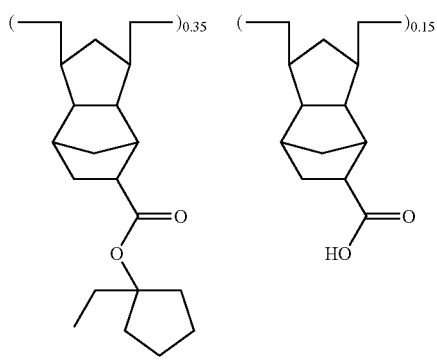
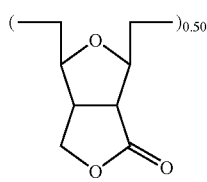
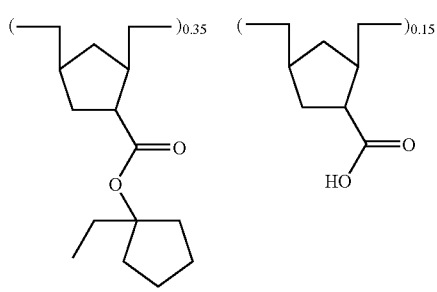
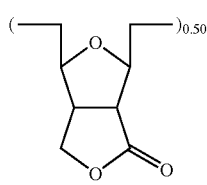

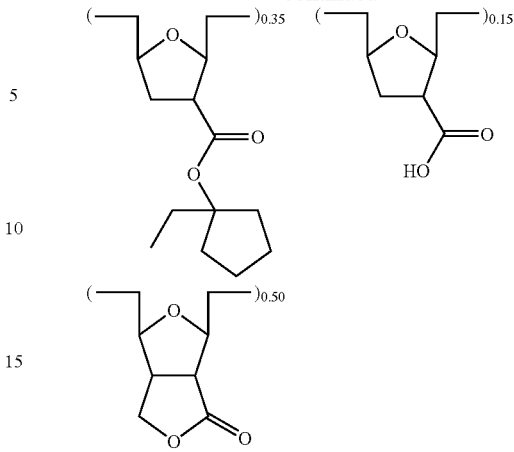

The inventive polymer and the other polymer are preferably blended in a weight ratio from 100:0 to 10:90, more preferably from 100:0 to 20:80. If the blend ratio of the inventive polymer is below this range, the resist composition would become poor in some of the desired properties. The performance of the resist composition can be adjusted by properly changing the blend ratio of the inventive polymer. The polymer is not limited to one type and a mixture of two or more polymers may be added. The use of plural polymers allows for easy adjustment of resist properties.

Acid Generator

In the practice of the invention, an acid generator is optionally used as component (B). Where a photoacid generator is added as the acid generator, it may be any compound capable of generating an acid upon exposure to high-energy radiation. Suitable photoacid generators include sulfonium salts, iodonium salts, sulfonyldiazomethane, N-sulfonyloxyimide, and oxime-O-sulfonate acid generators. Exemplary acid generators are given below while they may be used alone or in admixture of two or more.

Sulfonium salts are salts of sulfonium cations with sulfonates, bis(substituted alkylsulfonyl)imides and tris(substituted alkylsulfonyl)methides. Exemplary sulfonium cations include triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl)diphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 4-methylphenyldiphenylsulfonium, 4-tert-butylphenyldiphenylsulfonium, bis(4-methylphenyl)phenylsulfonium, bis(4-tert-butylphenyl)phenylsulfonium, tris(4-methylphenyl)sulfonium, tris(4-tert-butylphenyl)sulfonium, tris(phenylmethyl)sulfonium, 2-naphthyldiphenylsulfonium, dimethyl(2-naphthyl)sulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, tribenzylsulfonium, diphenylmethylsulfonium, dimethylphenylsulfonium, 2-oxopropylthiacyclopentanium, 2-oxobutylthiacyclopentanium, 2-oxo-3,3-dimethylbutylthiacyclopentanium, 2-oxo-2-phenylethylthiacyclopentanium, 4-n-butoxynaphthyl-1-thiacyclopentanium, and 2-n-butoxynaphthyl-1-thiacyclopentanium.

Exemplary sulfonates include trifluoromethanesulfonate, pentafluoroethanesulfonate, heptafluoropropanesulfonate, nonafluorobutanesulfonate, tridecafluorohexanesulfonate, perfluoro(4-ethylcyclohexane)sulfonate, heptadecafluorooctanesulfonate, 2,2,2-trifluoroethanesulfonate, pentafluorobenzenesulfonate, 4-(trifluoromethyl)benzenesulfonate, 4-fluorobenzenesulfonate, mesitylenesulfonate, 2,4,6-triisopropylbenzenesulfonate, toluenesulfonate, benzenesulfonate, 4-(p-toluenesulfonyloxy)benzenesulfonate, 6-(p-toluenesulfonyloxy)naphthalene-2-sulfonate, 4-(p-toluenesulfonyloxy)naphthalene-1-sulfonate, 5-(p-toluenesulfonyloxy)naphthalene-1-sulfonate, 8-(p-toluenesulfonyloxy)naphthalene-1-sulfonate, naphthalenesulfonate, camphorsulfonate, octanesulfonate, dodecylbenzenesulfonate, butanesulfonate, methanesulfonate, 1,1-difluoro-2-naphthyl-ethanesulfonate, 1,1,2,2-tetrafluoro-2-(norbornan-2-yl)ethanesulfonate, 1,1,2,2-tetrafluoro-2-(tetracyclo[6.2.1.1$^{3,6}$.0$^{2,7}$]dodec-3-en-8-yl)ethanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropane-sulfonate, 2-(1-adamantanecarbonyloxy)-1,1,3,3,3-pentafluoropropane-sulfonate, 2-acetyloxy-1,1,3,3,3-pentafluoropropane-sulfonate, 1,1,3,3,3-pentafluoro-2-hydroxypropane-sulfonate, 1,1,3,3,3-pentafluoro-2-tosyloxypropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethane-sulfonate, methoxycarbonyldifluoromethanesulfonate, 1-(hexahydro-2-oxo-3,5-methano-2H-cyclopenta[b]furan-6-yloxy-carbonyl)difluoromethanesulfonate, and 4-oxo-1-adamantyloxycarbonyldifluoromethanesulfonate.

Exemplary bis(substituted alkylsulfonyl)imides include bis(trifluoromethylsulfonyl)imide, bis(pentafluoroethylsulfonyl)imide, bis(heptafluoropropylsulfonyl)imide, and perfluoro(1,3-propylenebissulfonyl)imide.

A typical tris(substituted alkylsulfonyl)methide is tris(trifluoromethylsulfonyl)methide. Sulfonium salts based on combination of the foregoing examples are included.

Iodonium salts are salts of iodonium cations with sulfonates, bis(substituted alkylsulfonyl)imides and tris (substituted alkylsulfonyl)methides. Exemplary iodonium cations include diphenyliodinium, bis(4-tert-butylphenyl)iodonium, 4-tert-butoxyphenylphenyliodonium, and 4-methoxyphenylphenyliodonium. Exemplary sulfonates include trifluoromethanesulfonate, pentafluoroethanesulfonate, heptafluoropropanesulfonate, nonafluorobutanesulfonate, tridecafluorohexanesulfonate, perfluoro(4-ethylcyclohexane)sulfonate, heptadecafluorooctanesulfonate, 2,2,2-trifluoroethanesulfonate, pentafluorobenzenesulfonate, 4-(trifluoromethyl)benzenesulfonate, 4-fluorobenzenesulfonate, mesitylenesulfonate, 2,4,6-triisopropylbenzenesulfonate, toluenesulfonate, benzenesulfonate, 4-(p-toluenesulfonyloxy)benzenesulfonate, 6-(p-toluenesulfonyloxy)naphthalene-2-sulfonate, 4-(p-toluenesulfonyloxy)naphthalene-1-sulfonate, 5-(p-toluenesulfonyloxy)naphthalene-1-sulfonate, 8-(p-toluenesulfonyloxy)naphthalene-1-sulfonate, naphthalenesulfonate, camphorsulfonate, octanesulfonate, dodecylbenzenesulfonate, butanesulfonate, methanesulfonate, 1,1-difluoro-2-naphthyl-ethanesulfonate, 1,1,2,2-tetrafluoro-2-(norbornan-2-yl)ethanesulfonate, 1,1,2,2-tetrafluoro-2-(tetracyclo[6.2.1.1$^{3,6}$.0$^{2,7}$]dodec-3-en-8-yl)ethanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropane-sulfonate, 1,1,3,3,3-pentafluoro-2-furoyloxypropane-sulfonate, 2-naphthoyloxy-1,1,3,3,3-pentafluoropropanesulfonate, 2-(4-tert-butylbenzoyloxy)-1,1,3,3,3-pentafluoropropane-sulfonate, 2-(1-adamantanecarbonyloxy)-1,1,3,3,3-pentafluoropropane-sulfonate, 2-acetyloxy-1,1,3,3,3-pentafluoropropane-sulfonate, 1,1,3,3,3-pentafluoro-2-hydroxypropane-sulfonate, 1,1,3,3,3-pentafluoro-2-tosyloxypropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethane-sulfonate, methoxycarbonyldifluoromethanesulfonate, 1-(hexahydro-2-oxo-3,5-methano-2H-cyclopenta[b]furan-6-yloxy-carbonyl)difluoromethanesulfonate, and 4-oxo-1-adamantyloxycarbonyldifluoromethanesulfonate.

Exemplary bis(substituted alkylsulfonyl)imides include bis(trifluoromethylsulfonyl)imide, bis(pentafluoroethylsulfonyl)imide, bis(heptafluoropropylsulfonyl)imide, and perfluoro(1,3-propylenebissulfonyl)imide.

A typical tris(substituted alkylsulfonyl)methide is tris(trifluoromethylsulfonyl)methide. Iodonium salts based on combination of the foregoing examples are included.

N-sulfonyloxydicarboxylmide photoacid generators include combinations of imide skeletons with sulfonates. Exemplary imide skeletons are succinimide, naphthalenedicarboxylmide, phthalimide, cyclohexyldicarboxylmide, 5-norbornene-2,3-dicarboxylmide, and 7-oxabicyclo[2.2.1]-5-heptene-2,3-dicarboxylmide. Exemplary sulfonates include trifluoromethanesulfonate, pentafluoroethanesulfonate, heptafluoropropanesulfonate, nonafluorobutanesulfonate, tridecafluorohexanesulfonate, perfluoro(4-ethylcyclohexane)sulfonate, heptadecafluorooctanesulfonate, 2,2,2-trifluoroethanesulfonate, pentafluorobenzenesulfonate, 4-(trifluoromethyl)benzenesulfonate, 4-fluorobenzenesulfonate, mesitylenesulfonate, 2,4,6-triisopropylbenzenesulfonate, toluenesulfonate, benzenesulfonate, 4-(p-toluenesulfonyloxy)benzenesulfonate, 6-(p-toluenesulfonyloxy)naphthalene-2-sulfonate, 4-(p-toluenesulfonyloxy)naphthalene-1-sulfonate, 5-(p-toluenesulfonyloxy)naphthalene-1-sulfonate, 8-(p-toluenesulfonyloxy)naphthalene-1-sulfonate, naphthalenesulfonate, camphorsulfonate, octanesulfonate, dodecylbenzenesulfonate, butanesulfonate, methanesulfonate, 1,1-difluoro-2-naphthyl-ethanesulfonate, 1,1,2,2-tetrafluoro-2-(norbornan-2-yl)ethanesulfonate, 1,1,2,2-tetrafluoro-2-(tetracyclo[6.2.1.1$^{3,6}$.0$^{2,7}$]dodec-3-en-8-yl)ethanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropane-sulfonate, 1,1,3,3,3-pentafluoro-2-furoyloxypropane-sulfonate, 2-naphthoyloxy-1,1,3,3,3-pentafluoropropanesulfonate, 2-(4-tert-butylbenzoyloxy)-1,1,3,3,3-pentafluoropropane-sulfonate, 2-(1-adamantanecarbonyloxy)-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethane-sulfonate, methoxycarbonyldifluoromethanesulfonate, 1-(hexahydro-2-oxo-3,5-methano-2H-cyclopenta[b]furan-6-yloxy-carbonyl) difluoromethanesulfonate, and 4-oxo-1-adamantyloxycarbonyldifluoromethanesulfonate.

Also useful are photoacid generators in the form of O-arylsulfonyloxime or O-alkylsulfonyloxime compounds (oxime sulfonates) which include oxime sulfonates having an electron withdrawing group such as trifluoromethyl incorporated for increased stability, as represented by the following formula (Ox-1).

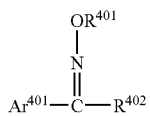

(Ox-1)

Herein $R^{401}$ is a substituted or unsubstituted $C_1$-$C_{10}$ haloalkylsulfonyl or halobenzenesulfonyl group, $R^{402}$ is a $C_1$-$C_{11}$ haloalkyl group, and $Ar^{401}$ is a substituted or unsubstituted aromatic or hetero-aromatic group.

Examples include 2-[2,2,3,3,4,4,5,5-octafluoro-1-(nonafluorobutylsulfonyloxy-imino)pentyl]fluorene, 2-[2,2,3,3,4,4-pentafluoro-1-(nonafluorobutylsulfonyloxy-imino)butyl]fluorene, 2-[2,2,3,3,4,4,5,5,6,6-decafluoro-1-(nonafluorobutylsulfonyl-oxyimino)hexyl]fluorene, 2-[2,2,3,3,4,4,5,5-octafluoro-1-(nonafluorobutylsulfonyloxy-imino)pentyl]-4-biphenyl, 2-[2,2,3,3,4,4-pentafluoro-1-(nonafluorobutylsulfonyloxy-imino)butyl]-4-biphenyl, and 2-[2,2,3,3,4,4,5,5,6,6-decafluoro-1-(nonafluorobutylsulfonyl-oxyimino)hexyl]-4-biphenyl. Also included are modified forms of the foregoing compounds having substituted on their skeleton 2-benzoyloxy-1,1,3,3,3-pentafluoropropanesulfonate, 1,1,3,3,3-pentafluoro-2-(4-phenylbenzoyloxy) propanesulfonate, 1,1,3,3,3-pentafluoro-2-pivaloyloxypropanesulfonate, 2-cyclohexanecarbonyloxy-1,1,3,3,3-pentafluoropropane-sulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropane-sulfonate, 2-(1-adamantanecarbonyloxy)-1,1,3,3,3-pentafluoropropane-sulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethane-sulfonate, methoxycarbonyldifluoromethanesulfonate, 1-(hexahydro-2-oxo-3,5-methano-2H-cyclopenta[b]furan-6-yloxy-carbonyl) difluoromethanesulfonate, and 4-oxo-1-adamantyloxycarbonyldifluoromethanesulfonate.

Preferred among others are those acid generators having the general formula (PAG-1).

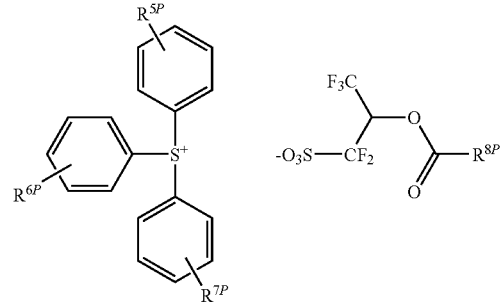

(PAG-1)

Herein $R^{5P}$, $R^{6P}$ and $R^{7P}$ are each independently hydrogen or a monovalent, straight, branched or cyclic $C_1$-$C_{20}$ hydrocarbon group which may contain a heteroatom. Examples of the hydrocarbon group which may contain a heteroatom include methyl, ethyl, propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, adamantyl, ethyladamantyl, butyladamantyl, and modified forms of the foregoing in which any carbon-carbon bond is interrupted by a heteroatom group such as —O—, —S—, —SO—, —SO$_2$—, —NH—, —C(=O)—, —C(=O)O—, or —C(=O)NH—, or any hydrogen atom is replaced by a functional group such as —OH, —NH$_2$, —CHO, or —CO$_2$H. $R^{8P}$ is a monovalent, straight, branched or cyclic $C_7$-$C_3$, hydrocarbon group which may contain a heteroatom, examples of which are illustrated below, but not limited thereto.

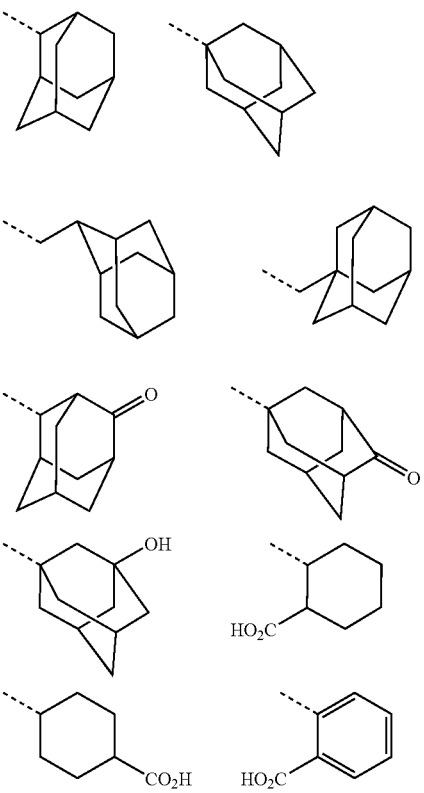

-continued
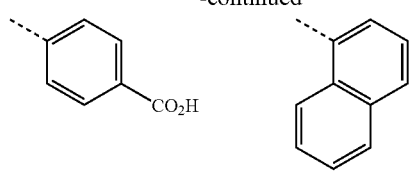
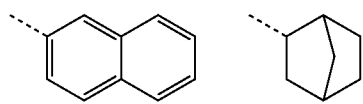
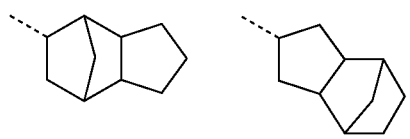
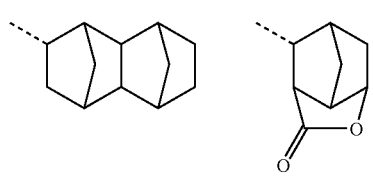
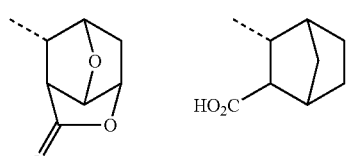
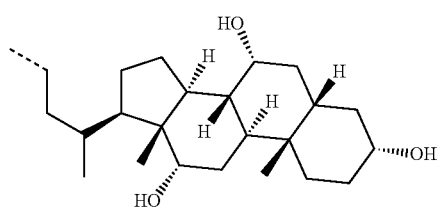
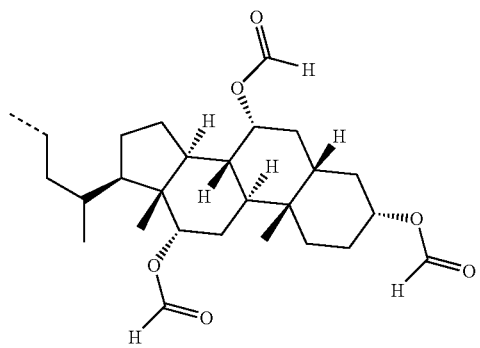
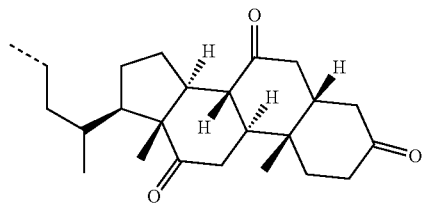
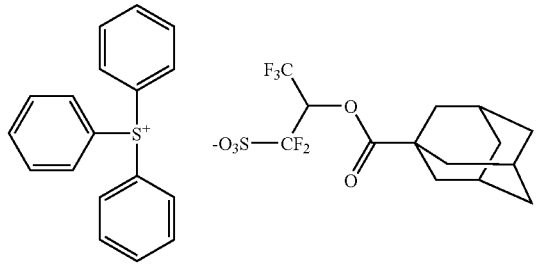
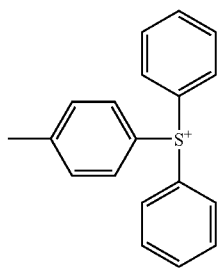
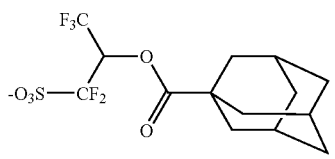
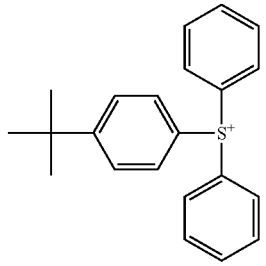
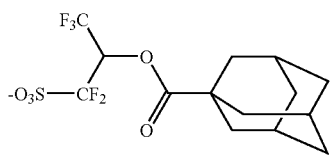
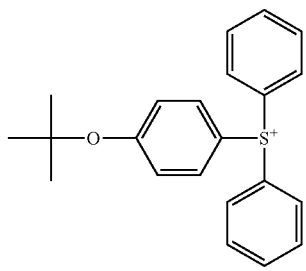
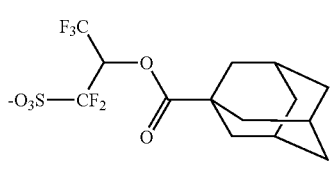
Illustrative examples of the acid generators having formula (PAG-1) are given below.

-continued
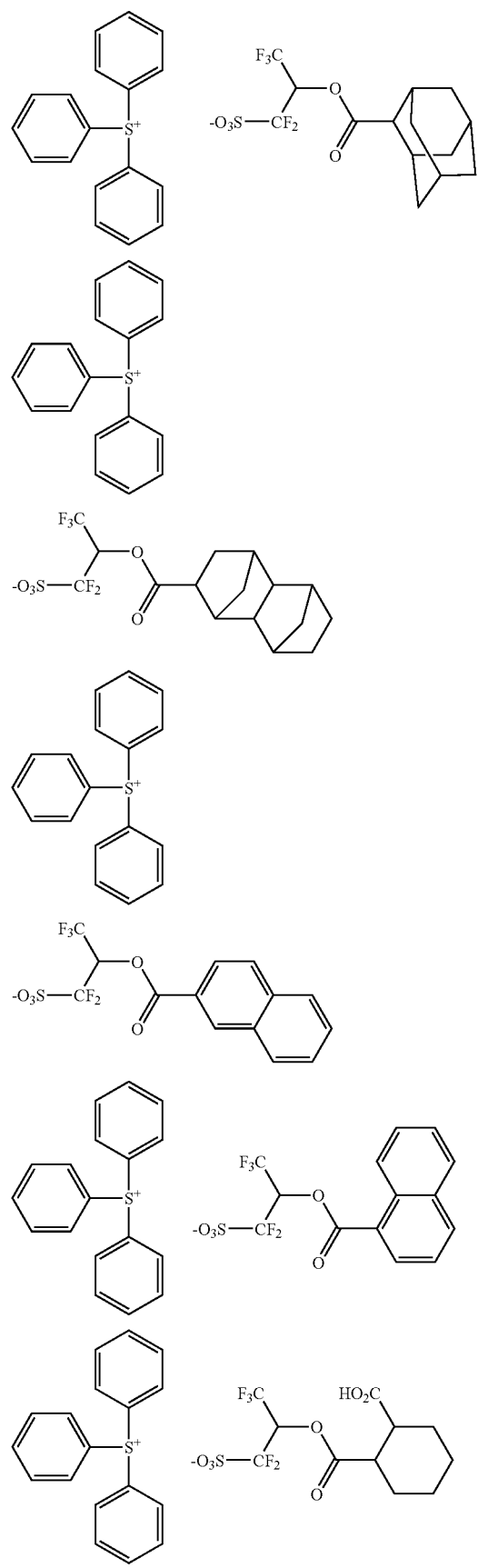
-continued
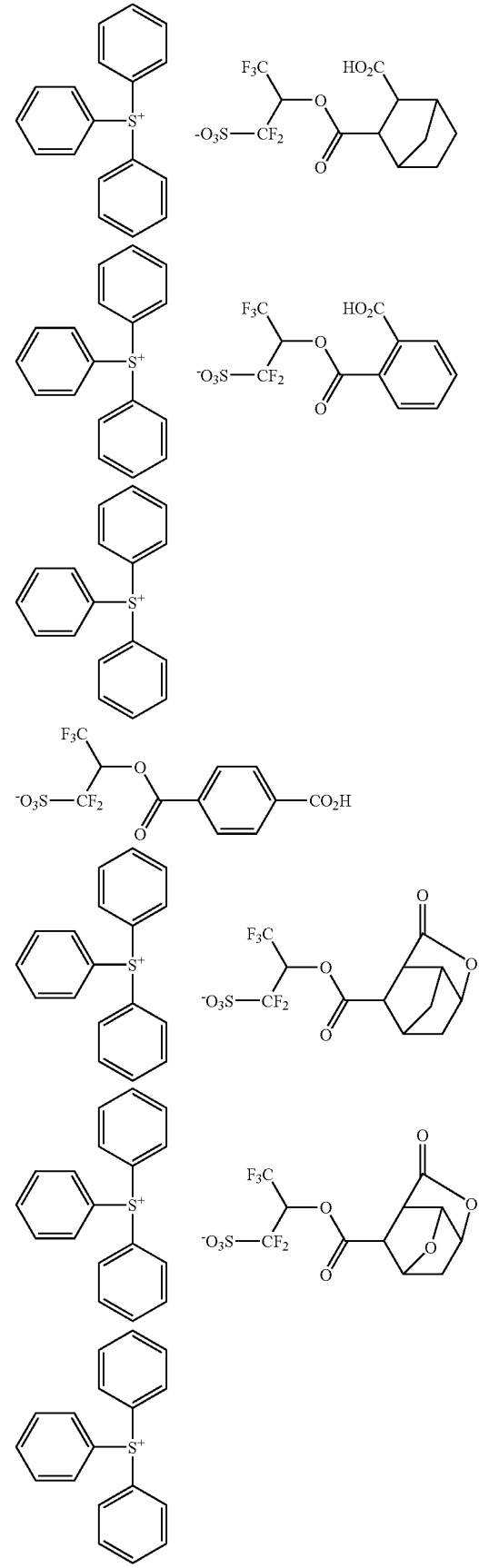

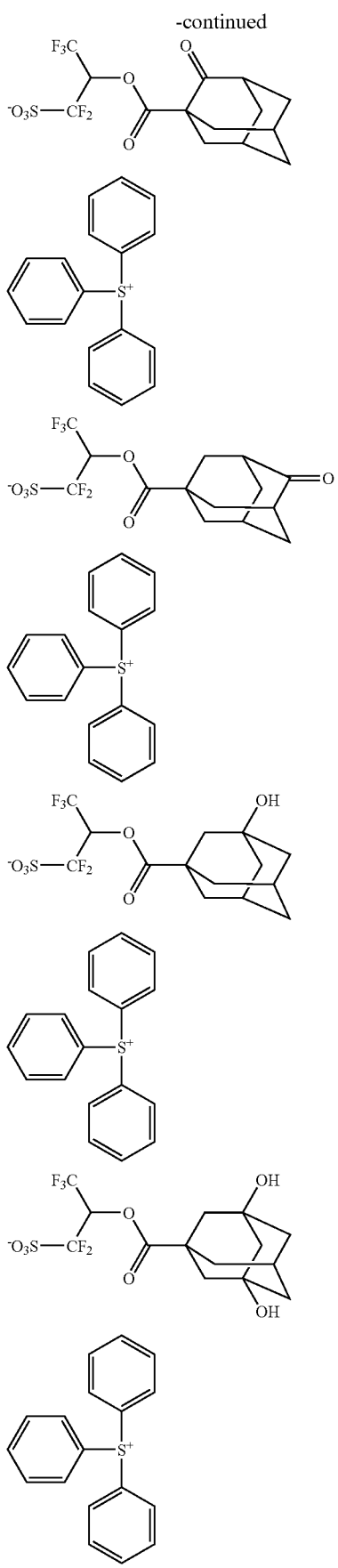

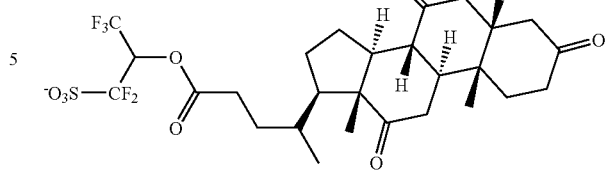

In the chemically amplified resist composition, the photoacid generator (B) may be added in any desired amount as long as the objects of the invention are not compromised. An appropriate amount of the photoacid generator (B) is 0.1 to 10 parts, and more preferably 0.1 to 5 parts by weight per 100 parts by weight of the base resin in the composition. Too high a proportion of the photoacid generator (B) may give rise to problems of degraded resolution and foreign matter upon development and resist film peeling. The photoacid generators may be used alone or in admixture of two or more. The transmittance of the resist film can be controlled by using an photoacid generator having a low transmittance at the exposure wavelength and adjusting the amount of the photoacid generator added.

It is noted that an acid diffusion controlling function may be provided when the photoacid generator is an onium salt capable of generating a weak acid. Specifically, in a system using the inventive polymer capable of generating a strong acid in combination with an onium salt capable of generating a weak acid (e.g., non-fluorinated sulfonic acid or carboxylic acid), if the strong acid generated from the inventive polymer upon exposure to high-energy radiation collides with the unreacted onium salt having a weak acid anion, then a salt exchange occurs whereby the weak acid is released and an onium salt having a strong acid anion is formed. In this course, the strong acid is exchanged into the weak acid having a low catalysis, incurring apparent deactivation of the acid for enabling to control acid diffusion.

If an onium salt capable of generating a strong acid and an onium salt capable of generating a weak acid are used in admixture, an exchange from the strong acid to the weak acid as above can take place, but it never happens that the weak acid collides with the unreacted onium salt capable of generating a strong acid to induce a salt exchange. This is because of a likelihood of an onium cation forming an ion pair with a stronger acid anion.

In the resist composition of the invention, there may be added a compound which is decomposed with an acid to generate another acid, that is, acid amplifier compound. For these compounds, reference should be made to J. Photopolym. Sci. and Tech., 8, 43-44, 45-46 (1995), and ibid., 9, 29-30 (1996). Examples of the acid amplifier compound include tert-butyl-2-methyl-2-tosyloxymethyl acetoacetate and 2-phenyl-2-(2-tosyloxyethyl)-1,3-dioxolane, but are not limited thereto. Of well-known photoacid generators, many of those compounds having poor stability, especially poor thermal stability exhibit an acid amplifier-like behavior.

In the resist composition of the invention, an appropriate amount of the acid amplifier compound is up to 2 parts, and especially up to 1 part by weight per 100 parts by weight of the base resin. Excessive amounts of the acid amplifier compound make diffusion control difficult, leading to degradation of resolution and pattern profile.

Organic Solvent

The organic solvent (C) used herein may be any organic solvent in which the base resin, acid generator, and other components are soluble. Illustrative, non-limiting, examples of the organic solvent include ketones such as cyclohexanone and methyl amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone. These solvents may be used alone or in combinations of two or more thereof. Of the above organic solvents, it is recommended to use diethylene glycol dimethyl ether, 1-ethoxy-2-propanol, PGMEA, and mixtures thereof because the acid generator is most soluble therein.

An appropriate amount of the organic solvent used is 200 to 1,000 parts, especially 400 to 800 parts by weight per 100 parts by weight of the base resin.

Quencher

A quencher (D) may be optionally used in the resist composition of the invention. The term "quencher" as used herein has a meaning generally known in the art and refers to a compound capable of suppressing the rate of diffusion when the acid generated by the acid generator diffuses within the resist film. The inclusion of quencher facilitates adjustment of resist sensitivity and holds down the rate of acid diffusion within the resist film, resulting in better resolution. In addition, it suppresses changes in sensitivity following exposure and reduces substrate and environment dependence, as well as improving the exposure latitude and the pattern profile.

Examples of suitable quenchers include primary, secondary, and tertiary aliphatic amines, mixed amines, aromatic amines, heterocyclic amines, nitrogen-containing compounds with carboxyl group, nitrogen-containing compounds with sulfonyl group, nitrogen-containing compounds with hydroxyl group, nitrogen-containing compounds with hydroxyphenyl group, alcoholic nitrogen-containing compounds, amide derivatives, imide derivatives, carbamate derivatives, and ammonium salts.

Examples of suitable primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, N,N-bis(hydroxyethyl)aniline, 2-methylaniline, 3-methylaniline, 4-methylaniline, ethylaniline, propylaniline, dimethylaniline, 2,6-diisopropylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazane derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 4-pyrrolidinopyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds with carboxyl group include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). A typical nitrogen-containing compound with sulfonyl group is 3-pyridinesulfonic acid. Examples of suitable nitrogen-containing compounds with hydroxyl group, nitrogen-containing compounds with hydroxyphenyl group, and alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, benzamide, and 1-cyclohexylpyrrolidone. Suitable imide derivatives include phthalimide, succinimide, and maleimide. Suitable carbamate derivatives include N-tert-butoxycarbonyl-N,N-dicyclohexyl-amine, N-tert-butoxycarbonylbenzimidazole, and oxazolidinone.

Suitable ammonium salts include pyridinium p-toluenesulfonate, triethylammonium p-toluenesulfonate, trioctylammonium p-toluenesulfonate, triethylammonium 2,4,6-triisopropylbenzenesulfonate, trioctylammonium 2,4,6-triisopropylbenzenesulfonate, triethylammonium camphorsulfonate, trioctylammonium camphorsulfonate, tetramethylammonium hydroxide, tetraethylammonium hydroxide, tetrabutylammonium hydroxide, benzyltrimethylammonium hydroxide, tetramethylammonium p-toluenesulfonate, tetrabutylammonium p-toluenesulfonate, benzyltrimethylammonium p-toluenesulfonate, tetramethylammonium camphorsulfonate, tetrabutylammonium camphorsulfonate, benzyltrimethylammonium camphorsulfonate, tetramethylammonium 2,4,6-triisopropylbenzenesulfonate, tetrabutylammonium 2,4,6-triisopropylbenzenesulfonate, benzyltrimethylammonium 2,4,6-triisopropylbenzenesulfonate, tetramethylammonium acetate, tetrabutylammonium acetate, benzyltrimethylammonium acetate, tetramethylammonium benzoate, tetrabutylammonium benzoate, and benzyltrimethylammonium benzoate.

In addition, amine compounds of the following general formula (B)-1 may also be included alone or in admixture.

$$N(X)_n(Y)_{3-n} \quad (B)\text{-}1$$

In the formula, n is equal to 1, 2 or 3. The side chain X is independently selected from groups of the following general formulas (X)-1 to (X)-3. The side chain Y is independently hydrogen or a straight, branched or cyclic $C_1$-$C_{20}$ alkyl group in which some or all hydrogen atoms may be substituted by fluorine atoms and which may contain an ether or hydroxyl group. Two or three X may bond together to form a ring.

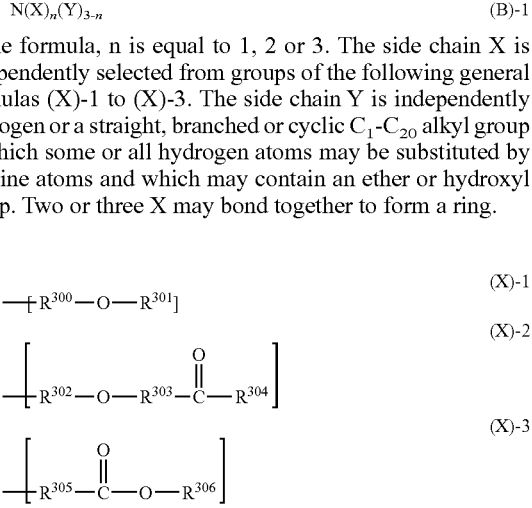

In the formulas, $R^{300}$, $R^{302}$ and $R^{305}$ are independently straight or branched $C_1$-$C_4$ alkylene groups; $R^{301}$ and $R^{304}$ are independently hydrogen or straight, branched or cyclic $C_1$-$C_{20}$ alkyl groups in which some or all hydrogen atoms may be substituted by fluorine atoms and which may contain one or more hydroxyl group, ether group, ester group or lactone ring; $R^{303}$ is a single bond or a straight or branched $C_1$-$C_4$ alkylene group; $R^{306}$ is a straight, branched or cyclic $C_1$-$C_{20}$ alkyl group in which some or all hydrogen atoms may be substituted by fluorine atoms and which may contain one or more hydroxyl group, ether group, ester group or lactone ring.

Illustrative examples of the compounds of formula (B)-1 include, but are not limited to, tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, 1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]-ethylamine, N,N-bis(2-acetoxyethyl)-2-[(methoxycarbonyl)methoxycarbonyl]-ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)-ethylamine, N,N-bis(2-acetoxyethyl)-2-(tetrahydrofurfuryloxycarbonyl)-ethylamine, N,N-bis(2-hydroxyethyl)-2-[(2-oxotetrahydrofuran-3-yl)oxy-carbonyl]ethylamine, N,N-bis(2-acetoxyethyl)-2-[(2-oxotetrahydrofuran-3-yl)oxy-carbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl)-ethylamine, N,N-bis(2-formyloxyethyl)-2-(2-formyloxyethoxycarbonyl)-ethylamine, N,N-bis(2-methoxyethyl)-2-(methoxycarbonyl)ethylamine, N-(2-hydroxyethyl)-bis[2-(methoxycarbonyl)ethyl]amine, N-(2-acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-(ethoxycarbonyl)ethyl]amine, N-(3-hydroxy-1-propyl)-bis[2-(methoxycarbonyl)ethyl]amine, N-(3-acetoxy-1-propyl)-bis[2-(methoxycarbonyl)ethyl]amine, N-(2-methoxyethyl)-bis[2-(methoxycarbonyl)ethyl]amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethyl-bis[2-(tert-butoxycarbonyloxy)ethyl]amine, tris(methoxycarbonylmethyl)amine, tris(ethoxycarbonylmethyl)amine, N-butyl-bis(methoxycarbonylmethyl)amine, N-hexyl-bis(methoxycarbonylmethyl)amine, and β-(diethylamino)-δ-valerolactone.

Also useful are one or more of cyclic structure-bearing amine compounds having the following general formula (B)-2.

(B)-2

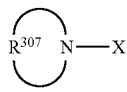

Herein X is as defined above, and $R^{307}$ is a straight or branched $C_2$-$C_{20}$ alkylene group in which some or all hydrogen atoms may be substituted by fluorine atoms and which may contain one or more carbonyl, ether, ester or sulfide groups.

Illustrative examples of the cyclic structure-bearing amine compounds having formula (B)-2 include 1-[2-(methoxymethoxy)ethyl]pyrrolidine, 1-[2-(methoxymethoxy)ethyl]piperidine, 4-[2-(methoxymethoxy)ethyl]morpholine, 1-[2-[(2-methoxyethoxy)methoxy]ethyl]pyrrolidine, 1-[2-[(2-methoxyethoxy)methoxy]ethyl]piperidine, 4-[2-[(2-methoxyethoxy)methoxy]ethyl]morpholine, 2-[2-(2-methoxyethoxy)ethoxy]ethylmorpholine, 2-[2-(2-butoxyethoxy)ethoxy]ethylmorpholine, 2-{2-[2-(2-methoxyethoxy)ethoxy]ethoxy}ethylmorpholine, 2-{2-[2-(2-butoxyethoxy)ethoxy]ethoxy}ethylmorpholine, 2-(1-pyrrolidinyl)ethyl acetate, 2-piperidinoethyl acetate, 2-morpholinoethyl acetate, 2-(1-pyrrolidinyl)ethyl formate, 2-piperidinoethyl propionate, 2-morpholinoethyl acetoxyacetate, 2-(1-pyrrolidinyl)ethyl methoxyacetate, 4-[2-(methoxycarbonyloxy)ethyl]morpholine, 1-[2-(t-butoxycarbonyloxy)ethyl]piperidine, 4-[2-(2-methoxyethoxycarbonyloxy)ethyl]morpholine, methyl 3-(1-pyrrolidinyl)propionate, methyl 3-piperidinopropionate, methyl 3-morpholinopropionate, methyl 3-(thiomorpholino)propionate, methyl 2-methyl-3-(1-pyrrolidinyl)propionate, ethyl 3-morpholinopropionate, methoxycarbonylmethyl 3-piperidinopropionate, 2-hydroxyethyl 3-(1-pyrrolidinyl)propionate, 2-acetoxyethyl 3-morpholinopropionate, 2-oxotetrahydrofuran-3-yl 3-(1-pyrrolidinyl)propionate, tetrahydrofurfuryl 3-morpholinopropionate, glycidyl 3-piperidinopropionate, 2-methoxyethyl 3-morpholinopropionate, 2-(2-methoxyethoxy)ethyl 3-(1-pyrrolidinyl)propionate, butyl 3-morpholinopropionate, cyclohexyl 3-piperidinopropionate, α-(1-pyrrolidinyl)methyl-γ-butyrolactone, β-piperidino-γ-butyrolactone, β-morpholino-δ-valerolactone, methyl 1-pyrrolidinylacetate, methyl piperidinoacetate, methyl morpholinoacetate, methyl thiomorpholinoacetate, ethyl 1-pyrrolidinylacetate, 2-methoxyethyl morpholinoacetate, 2-morpholinoethyl 2-methoxyacetate, 2-morpholinoethyl 2-(2-methoxyethoxy)acetate, 2-morpholinoethyl 2-[2-(2-methoxyethoxy)ethoxy]acetate, 2-morpholinoethyl hexanoate, 2-morpholinoethyl octanoate, 2-morpholinoethyl decanoate, 2-morpholinoethyl laurate, 2-morpholinoethyl myristate, 2-morpholinoethyl palmitate, 2-morpholinoethyl stearate, 2-morpholinoethyl cyclohexanecarboxylate, and 2-morpholinoethyl adamantanecarboxylate.

Also, one or more of cyano-bearing amine compounds having the following general formulae (B)-3 to (B)-6 may be added.

(B)-3

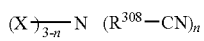

(B)-4

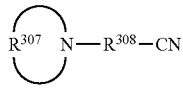

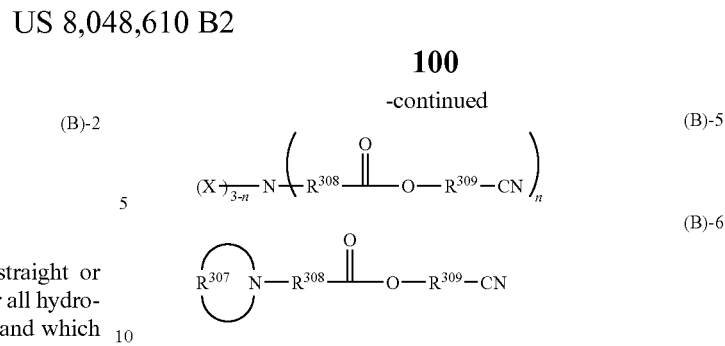

Herein, X, $R^{307}$ and n are as defined in formula (B)-1, and $R^{308}$ and $R^{309}$ each are independently a straight or branched $C_1$-$C_4$ alkylene group.

Illustrative examples of the cyano-bearing amine compounds having formulae (B)-3 to (B)-6 include 3-(diethylamino)propiononitrile, N,N-bis(2-hydroxyethyl)-3-aminopropiononitrile, N,N-bis(2-acetoxyethyl)-3-aminopropiononitrile, N,N-bis(2-formyloxyethyl)-3-aminopropiononitrile, N,N-bis(2-methoxyethyl)-3-aminopropiononitrile, N,N-bis[2-(methoxymethoxy)ethyl]-3-aminopropiononitrile, methyl N-(2-cyanoethyl)-N-(2-methoxyethyl)-3-aminopropionate, methyl N-(2-cyanoethyl)-N-(2-hydroxyethyl)-3-aminopropionate, methyl N-(2-acetoxyethyl)-N-(2-cyanoethyl)-3-aminopropionate, N-(2-cyanoethyl)-N-ethyl-3-aminopropiononitrile, N-(2-cyanoethyl)-N-(2-hydroxyethyl)-3-aminopropiononitrile, N-(2-acetoxyethyl)-N-(2-cyanoethyl)-3-aminopropiononitrile, N-(2-cyanoethyl)-N-(2-formyloxyethyl)-3-aminopropiononitrile, N-(2-cyanoethyl)-N-(2-methoxyethyl)-3-aminopropiononitrile, N-(2-cyanoethyl)-N-[2-(methoxymethoxy)ethyl]-3-aminopropiono-nitrile, N-(2-cyanoethyl)-N-(3-hydroxy-1-propyl)-3-aminopropiononitrile, N-(3-acetoxy-1-propyl)-N-(2-cyanoethyl)-3-aminopropiononitrile, N-(2-cyanoethyl)-N-(3-formyloxy-1-propyl)-3-aminopropiono-nitrile, N-(2-cyanoethyl)-N-tetrahydrofurfuryl-3-aminopropiononitrile, N,N-bis(2-cyanoethyl)-3-aminopropiononitrile, diethylaminoacetonitrile, N,N-bis(2-hydroxyethyl)aminoacetonitrile, N,N-bis(2-acetoxyethyl)aminoacetonitrile, N,N-bis(2-formyloxyethyl)aminoacetonitrile, N,N-bis(2-methoxyethyl)aminoacetonitrile, N,N-bis[2-(methoxymethoxy)ethyl]aminoacetonitrile, methyl N-cyanomethyl-N-(2-methoxyethyl)-3-aminopropionate, methyl N-cyanomethyl-N-(2-hydroxyethyl)-3-aminopropionate, methyl N-(2-acetoxyethyl)-N-cyanomethyl-3-aminopropionate, N-cyanomethyl-N-(2-hydroxyethyl)aminoacetonitrile, N-(2-acetoxyethyl)-N-(cyanomethyl)aminoacetonitrile, N-cyanomethyl-N-(2-formyloxyethyl)aminoacetonitrile, N-cyanomethyl-N-(2-methoxyethyl)aminoacetonitrile, N-cyanomethyl-N-[2-(methoxymethoxy)ethyl)aminoacetonitrile, N-cyanomethyl-N-(3-hydroxy-1-propyl)aminoacetonitrile, N-(3-acetoxy-1-propyl)-N-(cyanomethyl)aminoacetonitrile, N-cyanomethyl-N-(3-formyloxy-1-propyl) aminoacetonitrile, N,N-bis(cyanomethyl)aminoacetonitrile, 1-pyrrolidinepropiononitrile, 1-piperidinepropiononitrile, 4-morpholinepropiononitrile, 1-pyrrolidineacetonitrile, 1-piperidineacetonitrile, 4-morpholineacetonitrile, cyanomethyl 3-diethylaminopropionate, cyanomethyl N,N-bis(2-hydroxyethyl)-3-aminopropionate, cyanomethyl N,N-bis(2-acetoxyethyl)-3-aminopropionate, cyanomethyl N,N-bis(2-formyloxyethyl)-3-aminopropionate, cyanomethyl N,N-bis(2-methoxyethyl)-3-aminopropionate, cyanomethyl N,N-bis[2-(methoxymethoxy)ethyl]-3-aminopropionate, 2-cyanoethyl 3-diethylaminopropionate, 2-cyanoethyl N,N-bis(2-hydroxyethyl)-3-aminopropionate, 2-cyanoethyl N,N-bis(2-acetoxyethyl)-3-aminopropionate, 2-cyanoethyl N,N- bis(2-formyloxyethyl)-3-aminopropionate, 2-cyanoethyl N,N-bis(2-methoxyethyl)-3-aminopropionate, 2-cyanoethyl N,N-bis[2-(methoxymethoxy)ethyl]-3-amino-propionate, cyanomethyl 1-pyrrolidinepropionate, cyanomethyl 1-piperidinepropionate, cyanomethyl 4-morpholinepropionate, 2-cyanoethyl 1-pyrrolidinepropionate, 2-cyanoethyl 1-piperidinepropionate, and 2-cyanoethyl 4-morpholinepropionate.

Also included are amine compounds of imidazole structure having a polar functional group, represented by the general formula (B)-7.

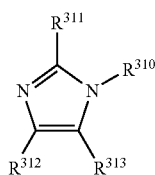

(B)-7

Herein, $R^{310}$ is a straight, branched or cyclic $C_2$-$C_{20}$ alkyl group in which some or all hydrogen atoms may be substituted by fluorine atoms and which has one or more polar functional groups. The polar functional group is selected from among hydroxyl, carbonyl, ester, ether, sulfide, carbonate, cyano and acetal groups and mixtures thereof. $R^{311}$, $R^{312}$ and $R^{313}$ are each independently a hydrogen atom, a straight, branched or cyclic $C_1$-$C_{10}$ alkyl group, aryl group or aralkyl group.

Also included are amine compounds of benzimidazole structure having a polar functional group, represented by the general formula (B)-8.

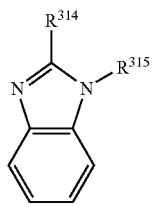

(B)-8

Herein, $R^{314}$ is hydrogen, a straight, branched or cyclic $C_1$-$C_{10}$ alkyl group, aryl group or aralkyl group. $R^{315}$ is a straight, branched or cyclic $C_1$-$C_{20}$ alkyl group in which some or all hydrogen atoms may be substituted by fluorine atoms and which has one or more polar functional groups. The alkyl group contains as the polar functional group at least one group selected from among ester, acetal and cyano groups, and may additionally contain at least one group selected from among hydroxyl, carbonyl, ether, sulfide and carbonate groups.

Further included are heterocyclic nitrogen-containing compounds having a polar functional group, represented by the general formulae (B)-9 and (B)-10.

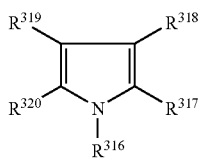

(B)-9

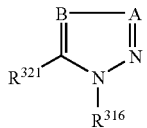

(B)-10

Herein, A is a nitrogen atom or $=C-R^{322}$. B is a nitrogen atom or $=C-R^{323}$. $R^{316}$ is a straight, branched or cyclic $C_2$-$C_{20}$ alkyl group in which some or all hydrogen atoms may be substituted by fluorine atoms and which has one or more polar functional groups, the polar functional group being selected from among hydroxyl, carbonyl, ester, ether, sulfide, carbonate, cyano and acetal groups and mixtures thereof. $R^{317}$, $R^{318}$, $R^{319}$ and $R^{320}$ are each independently hydrogen, a straight, branched or cyclic $C_1$-$C_{10}$ alkyl group or aryl group, or a pair of $R^{317}$ and $R^{318}$ and a pair of $R^{319}$ and $R^{320}$, taken together, may form a benzene, naphthalene or pyridine ring with the carbon atoms to which they are attached. $R^{321}$ is hydrogen, a straight, branched or cyclic $C_1$-$C_{10}$ alkyl group or aryl group. $R^{322}$ and $R^{323}$ each are hydrogen, a straight, branched or cyclic $C_1$-$C_{10}$ alkyl group or aryl group, or a pair of $R^{321}$ and $R^{323}$, taken together, may form a benzene or naphthalene ring with the carbon atoms to which they are attached.

Also included are organic nitrogen-containing compounds having an aromatic carboxylic acid ester structure, represented by the general formulae (B)-11 to (B)-14.

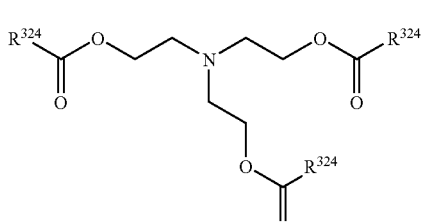

(B)-11

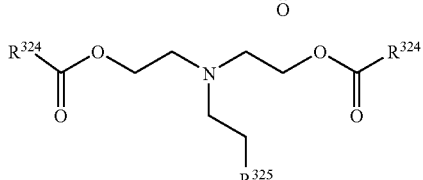

(B)-12

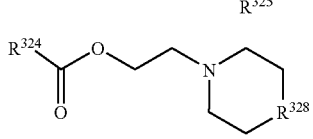

(B)-13

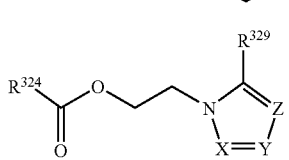

(B)-14

Herein $R^{324}$ is a $C_6$-$C_{20}$ aryl group or $C_4$-$C_{20}$ hetero-aromatic group, in which some or all hydrogen atoms may be replaced by halogen atoms, straight, branched or cyclic $C_1$-$C_{20}$ alkyl groups, $C_6$-$C_{20}$ aryl groups, $C_7$-$C_{20}$ aralkyl groups, $C_1$-$C_{10}$ alkoxy groups, $C_1$-$C_{10}$ acyloxy groups or $C_1$-$C_{10}$ alkylthio groups. $R^{325}$ is $CO_2R^{326}$, $OR^{327}$ or cyano group. $R^{326}$ is a $C_1$-$C_{10}$ alkyl group, in which some methylene groups may be replaced by oxygen atoms. $R^{327}$ is a $C_1$-$C_{10}$ alkyl or acyl group, in which some methylene groups may be replaced by oxygen atoms. $R^{328}$ is a single bond, methylene, ethylene, sulfur atom or —O(CH$_2$CH$_2$O)$_n$— group wherein n is 0, 1, 2, 3 or 4. $R^{329}$ is hydrogen, methyl, ethyl or phenyl. X is a nitrogen atom or CR$^{330}$. Y is a nitrogen atom or CR$^{331}$. Z is a nitrogen atom or CR$^{332}$. $R^{330}$, $R^{331}$ and $R^{332}$ are each independently hydrogen, methyl or phenyl. Alternatively, a pair of $R^{330}$ and $R^{331}$ or a pair of $R^{331}$ and $R^{332}$ may bond together to form a C$_6$-C$_{20}$ aromatic ring or C$_2$-C$_{20}$ hetero-aromatic ring with the carbon atoms to which they are attached.

Further included are amine compounds of 7-oxanorbornane-2-carboxylic ester structure, represented by the general formula (B)-15.

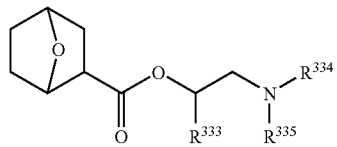

(B)-15

Herein $R^{333}$ is hydrogen or a straight, branched or cyclic C$_1$-C$_{10}$ alkyl group. $R^{334}$ and $R^{335}$ are each independently a C$_1$-C$_{20}$ alkyl group, C$_6$-C$_{20}$ aryl group or C$_7$-C$_{20}$ aralkyl group, which may contain one or more polar functional groups selected from among ether, carbonyl, ester, alcohol, sulfide, nitrile, amine, imine, and amide and in which some hydrogen atoms may be replaced by halogen atoms. $R^{334}$ and $R^{335}$, taken together, may form a heterocyclic or hetero-aromatic ring of 2 to 20 carbon atoms with the nitrogen atom to which they are attached.

The quencher is preferably formulated in an amount of 0.001 to 2 parts, and especially 0.01 to 1 part by weight, per 100 parts by weight of the base resin. Less than 0.001 phr of the quencher may achieve no addition effect whereas more than 2 phr may lead to too low a sensitivity.

Surfactant

Optionally, the resist composition of the invention may further comprise (E) a surfactant which is commonly used for improving the coating characteristics. The surfactant may be added in conventional amounts so long as this does not compromise the objects of the invention.

Illustrative, non-limiting, examples of the surfactant include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene polyoxypropylene block copolymers, sorbitan fatty acid esters such as sorbitan monolaurate, sorbitan monopalmitate, and sorbitan monostearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP EF301, EF303 and EF352 (JEMCO Inc.), Megaface F171, F172, F173, R08, R30, R90 and R94 (Dai-Nippon Ink & Chemicals, Inc.), Fluorad FC430, FC431, FC-4430 and FC-4432 (Sumitomo 3M Co., Ltd.), Asahiguard AG710, Surflon S-381, S-382, S-386, SC101, SC102, SC103, SC104, SC105, SC106, Surfynol E1004, KH-10, KH-20, KH-30 and KH-40 (Asahi Glass Co., Ltd.); organosiloxane polymers KP341, X-70-092 and X-70-093 (Shin-Etsu Chemical Co., Ltd.), acrylic acid or methacrylic acid Poly-flow No. 75 and No. 95 (Kyoeisha Ushi Kagaku Kogyo Co., Ltd.). Additional useful surfactants include partially fluorinated oxetane ring-opened polymers having the structural formula (surf-1).

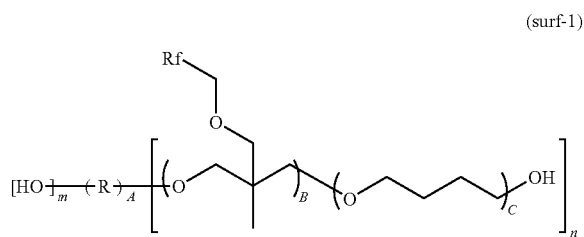

(surf-1)

It is provided herein that R, Rf, A, B, C, m, and n are applied to only formula (surf-1), independent of their descriptions other than for the surfactant. R is a di- to tetra-valent C$_2$-C$_5$ aliphatic group. Exemplary divalent groups include ethylene, 1,4-butylene, 1,2-propylene, 2,2-dimethyl-1,3-propylene and 1,5-pentylene. Exemplary tri- and tetra-valent groups are shown below.

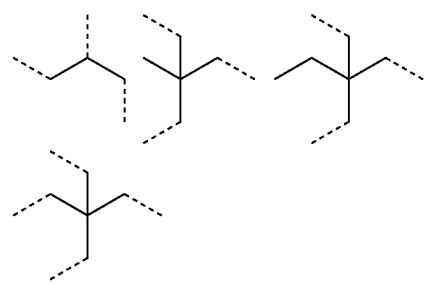

Herein the broken line denotes a valence bond. These formulae are partial structures derived from glycerol, trimethylol ethane, trimethylol propane, and pentaerythritol, respectively. Of these, 1,4-butylene and 2,2-dimethyl-1,3-propylene are preferably used.

Rf is trifluoromethyl or pentafluoroethyl, and preferably trifluoromethyl. The letter m is an integer of 0 to 3, n is an integer of 1 to 4, and the sum of m and n, which represents the valence of R, is an integer of 2 to 4. A is equal to 1, B is an integer of 2 to 25, and C is an integer of 0 to 10. Preferably, B is an integer of 4 to 20, and C is 0 or 1. Note that the above structural formula does not prescribe the arrangement of respective constituent units while they may be arranged either in blocks or randomly. For the preparation of surfactants in the form of partially fluorinated oxetane ring-opened polymers, reference should be made to U.S. Pat. No. 5,650,483, for example.

Of the foregoing surfactants, FC-4430, Surflon S-381, Surfynol E1004, KH-20 and KH-30 and oxetane ring-opened polymers of formula (surf-1) are preferred. These surfactants may be used alone or in admixture.

In the chemically amplified resist composition of the invention, the surfactant is preferably added in an amount of up to 2 parts, and especially up to 1 part by weight, per 100 parts by weight of the base resin. If used, the amount of surfactant is at least 0.01 phr.

In one embodiment of the invention wherein the resist composition is worked by immersion lithography using water, especially in the absence of a resist protective coating, a surfactant may be added to the resist composition, the surfactant having a function to segregate at the resist surface after spin coating to prevent or reduce water penetration or leaching. This surfactant is a polymeric surfactant which is insoluble in water and soluble in an alkaline developer, and preferably improves water repellency and water slippage. Exemplary polymeric surfactants are those comprising monomeric units represented by the following formula.

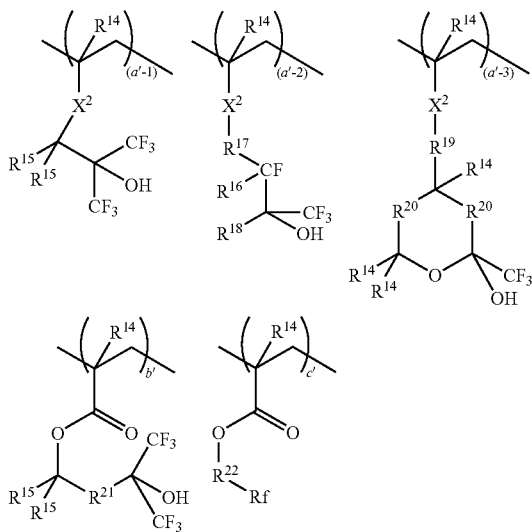

In the above formulae, $R^{14}$ is each independently hydrogen, fluorine, methyl or trifluoromethyl; $R^{15}$ is each independently hydrogen or a straight, branched or cyclic $C_1$-$C_{20}$ alkyl or fluoroalkyl group, or plural $R^{15}$ in a common unit may bond together to form a ring with the carbon atom to which they are attached, and in this case, they collectively stand for a straight, branched or cyclic alkylene or fluoroalkylene group having 2 to 20 carbon atoms in total. $R^{16}$ is fluorine or hydrogen, or $R^{16}$ may bond with $R^{17}$ to form a non-aromatic ring having 3 to 10 carbon atoms in total with the carbon atom to which they are attached. $R^{17}$ is a straight, branched or cyclic $C_1$-$C_6$ alkylene group in which one or more hydrogen atoms may be replaced by fluorine atoms. $R^{18}$ is a straight or branched $C_1$-$C_{10}$ alkyl group in which one or more hydrogen atoms are replaced by fluorine atoms, or $R^{17}$ and $R^{18}$ may bond together to form a ring with the carbon atoms to which they are attached, and in this case, they collectively stand for a trivalent organic group having 2 to 12 carbon atoms in total. $R^{19}$ is a single bond or a $C_1$-$C_4$ alkylene group. $R^{20}$ is each independently a single bond, —O— or —$CR^{14}R^{14}$— wherein $R^{14}$ is as defined above. $R^{21}$ is a straight or branched $C_1$-$C_4$ alkylene group, or $R^{21}$ may bond with $R^{15}$ within a common unit to form a non-aromatic ring having 4 to 7 carbon atoms in total with the carbon atom to which they are attached. $R^{22}$ is 1,2-ethylene, 1,3-propylene or 1,4-butylene. Rf is a straight perfluoroalkyl group of 3 to 6 carbon atoms, or 3H-perfluoropropyl, 4H-perfluorobutyl, 5H-perfluoropentyl or 6H-perfluorohexyl. $X^2$ is each independently —C(=O)—O—, —O—, or —C(=O)—$R^{23}$—C(=O)—O— wherein $R^{23}$ is a straight, branched or cyclic $C_1$-$C_{10}$ alkylene group. The subscripts are numbers in the range: $0 \leq (a'\text{-}1) < 1$, $0 \leq (a'\text{-}2) < 1$, $0 \leq (a'\text{-}3) < 1$, $0 < (a'\text{-}1) + (a'\text{-}2) + (a'\text{-}3) < 1$, $0 \leq b' < 1$, $0 \leq c' < 1$, and $0 < (a'\text{-}1) + (a'\text{-}2) + (a'\text{-}3) + b' + c' \leq 1$.

In the resist composition, the polymeric surfactant is preferably added in an amount of 0.001 to 20 parts, and more preferably 0.01 to 10 parts by weight, per 100 parts by weight of the base resin. With respect to the polymeric surfactant, reference should be made to JP-A 2007-297590.

While the resist composition of the invention typically comprises a polymer or base resin, acid generator, organic solvent and quencher as described above, there may be added optional other ingredients such as dissolution inhibitors, acidic compounds, stabilizers, and dyes. Optional ingredients may be added in conventional amounts so long as this does not compromise the objects of the invention.

Process

A fourth embodiment is a pattern forming process using the resist composition described above. Pattern formation using the resist composition of the invention may be performed by well-known lithography processes. The process generally involves coating, heat treatment (or prebaking), exposure, heat treatment (post-exposure baking, PEB), and development. If necessary, any additional steps may be added.

First the composition is applied onto a substrate for integrated circuitry fabrication (e.g., Si, $SiO_2$, SiN, SiON, TiN, WSi, BPSG, SOG, organic antireflective film, etc.) or a substrate for mask circuitry fabrication (e.g., Cr, CrO, CrON, MoSi, etc.) by a suitable coating technique such as spin coating. The coating is prebaked on a hot plate at a temperature of 60 to 150° C. for 1 to 10 minutes, preferably 80 to 140° C. for 1 to 5 minutes. The resulting resist film is generally 0.05 to 2.0 μm thick. Through a photomask having a desired pattern disposed over the substrate, the resist film is then exposed to high-energy radiation such as deep-UV, excimer laser or x-ray, or electron beam in an exposure dose preferably in the range of about 1 to 200 mJ/cm$^2$, more preferably about 10 to 100 mJ/cm$^2$. Alternatively, pattern formation may be performed by writing with an electron beam directly (not through a mask). Light exposure may be done by a conventional exposure process or in some cases, by an immersion process of providing liquid impregnation between the mask and the resist. In the case of immersion lithography, a protective coating which is insoluble in water may be used. The resist film is then post-exposure baked (PEB) on a hot plate at 60 to 150° C. for 1 to 5 minutes, and preferably at 80 to 140° C. for 1 to 3 minutes. Finally, development is carried out using as the developer an aqueous alkali solution, such as a 0.1 to 5 wt %, preferably 2 to 3 wt %, aqueous solution of tetramethylammonium hydroxide (TMAH), this being done by a conventional method such as dip, puddle, or spray development for a period of 0.1 to 3 minutes, and preferably 0.5 to 2 minutes. These steps result in the formation of the desired pattern on the substrate. Of the various types of high-energy radiation that may be used, the resist composition of the invention is best suited to fine pattern formation with, in particular, deep-UV having a wavelength of 250 to 190 nm, excimer laser, x-ray, or electron beam. The desired pattern may not be obtainable outside the upper and lower limits of the above range.

The water-insoluble protective coating which is used in the immersion lithography is to prevent the resist coating from being leached and to improve water slippage at the coating surface and is generally divided into two types. The first type is an organic solvent-strippable protective coating which must be stripped, prior to alkaline development, with an organic solvent in which the resist coating is not dissolvable. The second type is an alkali-soluble protective coating which is soluble in an alkaline developer so that it can be removed simultaneously with the removal of solubilized areas of the resist coating. The protective coating of the second type is preferably of a material comprising a polymer having a 1,1,1,3,3,3-hexafluoro-2-propanol residue (which is insoluble in water and soluble in an alkaline developer) as a base in an alcohol solvent of at least 4 carbon atoms, an ether solvent of 8 to 12 carbon atoms or a mixture thereof. Alternatively, the aforementioned surfactant which is insoluble in water and soluble in an alkaline developer may be dissolved in an alcohol solvent of at least 4 carbon atoms, an ether solvent of 8 to 12 carbon atoms or a mixture thereof to form a solution, from which the protective coating of the second type is formed.

Any desired step may be added to the pattern forming process. For example, after a photoresist coating is formed, the process may proceed to a step of rinsing with pure water (post-soaking) for extracting the acid generator or the like from the coating surface or washing away particles. After exposure, the process may proceed to a step of rinsing (post-soaking) for removing any water remaining on the coating after exposure.

A fifth embodiment is a pattern forming process comprising the steps of applying a positive resist composition onto a substrate to form a coating, exposing the coating to soft x-ray having a wavelength of 3 to 15 nm, optionally heat treating the exposed coating and developing it with a developer, wherein the resist composition comprises a polymer comprising recurring units having the general formulae (1'), (2) and (3).

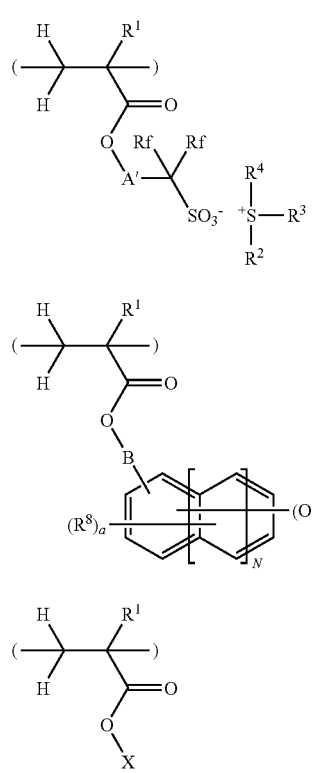

Herein A' is a divalent $C_1$-$C_{10}$ organic group which may have fluorine or oxygen substituted thereon, $R^1$, $R^2$, $R^3$, $R^4$, N, $R^8$, B, a, b, and X are as defined above.

In formula (1'), examples of A' are those illustrated as A in formula (1) and further include methylene. $R^1$, $R^2$, $R^3$, $R^4$, N, $R^8$, B, a, b, and X are as illustrated above. Examples of recurring units of formula (1') are as illustrated above for formulae (1) and (1a) and further include the following.

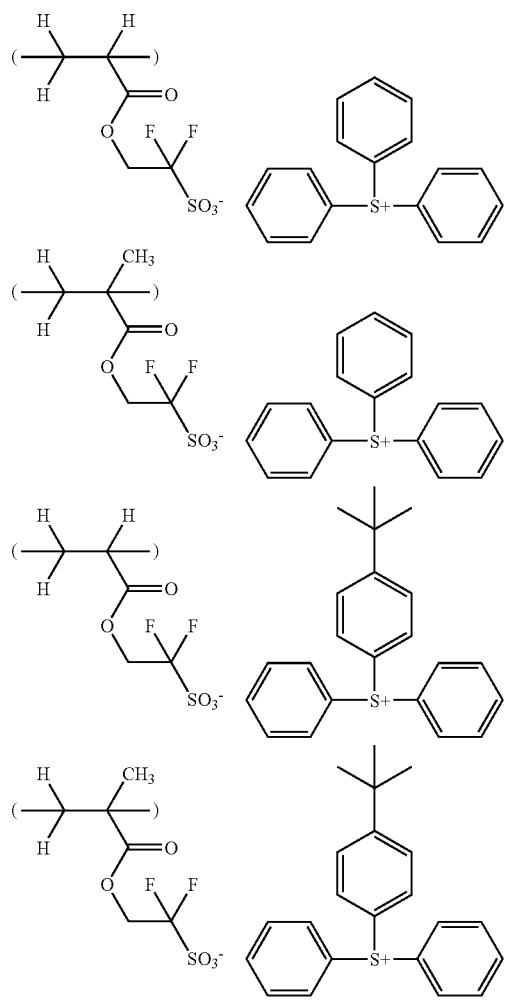

These recurring units may be synthesized, for example, by the following method. One exemplary compound may be synthesized by reacting 2-bromo-2,2-difluoroethanol with pivalic chloride or anhydride to form 2-bromo-2,2-difluoroethyl pivalate, converting the bromo group into sodium sulfinate using a sulfur compound such as sodium dithionite, and converting sulfinic acid into sulfonic acid using an oxidizing agent such as hydrogen peroxide. This is followed by cation exchange with a triarylsulfonium halide or the like. The pivalic ester is then subjected to alkaline hydrolysis. Through reaction with (meth)acrylic anhydride, the alcohol resulting from hydrolysis is converted into a (meth)acrylic derivative, yielding the end compound.

The steps of esterification, conversion from alkane halide to sodium sulfinate, and conversion to sulfonic acid are well known, while the formulations used in the latter two steps are described in JP-A 2004-2252. The outline of the process is illustrated below.

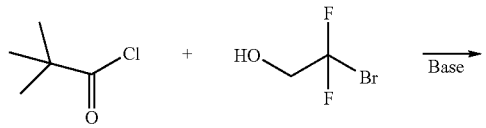

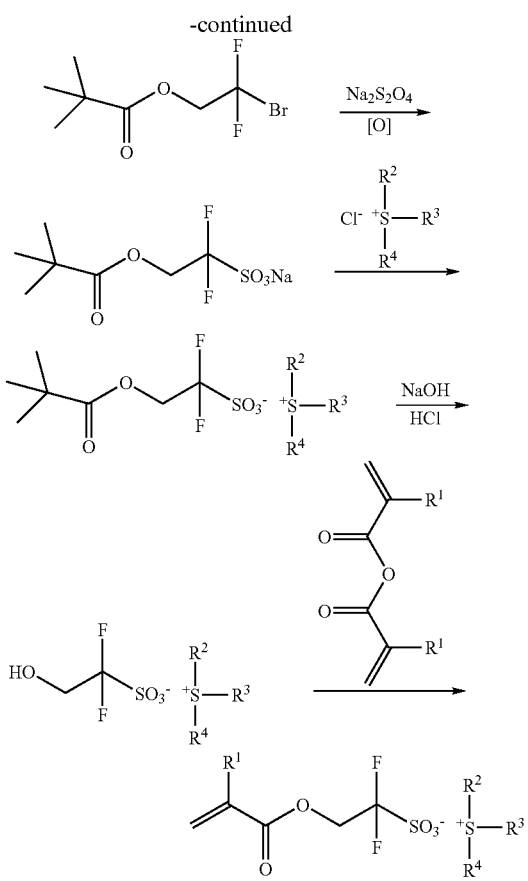

Note that $R^1$, $R^2$, $R^3$ and $R^4$ are as defined above.

With respect to formulae (2) and (3), the same description as in the first and second embodiments is applicable. The polymer comprising recurring units of formulae (1'), (2) and (3) may further comprise recurring units of one or more types selected from formulae (4) to (10) and optionally recurring units of one or more other types.

In addition to the polymer, the resist composition used in the pattern forming process comprises other components which may be the same as described in the third embodiment. Pattern formation may be performed in accordance with the same procedure as described in the fourth embodiment except that soft x-ray having a wavelength in the range of 3 to 15 nm, known as extreme ultraviolet (EUV), is used as the exposure light source.

EXAMPLE

Examples and Comparative Examples are given below by way of illustration and not by way of limitation. All parts are by weight (pbw)
[Synthesis]
Polymerizable sulfonium salts used in polymers were synthesized according to the following formulation.

Synthesis Example 1

Synthesis of Triphenylsulfonium Chloride

Diphenyl sulfoxide, 40 g (0.2 mole), was dissolved in 400 g of dichloromethane, which was stirred under ice cooling. At a temperature below 20° C., 65 g (0.6 mole) of trimethylsilyl chloride was added dropwise to the solution, which was aged for 30 minutes at the temperature. Then, a Grignard reagent which had been prepared from 14.6 g (0.6 mole) of metallic magnesium, 67.5 g (0.6 mole) of chlorobenzene and 168 g of tetrahydrofuran (THF) was added dropwise at a temperature below 20° C. The reaction solution was aged for one hour, after which 50 g of water at a temperature below 20° C. was added to quench the reaction. To this solution, 150 g of water, 10 g of 12N hydrochloric acid, and 200 g of diethyl ether were further added. The water layer was separated and washed with 100 g of diethyl ether, yielding an aqueous solution of triphenylsulfonium chloride. The compound in aqueous solution form was used in the subsequent reaction without further isolation.

Synthesis Example 2

Synthesis of 4-tert-butylphenyldiphenylsulfonium bromide

The target compound was obtained by following the procedure of Synthesis Example 1 aside from using 4-tert-butylbromobenzene instead of the chlorobenzene in Synthesis Example 1 and increasing the amount of water for extraction.

Synthesis Example 3

Synthesis of 4-tert-butoxyphenyldiphenylsulfonium chloride

The target compound was obtained by following the procedure of Synthesis Example 1 aside from using 4-tert-butoxychlorobenzene instead of the chlorobenzene in Synthesis Example 1, using dichloromethane containing 5 wt % of triethylamine as the solvent, and increasing the amount of water for extraction.

Synthesis Example 4

Synthesis of tris(4-methylphenyl)sulfonium chloride

The target compound was obtained by following the procedure of Synthesis Example 1 aside from using bis(4-methylphenyl)sulfoxide instead of the diphenyl sulfoxide and 4-chlorotoluene instead of the chlorobenzene in Synthesis Example 1, and increasing the amount of water for extraction.

Synthesis Example 5

Synthesis of tris(4-tert-butylphenyl)sulfonium bromide

The target compound was obtained by following the procedure of Synthesis Example 1 aside from using bis(4-tert-butylphenyl)sulfoxide instead of the diphenyl sulfoxide and 4-tert-butylbromobenzene instead of the chlorobenzene in Synthesis Example 1, and increasing the amount of water for extraction.

Synthesis Example 6

Synthesis of bis(4-tert-butylphenyl)iodonium hydrogen sulfate

A mixture of 84 g (0.5 mole) of tert-butylbenzene, 53 g (0.25 mole) of potassium iodate and 50 g of acetic anhydride was stirred under ice cooling, and a mixture of 35 g of acetic anhydride and 95 g of conc. sulfuric acid was added dropwise at a temperature below 30° C. The resulting solution was aged for 3 hours at room temperature and ice cooled again, after which 250 g of water was added dropwise to quench the reaction. The reaction solution was extracted with 400 g of dichloromethane. The organic layer was discolored by adding 6 g of sodium hydrogen sulfite. The organic layer was washed with 250 g of water three times. The washed organic layer was concentrated in vacuum, obtaining a crude target product. The product was used in the subsequent reaction without further purification.

Synthesis Example 7

Synthesis of Phenacyltetrahydrothiophenium Bromide

Phenacyl bromide, 88.2 g (0.44 mole) and tetrahydrothiophene, 39.1 g (0.44 mole) were dissolved in 220 g of nitromethane, which was stirred for 4 hours at room temperature. The reaction solution was combined with 800 g of water and 400 g of diethyl ether. The aqueous layer separated was taken out, which was an aqueous solution of the target compound, phenacyltetrahydrothiophenium bromide.

Synthesis Example 8

Synthesis of Dimethylphenylsulfonium Sulfate

At room temperature, 6.2 g (0.05 mole) of thioanisole and 6.9 g (0.055 mole) of dimethyl sulfate were stirred for 12 hours. To the reaction solution were added 100 g of water and 50 ml of diethyl ether. The water layer was taken out, obtaining an aqueous solution of the desired dimethylphenylsulfonium sulfate.

Synthesis Example 9

Synthesis of sodium 2-benzoyloxy-1,1,3,3,3-pentafluoro-propane-1-sulfonate

In 72 g of water was dispersed 10.0 g of 1,1,3,3,3-pentafluoro-2-propan-2-yl benzoate which had been synthesized by a conventional technique. The dispersion was combined with 12.0 g of sodium hydrogen sulfite and 1.24 g of benzoyl peroxide, and allowed to react at 85° C. for 65 hours. It was allowed to cool down and combined with toluene, followed by separatory operation to separate a water layer. A saturated sodium chloride aqueous solution was added to the water layer whereupon white crystals settled out. The crystals were collected by filtration, washed with a small volume of saturated sodium chloride aqueous solution and then dried in vacuum, obtaining the target compound, sodium 2-benzoyloxy-1,1,3,3,3-pantafluoropropane-1-sulfonate. White crystals, 5.85 g (yield 43%).

Synthesis Example 10

Synthesis of triphenylsulfonium 2-benzoyloxy-1,1,3,3,3-pentafluoropropane-1-sulfonate An amount (corresponding to 0.011 mole) of the triphenylsulfonium chloride aqueous solution of Synthesis Example 1 and 3.6 g (0.01 mole) of sodium 2-benzoyloxy-1,1,3,3,3-pantafluoropropane-1-sulfonate synthesized in Synthesis Example 9 were added to 50 g of dichloromethane, followed by stirring. The organic layer was separated and washed with 50 g of water three times. The organic layer was concentrated and 25 g of diethyl ether was added to the residue for crystallization. The crystals were filtered and dried, obtaining the target compound. White crystals, 4.5 g (yield 75%).

Synthesis Example 11

Synthesis of triphenylsulfonium 1,1,3,3,3-pentafluoro-2-hydroxypropane-1-sulfonate (PAG1)

In 72 g of methanol was dissolved 34.4 g of triphenylsulfonium 2-benzoyloxy-1,1,3,3,3-pentafluoropropane-1-sulfonate synthesized in Synthesis Example 10. While the solution was stirred under ice cooling, 54.0 g of 5% sodium hydroxide aqueous solution was added dropwise at a temperature below 10° C. It was aged at the temperature for 4 hours. At a temperature below 10° C., 6.8 g of 12N hydrochloric acid was added to quench the reaction. The methanol was distilled off in vacuum, after which 270 g of dichloromethane was added to the residue. The organic layer was washed with 40 g of water three times. The organic layer was concentrated, after which 60 g of diethyl ether was added to the residue for crystallization. The crystals were filtered and dried, obtaining the target compound. White crystals, 24.3 g (yield 85%).

Synthesis Examples 12 to 18

Target compounds were synthesized as in Synthesis Examples 10 and 11 except that the onium salts prepared in Synthesis Examples 2 to 8 were used. The resulting onium salts PAG2 to PAG8 are shown below.

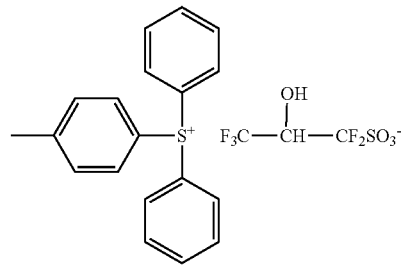

PAG 2

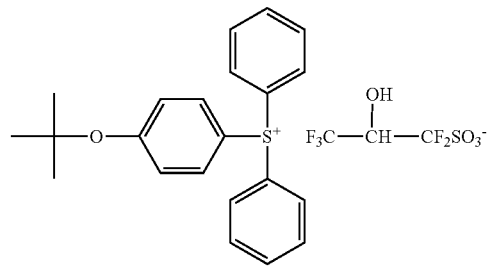

PAG 3

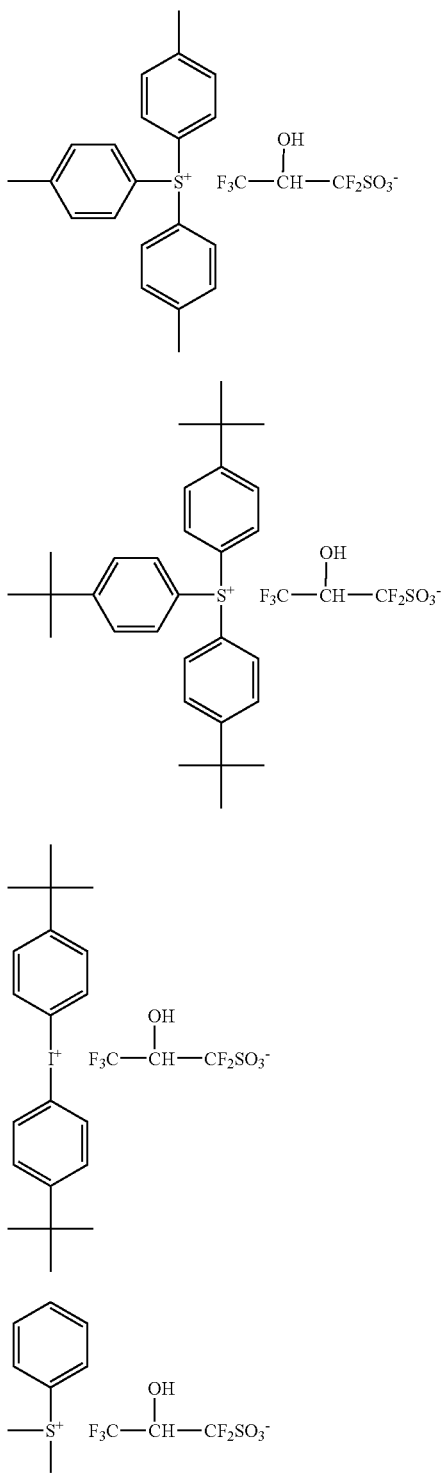

Synthesis Example 19

Synthesis of triphenylsulfonium 1,1,3,3,3-pentafluoro-2-methacryloyloxypropane-1-sulfonate (Monomer 1)

In 200 g of dichloromethane was dissolved 49.0 g (0.1 mole) of triphenylsulfonium 1,1,3,3,3-pentafluoro-2-hydroxy-propane-1-sulfonate in Synthesis Example 11. The solution was combined with 10.1 g (0.10 mole) of triethylamine and 2.4 g (0.2 mole) of N,N-dimethylaminopyridine, followed by stirring under ice cooling. To the solution kept at a temperature below 10° C., 10.0 g (0.10 mole) of methacrylic anhydride was added dropwise, after which the reaction solution was aged for 15 minutes. Dilute hydrochloric acid was added thereto, whereupon the organic layer was separated. The organic layer was washed three times with 200 g of water and concentrated, after which diethyl ether was added to the residue for crystallization. The crystals were filtered and purified by silica gel column chromatograph (elute: dichloromethane/methanol mixture), followed by recrystallization from diethyl ether, filtration, and drying. The target compound was yielded as white crystals, 29 g (yield 51%).

Figure 2:
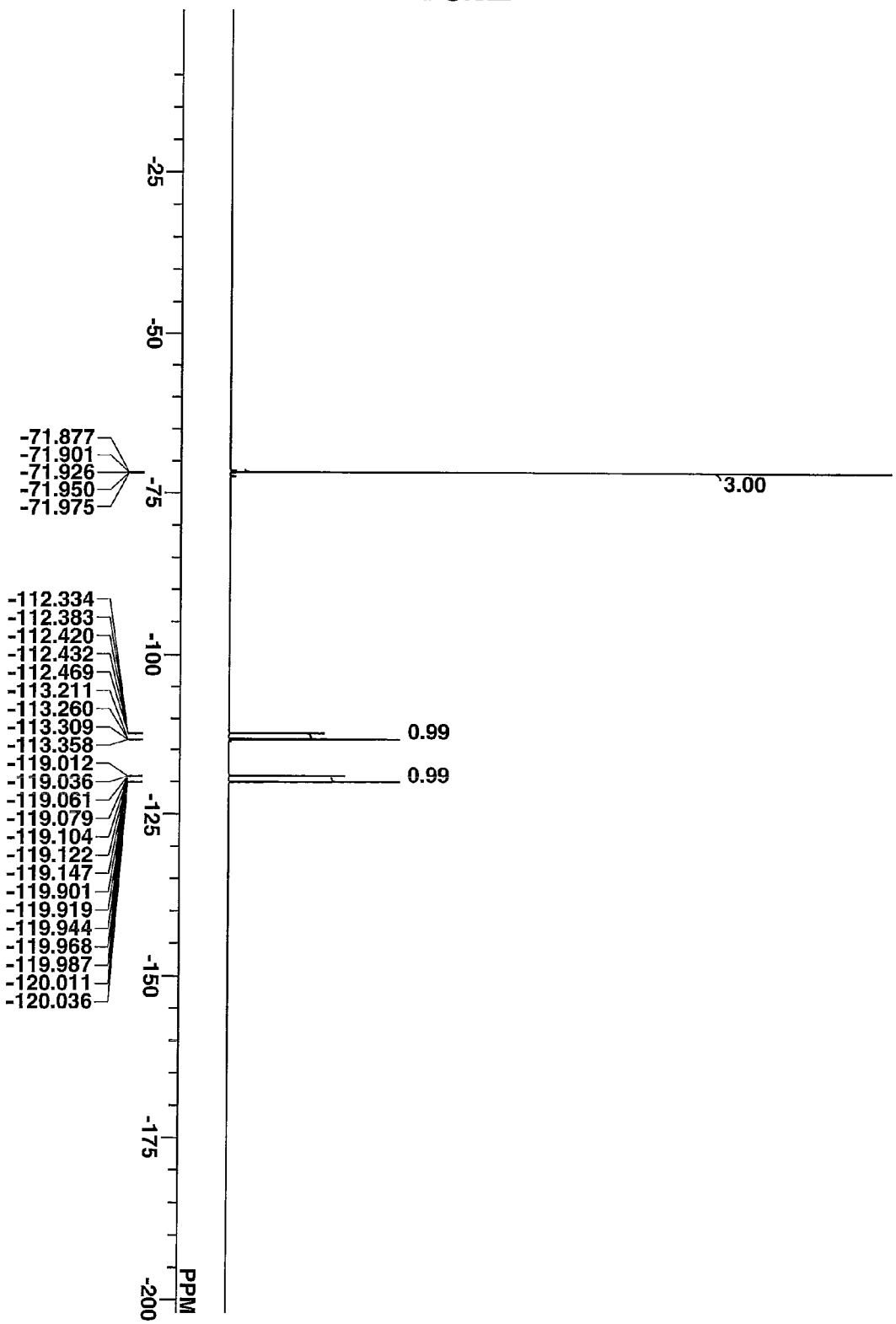
FIG. 2 is a diagram showing the $^{19}$F-NMR spectrum of Monomer 1 in Synthesis Example 19.

The target compound was analyzed by spectroscopy. FIGS. 1 and 2 show nuclear magnetic resonance spectra ($^1$H-NMR and $^{19}$F-NMR). The data of infrared (IR) absorption spectroscopy and time-of-flight mass spectrometry (TOFMS) are shown below.

IR spectra (KBr, cm$^{-1}$)
1737, 1477, 1448, 1375, 1334, 1257, 1213, 1186, 1170, 1137, 1068, 993, 902, 769, 755, 748, 686, 640, 520, 512, 503

TOFMS (MALDI)

Positive M$^+$263 (corresponding to $(C_6H_5)_3S^+$)

Negative M$^-$297 (corresponding to $CF_3CH(OCOC(CH_3)=CH_2)CF_2SO_3^-$)

Synthesis Example 20

Synthesis of triphenylsulfonium 2-acryloyloxy-1,1,3,3,3-pentafluoro-1-propanesulfonate (Monomer 2)

Triphenylsulfonium 2-acryloyloxy-1,1,3,3,3-pentafluoro-1-propanesulfonate was synthesized by the same procedure as in Synthesis Example 19 except that acryloyl chloride was used instead of methacrylic anhydride in Synthesis Example 19.

Synthesis Examples 21 to 34

Synthesis of Monomers 3 to 16

Onium salts having a polymerizable anion were synthesized by the same procedure as in Synthesis Examples 19 and 20 except that the onium salts (PAG2 to PAG8) of Synthesis Examples 12 to 18 were used instead of triphenylsulfonium 1,1,3,3,3-pentafluoro-2-hydroxypropane-1-sulfonate used in Synthesis Examples 19 and 20.

Monomers 1 to 16 have the structural formulae shown below.
Monomer 1
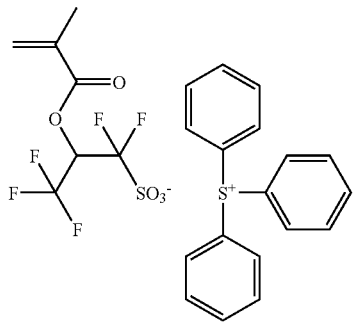
Monomer 2
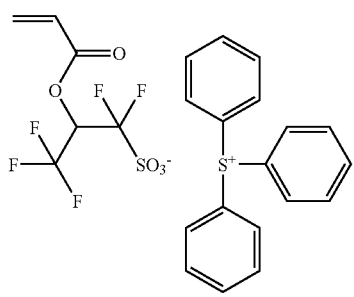
Monomer 3
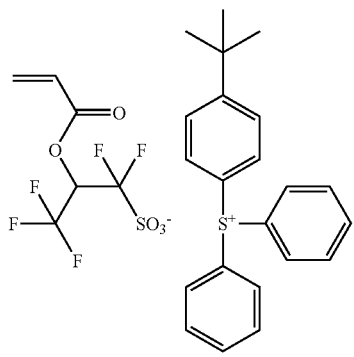
Monomer 4
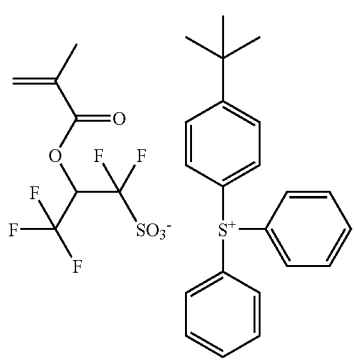
Monomer 5
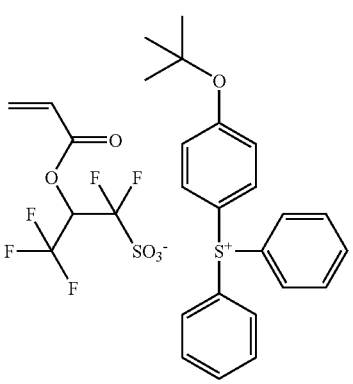
Monomer 3
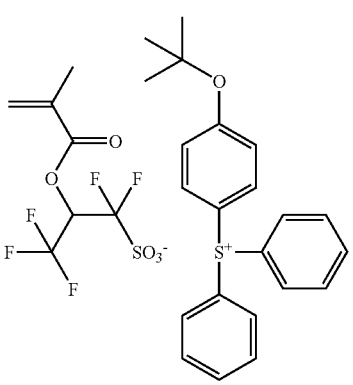
Monomer 7
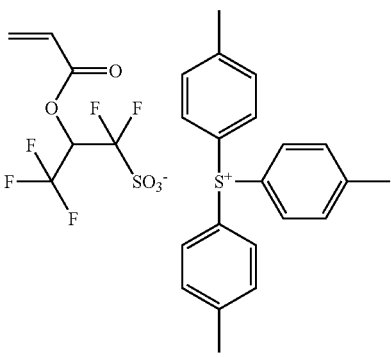
Monomer 8
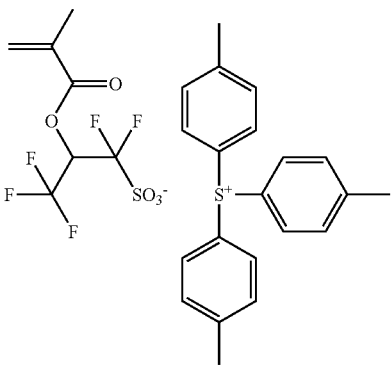

Monomer 9
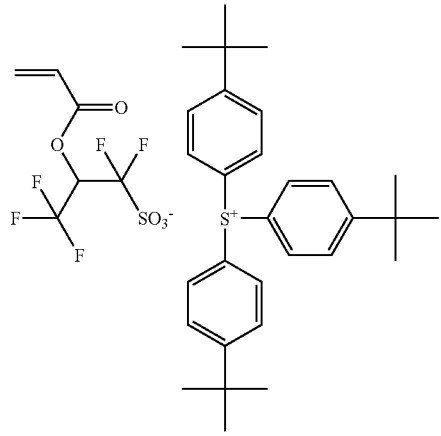
Monomer 10
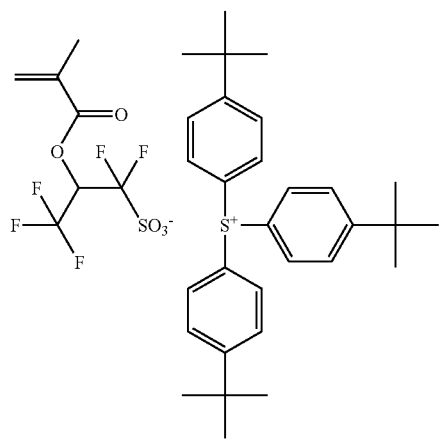
Monomer 11
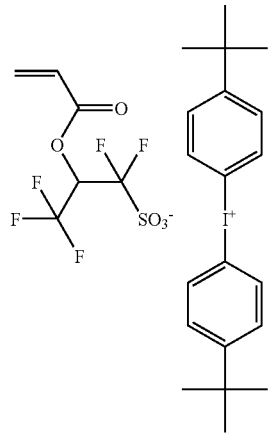
Monomer 12
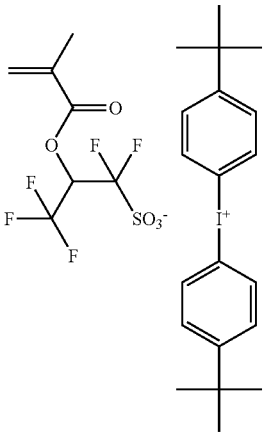
Monomer 13
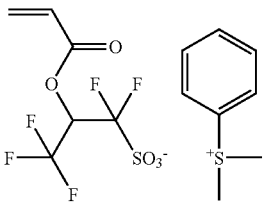
Monomer 14
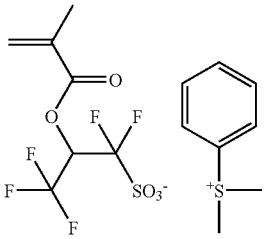
Monomer 15
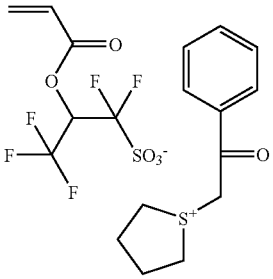
Monomer 16
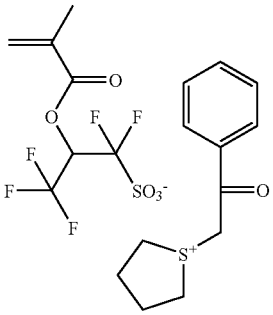

Example

Polymers within the scope of the invention were synthesized according to the following formulation.

Example 1-1

Synthesis of Polymer 1

A flask in a nitrogen atmosphere was charged with 7.60 g of triphenylsulfonium 1,1,3,3,3-pentafluoro-2-methacryl-oyloxypropane-1-sulfonate (Monomer 1), 11.2 g of 4-ethyltetra-cyclo[6.2.1.1$^{3,7}$.0$^{2,6}$]dodecan-4-yl methacrylate, 6.9 g of butano-4-lacton-3-yl methacrylate, 7.2 g of 4-hydroxyphenyl methacrylate, 1.11 g of 2,2'-azobisisobutyronitrile, and 70.0 g of methyl ethyl ketone (MEK) to form a monomer solution. Another flask in a nitrogen atmosphere was charged with 23.3 g of MEK, which was heated at 80° C. while stirring. Thereafter, the monomer solution was added dropwise over 4 hours. After the completion of dropwise addition, the polymerization solution was stirred for a further 2 hours while maintaining the temperature of 80° C., and thereafter, cooled down to room temperature. With vigorous stirring, the polymerization solution was added dropwise to 400 g of hexane, whereupon a copolymer precipitated. The copolymer was collected by filtration, washed twice with a solvent mixture of 45.4 g MEK and 194.6 g hexane, and vacuum dried at 50° C. for 20 hours, obtaining 31 g of the copolymer in white powder form. The copolymer was analyzed by $^{13}$C-NMR, finding a copolymerization compositional ratio of 10/30/30/30 mol % in the described order of monomers.

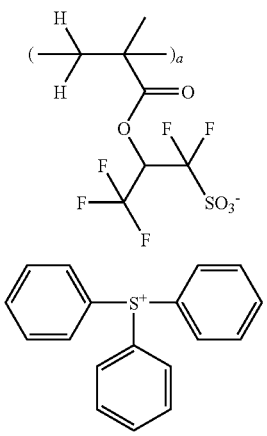

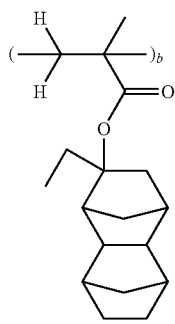

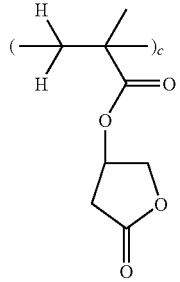

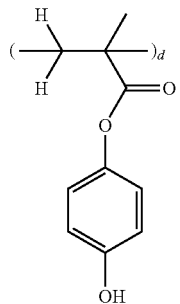

Examples 1-2 to 1-30 and Comparative Example 1-1 to 1-7

Synthesis of Polymers 2 to 30 and Polymers 31 to 37

A series of resins as shown in Table 1 were prepared by the same procedure as in Synthesis Example 1-1 except that the type and ratio of monomers were changed. The units in Table 1 have the structures shown in Tables 2 to 7. In Table 1, the ratio of units is a molar ratio.

Comparative Example 1-8

Synthesis of Polymer 38

Polymer 37 obtained by the above formulation was dissolved in a solvent mixture of methanol and tetrahydrofuran. Oxalic acid was added to the solution whereupon deprotection reaction took place at 40° C. The solution was neutralized with pyridine and purified by a standard reprecipitation technique, obtaining a polymer comprising hydroxystyrene units.

With respect to the deprotection and protection of polyhydroxystyrene derivatives, reference should be made to JP-A 2004-115630 and JP-A 2005-8766.

TABLE 1

|  |  | Resin | Unit 1 (ratio) | Unit 2 (ratio) | Unit 3 (ratio) | Unit 4 (ratio) | Unit 5 (ratio) |
|---|---|---|---|---|---|---|---|
| Example | 1-2 | Polymer 2 | PM-1 (0.10) | X-1M (0.30) | A-1M (0.30) | B-3M (0.30) |  |
|  | 1-3 | Polymer 3 | PM-1 (0.10) | X-1M (0.30) | A-1M (0.30) | B-4M (0.30) |  |
|  | 1-4 | Polymer 4 | PM-1 (0.10) | X-1M (0.30) | A-1M (0.30) | B-5M (0.15) | B-3M (0.15) |
|  | 1-5 | Polymer 5 | PM-1 (0.10) | X-1M (0.30) | A-1M (0.30) | B-6M (0.30) |  |
|  | 1-6 | Polymer 6 | PM-1 (0.10) | X-1M (0.30) | A-1M (0.30) | B-7M (0.30) |  |
|  | 1-7 | Polymer 7 | PM-1 (0.10) | X-1M (0.30) | A-1M (0.30) | B-8M (0.30) |  |
|  | 1-8 | Polymer 8 | PM-1 (0.10) | X-1M (0.30) | A-2M (0.30) | B-3M (0.30) |  |
|  | 1-9 | Polymer 9 | PM-1 (0.10) | X-1M (0.30) | A-3M (0.30) | B-3M (0.30) |  |
|  | 1-10 | Polymer 10 | PM-1 (0.10) | X-1M (0.30) | A-4M (0.30) | B-3M (0.30) |  |
|  | 1-11 | Polymer 11 | PM-1 (0.10) | X-1M (0.30) | A-5M (0.30) | B-3M (0.30) |  |
|  | 1-12 | Polymer 12 | PM-1 (0.10) | X-1M (0.30) | A-6M (0.30) | B-3M (0.30) |  |
|  | 1-13 | Polymer 13 | PM-1 (0.10) | X-1M (0.30) | A-7M (0.30) | B-3M (0.30) |  |
|  | 1-14 | Polymer 14 | PM-1 (0.10) | X-1M (0.30) | A-8M (0.30) | B-3M (0.30) |  |
|  | 1-15 | Polymer 15 | PM-1 (0.10) | X-2M (0.30) | A-1M (0.30) | B-3M (0.30) |  |
|  | 1-16 | Polymer 16 | PM-1 (0.10) | X-2M (0.30) | A-1M (0.30) | B-4M (0.30) |  |
|  | 1-17 | Polymer 17 | PM-1 (0.10) | X-2M (0.30) | A-1M (0.30) | B-5M (0.30) |  |
|  | 1-18 | Polymer 18 | PM-1 (0.10) | X-2M (0.30) | A-1M (0.30) | B-6M (0.30) |  |
|  | 1-19 | Polymer 19 | PM-1 (0.10) | X-2M (0.30) | A-1M (0.30) | B-7M (0.30) |  |
|  | 1-20 | Polymer 20 | PM-1 (0.10) | X-2M (0.30) | A-1M (0.30) | B-8M (0.30) |  |
|  | 1-21 | Polymer 21 | PM-1 (0.10) | X-1M (0.30) | A-1M (0.20) | A-2M (0.10) | B-3M (0.30) |
|  | 1-22 | Polymer 22 | PM-1 (0.10) | X-1M (0.30) | A-1M (0.20) | A-3M (0.10) | B-3M (0.30) |
|  | 1-23 | Polymer 23 | PM-1 (0.10) | X-1M (0.30) | A-1M (0.20) | A-7M (0.10) | B-3M (0.30) |
|  | 1-24 | Polymer 24 | PM-1 (0.10) | X-1M (0.30) | A-4M (0.20) | A-3M (0.10) | B-3M (0.30) |
|  | 1-25 | Polymer 25 | PM-2 (0.10) | X-1M (0.30) | A-1M (0.30) | B-3M (0.30) |  |
|  | 1-26 | Polymer 26 | PM-1 (0.10) | X-1M (0.25) | A-1M (0.30) | B-3M (0.30) | B-1M (0.05) |
|  | 1-27 | Polymer 27 | PM-1 (0.10) | X-1M (0.25) | A-1M (0.30) | B-3M (0.30) | B-2M (0.05) |
|  | 1-28 | Polymer 28 | PM-1 (0.10) | X-1M (0.25) | A-1M (0.30) | B-3M (0.30) | C-1M (0.05) |
|  | 1-29 | Polymer 29 | PM-1 (0.10) | X-1M (0.25) | A-1M (0.30) | B-3M (0.30) | C-3M (0.05) |
|  | 1-30 | Polymer 30 | PM-1 (0.10) | X-1M (0.25) | A-1M (0.30) | B-3M (0.30) | D-7 (0.05) |
| Comparative Example | 1-1 | Polymer 31 | PM-1 (0.10) | A-1M (0.45) | B-3M (0.45) |  |  |
|  | 1-2 | Polymer 32 | PM-1 (0.10) | A-2M (0.30) | B-3M (0.30) | B-1M (0.30) |  |
|  | 1-3 | Polymer 33 | PM-1 (0.10) | A-3M (0.45) | B-3M (0.45) |  |  |
|  | 1-4 | Polymer 34 | A-1M (0.40) | B-3M (0.30) | B-1M (0.30) |  |  |
|  | 1-5 | Polymer 35 | A-2M (0.40) | B-3M (0.30) | B-1M (0.30) |  |  |
|  | 1-6 | Polymer 36 | A-3M (0.40) | B-3M (0.45) | B-1M (0.30) | C-3M (0.10) |  |
|  | 1-7 | Polymer 37 | PM-1 (0.10) | A-1M (0.30) | B-3M (0.30) | D-2 (0.30) |  |
|  | 1-8 | Polymer 38 | PM-1 (0.10) | A-1M (0.30) | B-3M (0.30) | D-1 (0.30) |  |

TABLE 2

PM-1

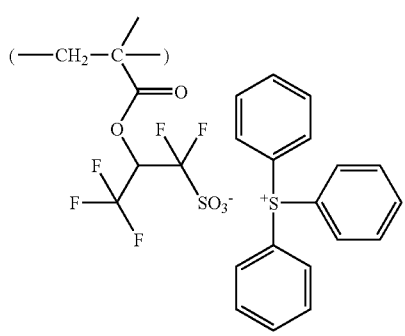

TABLE 2-continued

PA-1

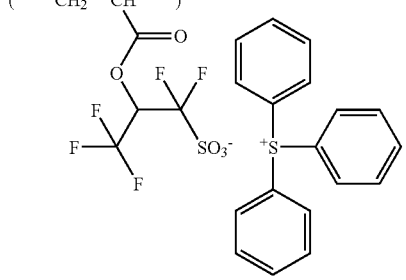

TABLE 2-continued
PM-2
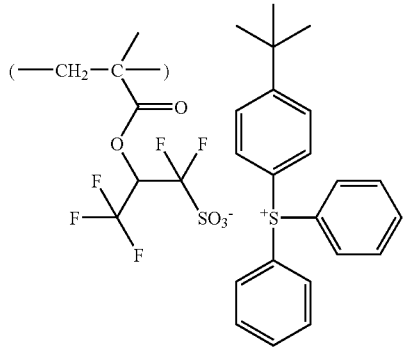
TABLE 3
X-1M (R = CH₃)  X-2M (R = CH₃)
X-1A (R = H)    X-2A (R = H)
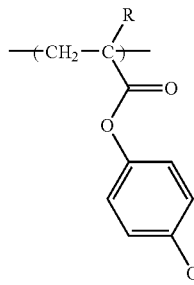 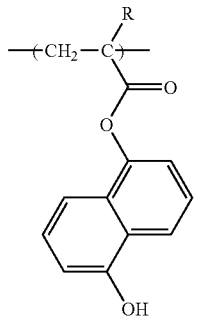
TABLE 4
A-1M (R = CH₃)  A-2M (R = CH₃)
A-1A (R = H)    A-2A (R = H)
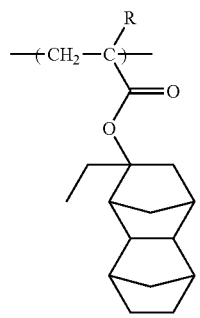 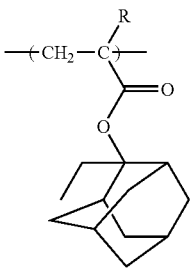
TABLE 4-continued
A-3M (R = CH₃)  A-4M (R = CH₃)
A-3A (R = H)    A-4A (R = H)
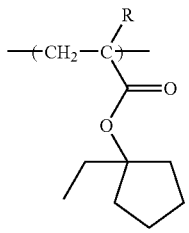 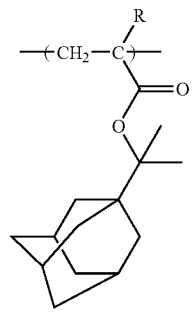
A-5M (R = CH₃)  A-6M (R = CH₃)
A-5A (R = H)    A-6A (R = H)
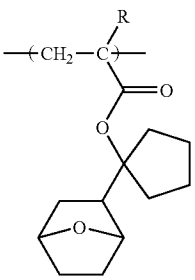 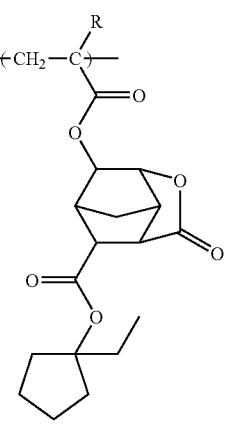
A-7M (R = CH₃)  A-8M (R = CH₃)
A-7A (R = H)    A-8A (R = H)
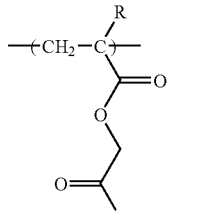 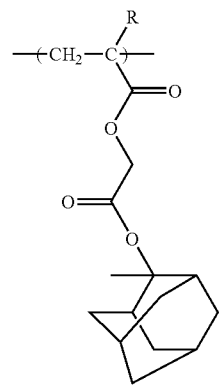

TABLE 5
B-1M (R = CH₃)
B-1A (R = H)
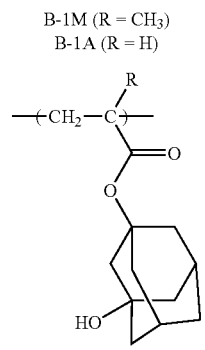
B-2M (R = CH₃)
B-2A (R = H)
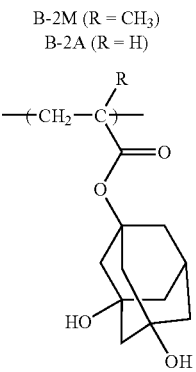
B-3M (R = CH₃)
B-3A (R = H)
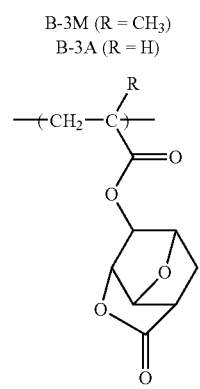
B-4M (R = CH₃)
B-4A (R = H)
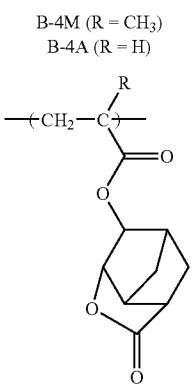
B-5M (R = CH₃)
B-5A (R = H)
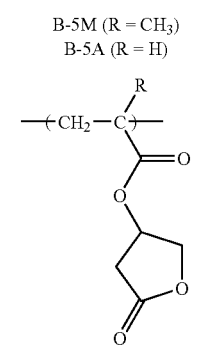
B-6M (R = CH₃)
B-6A (R = H)
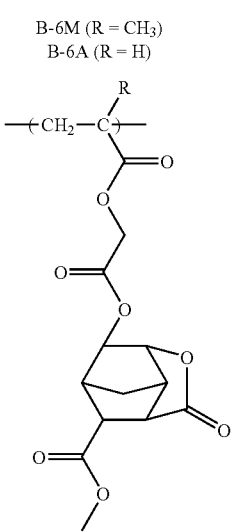
TABLE 5-continued
B-7M (R = CH₃)
B-7A (R = H)
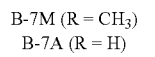
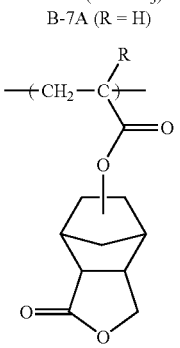
B-8M (R = CH₃)
B-8A (R = H)
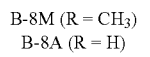
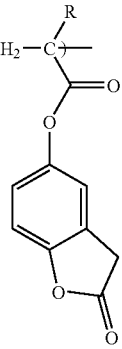
TABLE 6
C-1M (R = CH₃)
C-1A (R = H)
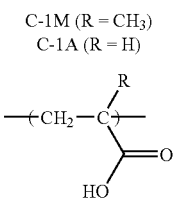
C-2M (R = CH₃)
C-2A (R = H)
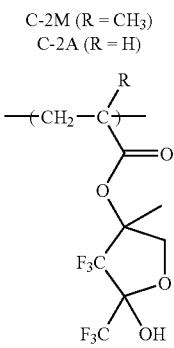
C-3M (R = CH₃)
C-3A (R = H)
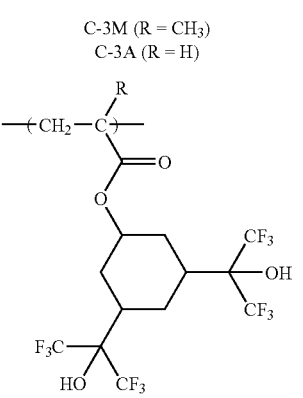
C-4M (R = CH₃)
C-4A (R = H)
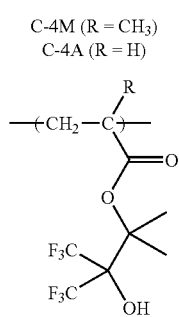
C-5M (R = CH₃)
C-5A (R = H)
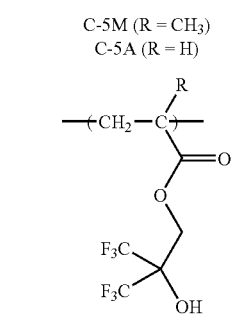

TABLE 7

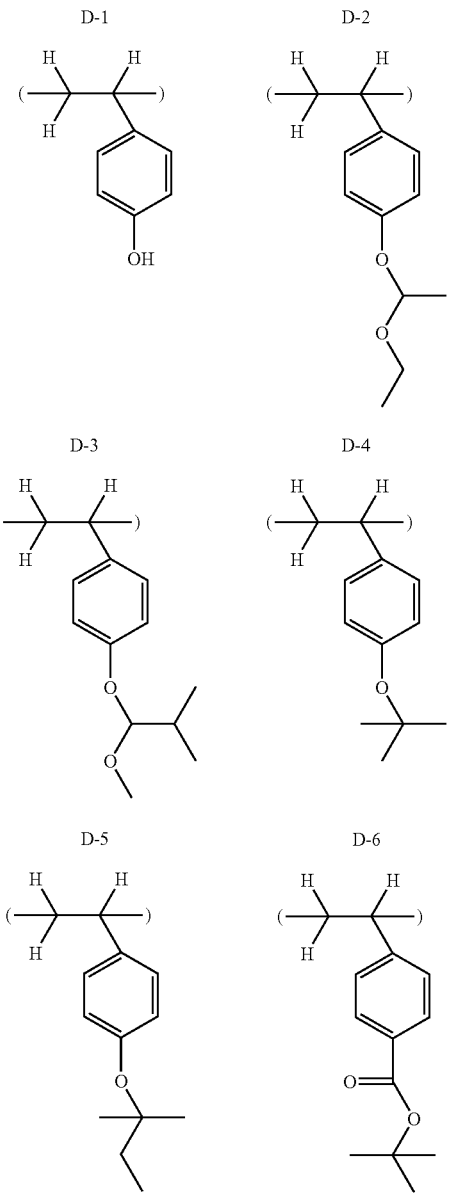

TABLE 7-continued

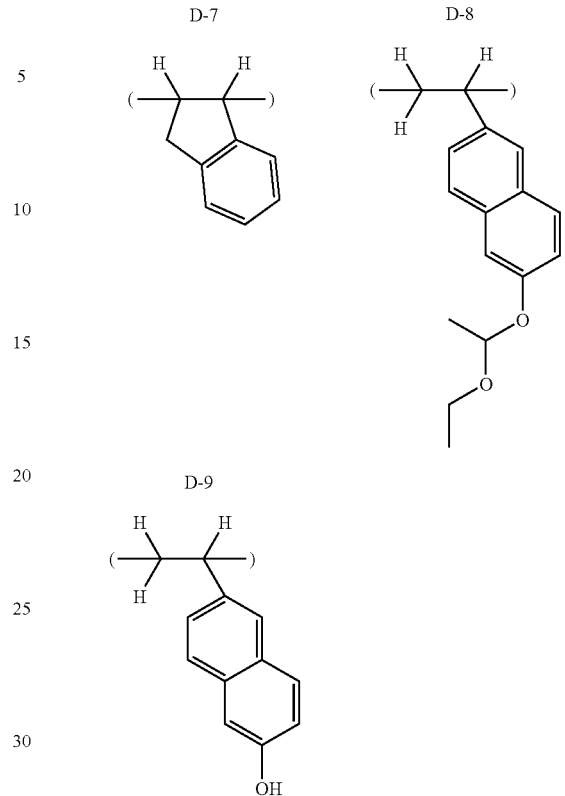

[Preparation of Resist Composition]

Examples 2-1 to 2-31 & Comparative Examples 2-1 to 2-7

The base resins used were the inventive Polymers 1 to 30 (P-1 to 30), and the comparative Polymers 31 to 36, and 38 (P-31 to 36, P-38), all synthesized above. Resist compositions were prepared by combining, mixing and dissolving the base resin, acid generator, and quencher (base) in a solvent according to the formulation shown in Table 8. They were filtered through a Teflon® filter having a pore size of 0.2 μm, giving inventive resist solutions (R-01 to 31) and comparative resist solutions (R-32 to 38). Note that in all examples, the solvent contained 0.01 wt % of surfactant KH-20 (Asahi Glass Co., Ltd.).

TABLE 8

|  |  | Resist composition | Resin (pbw) | PAG (pbw) | Base (pbw) | Solvent 1 (pbw) | Solvent 2 (pbw) |
|---|---|---|---|---|---|---|---|
| Example | 2-1 | R-1 | P-1 (80) |  | Base-1 (0.94) | PGMEA (1,120) | CyHO (480) |
|  | 2-2 | R-2 | P-2 (80) |  | Base-1 (0.94) | PGMEA (1,120) | CyHO (480) |
|  | 2-3 | R-3 | P-3 (80) |  | Base-1 (0.94) | PGMEA (1,120) | CyHO (480) |
|  | 2-4 | R-4 | P-4 (80) |  | Base-1 (0.94) | PGMEA (1,120) | CyHO (480) |
|  | 2-5 | R-5 | P-5 (80) |  | Base-1 (0.94) | PGMEA (1,120) | CyHO (480) |
|  | 2-6 | R-6 | P-6 (80) |  | Base-1 (0.94) | PGMEA (1,120) | CyHO (480) |
|  | 2-7 | R-7 | P-7 (80) |  | Base-1 (0.94) | PGMEA (1,120) | CyHO (480) |
|  | 2-8 | R-8 | P-8 (80) |  | Base-1 (0.94) | PGMEA (1,120) | CyHO (480) |
|  | 2-9 | R-9 | P-9 (80) |  | Base-1 (0.94) | PGMEA (1,120) | CyHO (480) |
|  | 2-10 | R-10 | P-10 (80) |  | Base-1 (0.94) | PGMEA (1,120) | CyHO (480) |
|  | 2-11 | R-11 | P-11 (80) |  | Base-1 (0.94) | PGMEA (1,120) | CyHO (480) |
|  | 2-12 | R-12 | P-12 (80) |  | Base-1 (0.94) | PGMEA (1,120) | CyHO (480) |
|  | 2-13 | R-13 | P-13 (80) |  | Base-1 (0.94) | PGMEA (1,120) | CyHO (480) |
|  | 2-14 | R-14 | P-14 (80) |  | Base-1 (0.94) | PGMEA (1,120) | CyHO (480) |
|  | 2-15 | R-15 | P-15 (80) |  | Base-1 (0.94) | PGMEA (1,120) | CyHO (480) |

TABLE 8-continued

|  |  | Resist composition | Resin (pbw) | PAG (pbw) | Base (pbw) | Solvent 1 (pbw) | Solvent 2 (pbw) |
|---|---|---|---|---|---|---|---|
|  | 2-16 | R-16 | P-16 (80) |  | Base-1 (0.94) | PGMEA (1,120) | CyHO (480) |
|  | 2-17 | R-17 | P-17 (80) |  | Base-1 (0.94) | PGMEA (1,120) | CyHO (480) |
|  | 2-18 | R-18 | P-18 (80) |  | Base-1 (0.94) | PGMEA (1,120) | CyHO (480) |
|  | 2-19 | R-19 | P-19 (80) |  | Base-1 (0.94) | PGMEA (1,120) | CyHO (480) |
|  | 2-20 | R-20 | P-20 (80) |  | Base-1 (0.94) | PGMEA (1,120) | CyHO (480) |
|  | 2-21 | R-21 | P-21 (80) |  | Base-1 (0.94) | PGMEA (1,120) | CyHO (480) |
|  | 2-22 | R-22 | P-22 (80) |  | Base-1 (0.94) | PGMEA (1,120) | CyHO (480) |
|  | 2-23 | R-23 | P-23 (80) |  | Base-1 (0.94) | PGMEA (1,120) | CyHO (480) |
|  | 2-24 | R-24 | P-24 (80) |  | Base-1 (0.94) | PGMEA (1,120) | CyHO (480) |
|  | 2-25 | R-25 | P-25 (80) |  | Base-1 (0.94) | PGMEA (1,120) | CyHO (480) |
|  | 2-26 | R-26 | P-26 (80) |  | Base-1 (0.94) | PGMEA (1,120) | CyHO (480) |
|  | 2-27 | R-27 | P-27 (80) |  | Base-1 (0.94) | PGMEA (1,120) | CyHO (480) |
|  | 2-28 | R-28 | P-28 (80) |  | Base-1 (0.94) | PGMEA (1,120) | CyHO (480) |
|  | 2-29 | R-29 | P-29 (80) | PAG-1 (5) | Base-1 (0.94) | PGMEA (1,120) | CyHO (480) |
|  | 2-30 | R-30 | P-30 (80) |  | Base-1 (0.94) | PGMEA (1,120) | CyHO (480) |
|  | 2-31 | R-31 | P-1 (70) P-36 (10) |  | Base-1 (0.94) | PGMEA (1,120) | CyHO (480) |
| Comparative Example | 2-1 | R-32 | P-31 (80) |  | Base-1 (0.94) | PGMEA (1,120) | CyHO (480) |
|  | 2-2 | R-33 | P-32 (80) |  | Base-1 (0.94) | PGMEA (1,120) | CyHO (480) |
|  | 2-3 | R-34 | P-33 (80) | PAG-1 (10) | Base-1 (0.94) | PGMEA (1,120) | CyHO (480) |
|  | 2-4 | R-35 | P-34 (80) | PAG-1 (10) | Base-1 (0.94) | PGMEA (1,120) | CyHO (480) |
|  | 2-5 | R-36 | P-35 (80) | PAG-1 (10) | Base-1 (0.94) | PGMEA (1,120) | CyHO (480) |
|  | 2-6 | R-37 | P-36 (80) |  | Base-1 (0.94) | PGMEA (1,120) | CyHO (480) |
|  | 2-7 | R-38 | P-38 (80) |  | Base-1 (0.94) | PGMEA (1,120) | CyHO (480) |

The photoacid generators, quencher (base) and solvents in Table 8 are identified below.
PAG-1: triphenylsulfonium 2-(adamantane-1-carbonyloxy)-1,1,3,3,3-hexafluoropropanesulfonate
Base-1: tri(2-methoxymethoxyethyl)amine
PGMEA: 1-methoxy-2-propyl acetate
CyHo: cyclohexanone

[Evaluation of Sensitivity and Resolution on EB Lithography]

Examples 3-1 to 3-31 & Comparative Examples 3-1 to 3-7

On a HMDS-treated silicon wafer, each of the inventive resist compositions (R-1 to 31) or comparative resist compositions (R-32 to 38) was spin coated and heat treated at 110° C. for 60 seconds to form a resist film of 100 nm thick. Using an EB lithography system HL-800D (Hitachi Hitechnologies, Ltd.) at an accelerating voltage of 50 keV, exposure was performed on the resist film. The resist film was post-exposure baked (PEB) at 95° C. for 60 seconds and developed for 30 seconds with a 2.38 wt % tetramethylammonium hydroxide (TMAH) aqueous solution, obtaining a positive pattern.

The resist pattern was evaluated as follows. The sensitivity or optimum exposure (Eop) was defined as the exposure dose ($\mu C/cm^2$) which provided a 1:1 resolution at the top and bottom of a 120 nm line-and-space pattern. The resolution of the resist was defined as the minimum line width of a line-and-space pattern that was ascertained separate at the optimum exposure. The results are shown in Table 9.

TABLE 9

|  |  | Resist composition | Sensitivity ($\mu C/cm^2$) | Resolution (nm) |
|---|---|---|---|---|
| Example | 3-1 | R-1 | 15 | 70 |
|  | 3-2 | R-2 | 14 | 72 |
|  | 3-3 | R-3 | 15 | 70 |
|  | 3-4 | R-4 | 14 | 70 |
|  | 3-5 | R-5 | 15 | 72 |
|  | 3-6 | R-6 | 14 | 70 |
|  | 3-7 | R-7 | 15 | 70 |
|  | 3-8 | R-8 | 15 | 70 |
|  | 3-9 | R-9 | 15 | 70 |
|  | 3-10 | R-10 | 14 | 72 |
|  | 3-11 | R-11 | 15 | 70 |
|  | 3-12 | R-12 | 15 | 70 |
|  | 3-13 | R-13 | 14 | 70 |
|  | 3-14 | R-14 | 15 | 70 |
|  | 3-15 | R-15 | 15 | 72 |
|  | 3-16 | R-16 | 15 | 72 |
|  | 3-17 | R-17 | 14 | 70 |
|  | 3-18 | R-18 | 15 | 72 |
|  | 3-19 | R-19 | 15 | 70 |
|  | 3-20 | R-20 | 14 | 70 |
|  | 3-21 | R-21 | 15 | 72 |
|  | 3-22 | R-22 | 14 | 72 |
|  | 3-23 | R-23 | 15 | 70 |
|  | 3-24 | R-24 | 14 | 70 |
|  | 3-25 | R-25 | 15 | 72 |
|  | 3-26 | R-26 | 14 | 70 |
|  | 3-27 | R-27 | 15 | 70 |
|  | 3-28 | R-28 | 15 | 72 |
|  | 3-29 | R-29 | 15 | 72 |
|  | 3-30 | R-30 | 14 | 70 |
|  | 3-31 | R-31 | 15 | 72 |
| Comparative Example | 3-1 | R-32 | 30 | 80 |
|  | 3-2 | R-33 | 30 | 80 |
|  | 3-3 | R-34 | 38 | 100 |
|  | 3-4 | R-35 | 38 | 100 |
|  | 3-5 | R-36 | 36 | 100 |
|  | 3-6 | R-37 | 12 | 110 |
|  | 3-7 | R-38 | 10 | 110 |

It is evident from Table 9 that the resist compositions of the invention are improved in sensitivity and resolution when processed by EB lithography.

[Evaluation of Sensitivity and Resolution on EUV Lithography]

Examples 4-1 to 4-2 & Comparative Examples 4-1 to 4-2

On a HMDS-treated silicon wafer, the inventive resist composition (R-2 or 15) or comparative resist composition (R-32 or 38) was spin coated and heat treated at 110° C. for 60 seconds to form a resist film of 50 nm thick. The resist film was exposed by means of an EUV micro-stepper (NA=0.3, dipole illumination), post-exposure baked (PEB) at 95° C. for 60 seconds, and developed for 30 seconds with a 2.38 wt % TMAH aqueous solution, obtaining a positive pattern.

The resist patterns were evaluated. The sensitivity or optimum exposure (Eop) was defined as the exposure dose (mJ/cm$^2$) which provided a 1:1 resolution at the top and bottom of a 32-nm line-and-space pattern. The resolution of the resist was defined as the minimum line width of a line-and-space pattern which was ascertained separate at the optimum dose. The results are shown in Table 10.

TABLE 10

| | Resist composition | Eop (mJ/cm$^2$) | Resolution (nm) |
|---|---|---|---|
| Example 4-1 | R-2 | 16 | 25 |
| Example 4-2 | R-15 | 18 | 25 |
| Comparative Example 4-1 | R-32 | 42 | 26 |
| Comparative Example 4-2 | R-38 | 16 | 32 |

It is evident from Table 10 that the resist compositions of the invention are also improved in sensitivity and resolution when processed by EUV lithography.

Japanese Patent Application No. 2008-114116 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A polymer comprising recurring units having the general formulae (1), (2) and (3):

(1)

(2)

(3)

wherein

R$^1$ is hydrogen, fluorine, methyl or trifluoromethyl,

Rf is each independently hydrogen, fluorine, trifluoromethyl or pentafluoroethyl, both Rf's are not hydrogen, A is a divalent C$_1$-C$_{10}$ organic group which may have fluorine or oxygen substituted thereon, provided that A is not —CH$_2$—, R$^2$, R$^3$ and R$^4$ are each independently a substituted or unsubstituted straight or branched C$_1$-C$_{10}$ alkyl, alkenyl or oxoalkyl group or a substituted or unsubstituted C$_6$-C$_{18}$ aryl, aralkyl or aryloxoalkyl group, or at least two of R$^2$, R$^3$ and R$^4$ may bond together to form a ring with the sulfur atom to which they are attached, N is an integer of 0 to 2, R$^8$ is hydrogen or C$_1$-C$_{10}$ alkyl, B is a single bond or a divalent C$_1$-C$_{10}$ organic group which may have oxygen substituted thereon, a is an integer of 0 to 3, b is an integer of 1 to 3, and X is an acid labile group.

2. The polymer of claim 1 comprising recurring units having the general formulae (1a), (2) and (3):

(1a)

-continued (2)

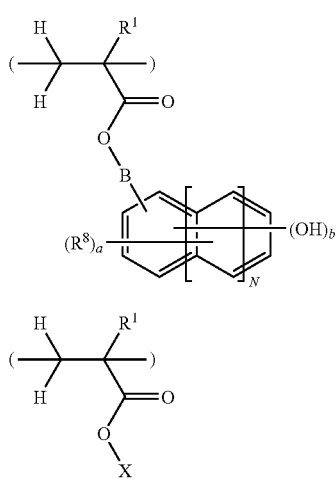

(3)

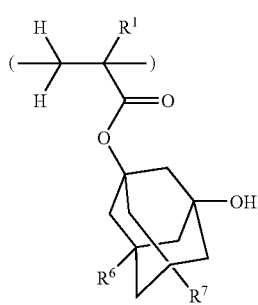

wherein R¹ is hydrogen, fluorine, methyl or trifluoromethyl, Rf is each independently hydrogen, fluorine, trifluoromethyl or pentafluoroethyl, both Rf's are not hydrogen, R², R³ and R⁴ are each independently a substituted or unsubstituted, straight or branched $C_1$-$C_{10}$ alkyl, alkenyl or oxoalkyl group or a substituted or unsubstituted $C_6$-$C_{18}$ aryl, aralkyl or aryloxoalkyl group, or at least two of R², R³ and R⁴ may bond together to form a ring with the sulfur atom to which they are attached, N is an integer of 0 to 2, R⁸ is hydrogen or $C_1$-$C_{10}$ alkyl, B is a single bond or a divalent $C_1$-$C_{10}$ organic group which may have oxygen substituted thereon, a is an integer of 0 to 3, b is an integer of 1 to 3, and X is an acid labile group.

3. The polymer of claim 1, further comprising recurring units of at least one type selected from the general formulae (4) to (6):

(4)

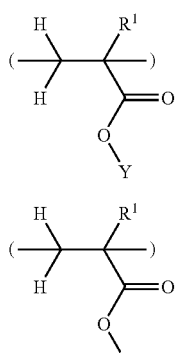

(5)

(6)

wherein R¹ is hydrogen, fluorine, methyl or trifluoromethyl, R⁶ and R⁷ are each independently hydrogen or hydroxyl, Y is a substituent group of lactone structure, and Z is hydrogen, $C_1$-$C_{15}$ fluoroalkyl or $C_1$-$C_{15}$ fluoroalcohol-containing substituent group.

4. The polymer of claim 1, further comprising recurring units of at least one type selected from the general formulae (7) to (10):

(7)

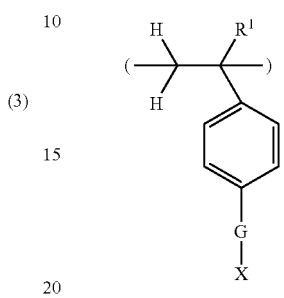

(8)

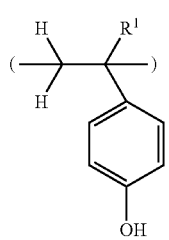

(9)

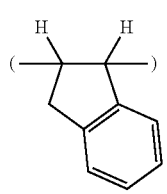

(10)

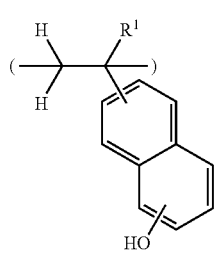

wherein R¹ is hydrogen, fluorine, methyl or trifluoromethyl, X is an acid labile group, and G is an oxygen atom or carbonyloxy group (—C(=O)O—).

5. A positive resist composition comprising the polymer of claim 1 as a base resin.

6. The positive resist composition of claim 5, further comprising a surfactant which is insoluble in water and soluble in an alkaline developer.

7. A pattern forming process comprising the steps of applying the positive resist composition of claim 5 onto a substrate to form a coating, heat treating the coating and exposing it to high-energy radiation through a photomask, optionally heat treating the exposed coating and developing it with a developer.

8. A pattern forming process comprising the steps of applying the positive resist composition of claim 5 onto a substrate to form a resist coating, heat treating the resist coating, applying onto the resist coating a protective coating which is insoluble in water and soluble in an alkaline developer, exposing the coated substrate to high-energy radiation from a projection lens through a photomask while holding water between the substrate and the projection lens, optionally heat treating the exposed coating and developing it with a developer.

9. A pattern forming process comprising the steps of applying the positive resist composition of claim 5 onto a substrate to form a coating, heat treating the coating, imagewise writing with an electron beam, optionally heat treating the coating, and developing it with a developer.

10. A positive resist composition comprising the polymer of claim 1 and a polymer which does not contain the recurring units of formula (1) in claim 1 as a base resin.

11. A pattern forming process comprising the steps of
applying a positive resist composition onto a substrate to form a coating,
exposing the coating to soft x-ray having a wavelength of 3 to 15 nm, and
optionally heat treating the exposed coating and developing it with a developer,
said resist composition comprising a polymer comprising recurring units having the general formulae (1'), (2) and (3):

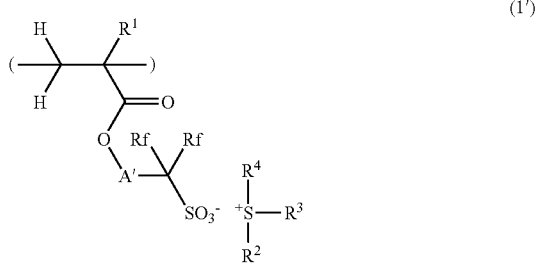

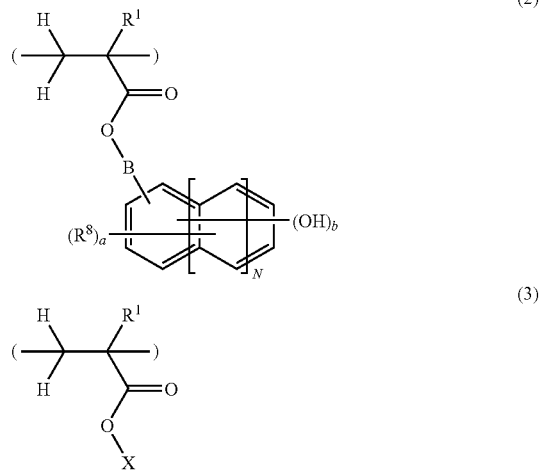

wherein
$R^1$ is hydrogen, fluorine, methyl or trifluoromethyl,
Rf is each independently hydrogen, fluorine, trifluoromethyl or pentafluoroethyl, both Rf's are not hydrogen,
A' is a divalent $C_1$-$C_{10}$ organic group which may have fluorine or oxygen substituted thereon,
$R^2$, $R^3$ and $R^4$ are each independently a substituted or unsubstituted, straight or branched $C_1$-$C_{10}$ alkyl, alkenyl or oxoalkyl group or a substituted or unsubstituted $C_6$-$C_{18}$ aryl, aralkyl or aryloxoalkyl group, or at least two of $R^2$, $R^3$ and $R^4$ may bond together to form a ring with the sulfur atom to which they are attached,
N is an integer of 0 to 2,
$R^8$ is hydrogen or $C_1$-$C_{10}$ alkyl,
B is a single bond or a divalent $C_1$-$C_{10}$ organic group which may have oxygen substituted thereon,
a is an integer of 0 to 3,
b is an integer of 1 to 3, and
X is an acid labile group.

* * * * *